(12) United States Patent
Yang et al.

(10) Patent No.: US 12,283,595 B2
(45) Date of Patent: Apr. 22, 2025

(54) INTEGRATION OF MULTIPLE TRANSISTORS HAVING FIN AND MESA STRUCTURES

(71) Applicant: Taiwan Semiconductor Manufacturing Co., Ltd., Hsinchu (TW)

(72) Inventors: Sung-Hsin Yang, Tainan (TW); Ru-Shang Hsiao, Jhubei (TW); Ching-Hwanq Su, Tainan (TW); Chen-Bin Lin, Tainan (TW); Wen-Hsin Chan, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 386 days.

(21) Appl. No.: 17/655,321

(22) Filed: Mar. 17, 2022

(65) Prior Publication Data
US 2023/0154922 A1    May 18, 2023

Related U.S. Application Data

(60) Provisional application No. 63/278,514, filed on Nov. 12, 2021.

(51) Int. Cl.
*H01L 27/092*    (2006.01)
*H01L 21/306*    (2006.01)
(Continued)

(52) U.S. Cl.
CPC .... *H01L 27/0922* (2013.01); *H01L 21/30604* (2013.01); *H01L 21/308* (2013.01);
(Continued)

(58) Field of Classification Search
CPC .......... H01L 27/0922; H01L 21/30604; H01L 21/308; H01L 21/823807;
(Continued)

(56) References Cited

U.S. PATENT DOCUMENTS 10,050,033 B1 *  8/2018  Thei ...................... H01L 29/517
10,312,367 B2    6/2019  Phoa et al.
(Continued)

FOREIGN PATENT DOCUMENTS

CN    113571472 A    10/2021
KR  20170017887 A    2/2017
(Continued)

*Primary Examiner* — Karen Kusumakar
*Assistant Examiner* — Adam S Bowen
(74) *Attorney, Agent, or Firm* — Slater Matsil, LLP

(57) ABSTRACT

A structure includes a bulk semiconductor substrate, a first plurality of dielectric isolation regions over the bulk semiconductor substrate, a plurality of semiconductor fins protruding higher than the first plurality of dielectric isolation regions, a first gate stack on top surfaces and sidewalls of the plurality of semiconductor fins, a second plurality of dielectric isolation regions over the bulk semiconductor substrate, a mesa structure in the second plurality of dielectric isolation regions, and a second gate stack over the mesa structure. Top surfaces of the first gate stack and the second gate stack are coplanar with each other.

20 Claims, 43 Drawing Sheets

(51) Int. Cl.
  *H01L 21/308*       (2006.01)
  *H01L 21/8238*      (2006.01)

(52) U.S. Cl.
  CPC ............... *H01L 21/823807* (2013.01); *H01L 21/823821* (2013.01); *H01L 21/823878* (2013.01); *H01L 27/0924* (2013.01)

(58) Field of Classification Search
  CPC ..... H01L 21/823821; H01L 21/823878; H01L 27/0924; H01L 21/823814; H01L 21/823412; H01L 21/823456; H01L 21/823431; H01L 21/823462; H01L 27/0886; H01L 29/42364; H01L 29/66795; H01L 29/785
  See application file for complete search history.

(56) References Cited

U.S. PATENT DOCUMENTS

| | | | |
|---|---|---|---|
| 11,289,572 B1* | 3/2022 | Chiu | H01L 29/7851 |
| 11,355,493 B2 | 6/2022 | Chuang et al. | |
| 2019/0067417 A1* | 2/2019 | Ching | H01L 21/823878 |
| 2020/0152461 A1* | 5/2020 | Kim | H01L 21/3086 |
| 2021/0343596 A1 | 11/2021 | Yang et al. | |
| 2022/0359304 A1 | 11/2022 | Yang et al. | |

FOREIGN PATENT DOCUMENTS

| | | |
|---|---|---|
| KR | 20210117117 A | 9/2021 |
| TW | 202139421 A | 10/2021 |

\* cited by examiner

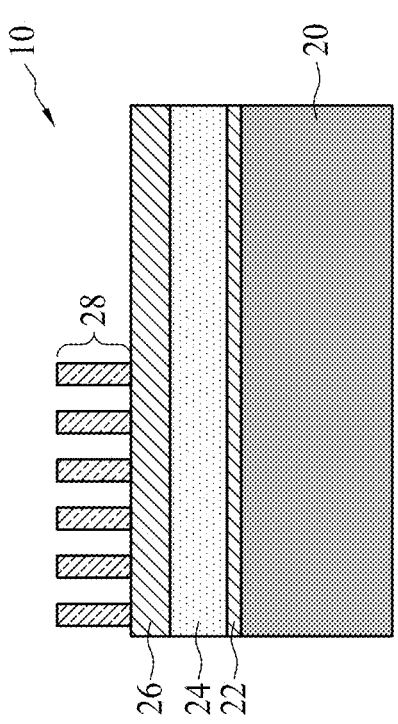
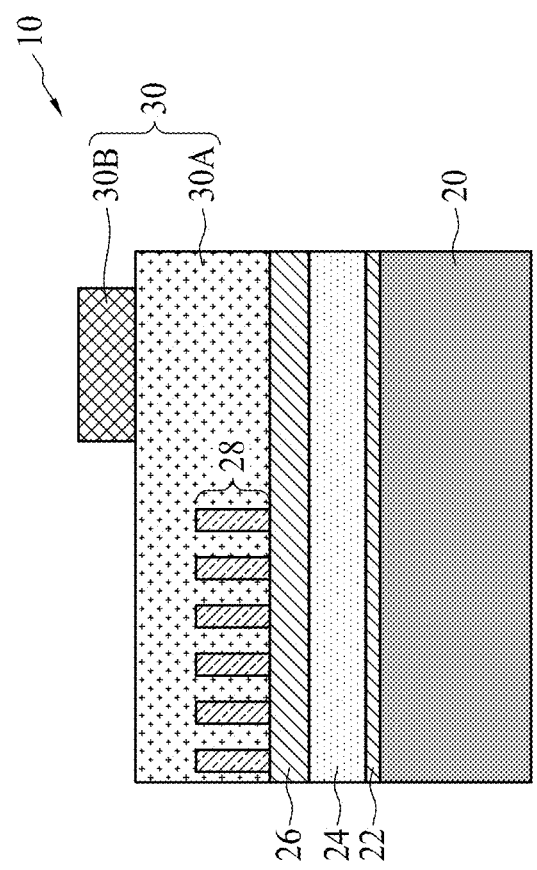

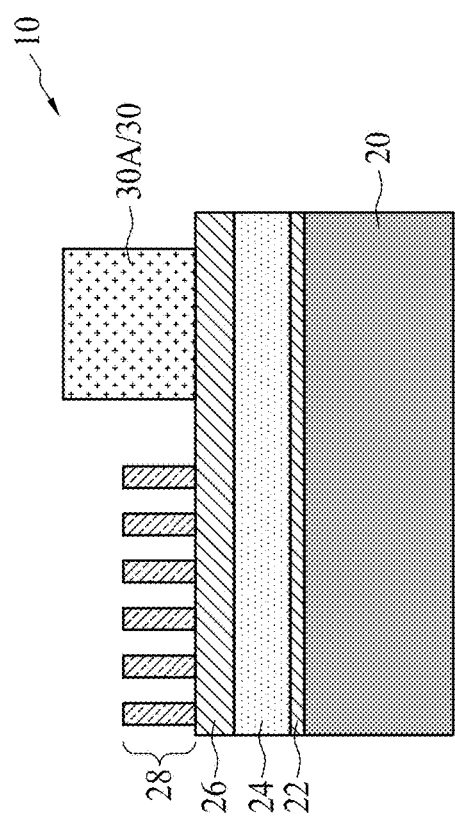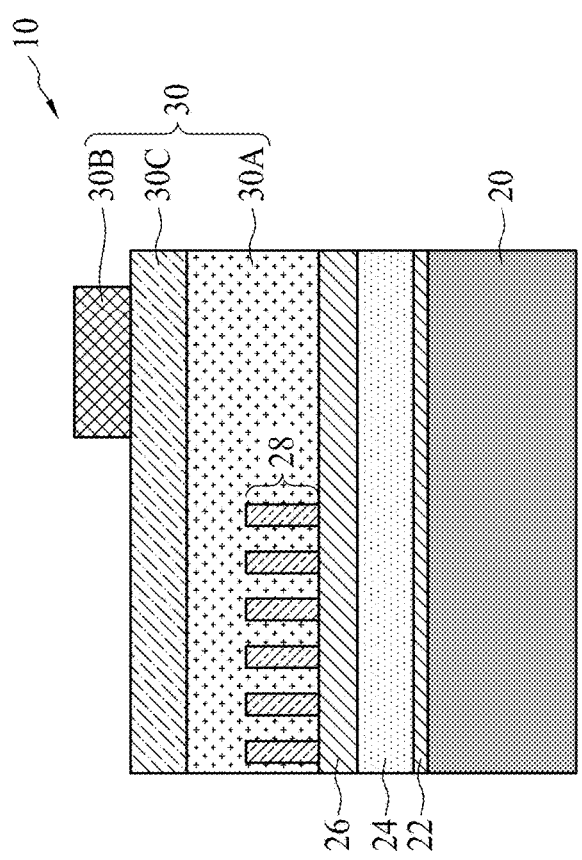

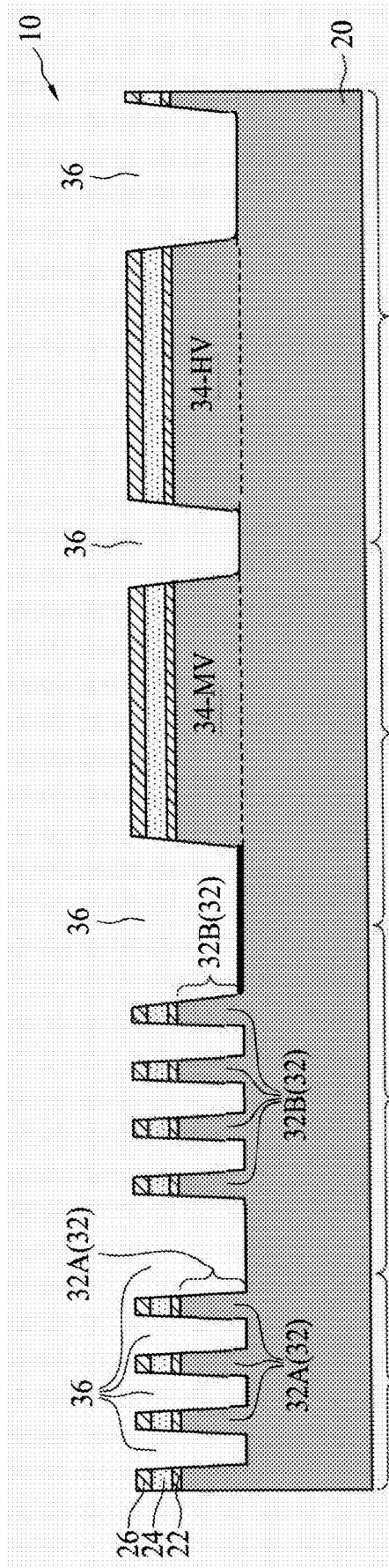
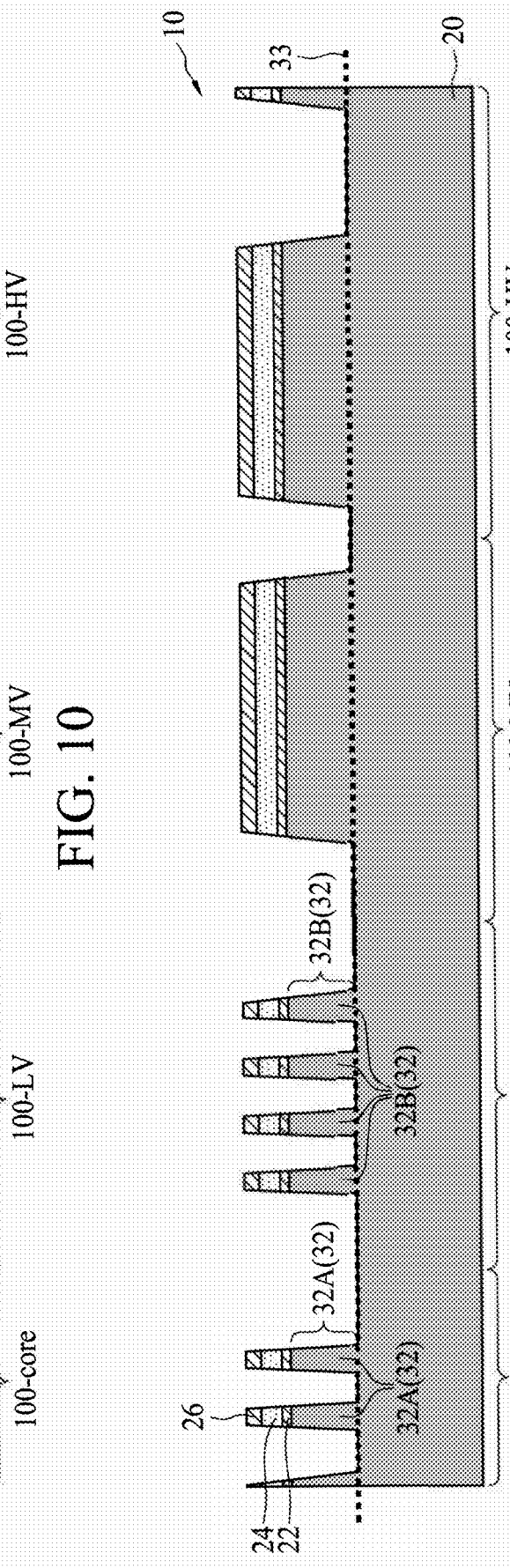
FIG. 10
FIG. 11

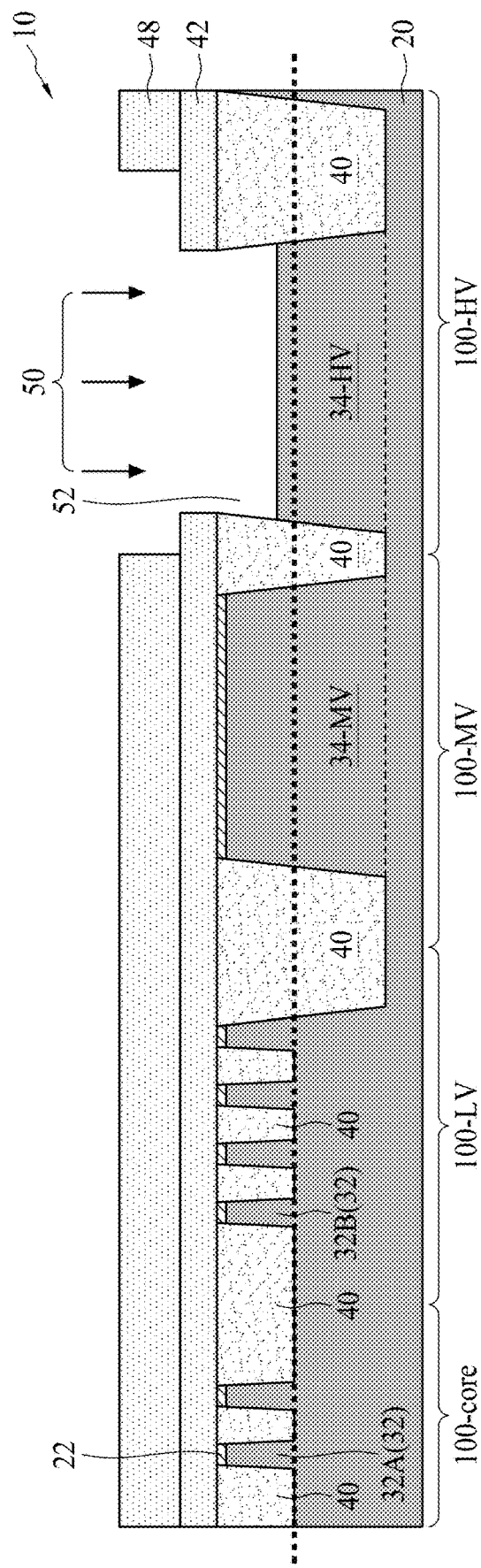
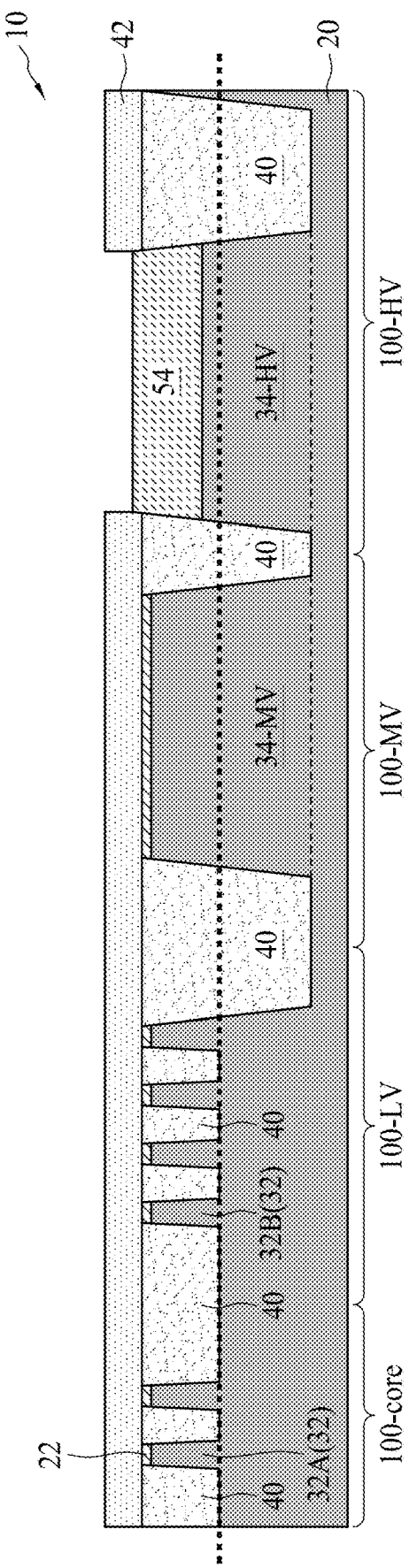
FIG. 18
FIG. 19

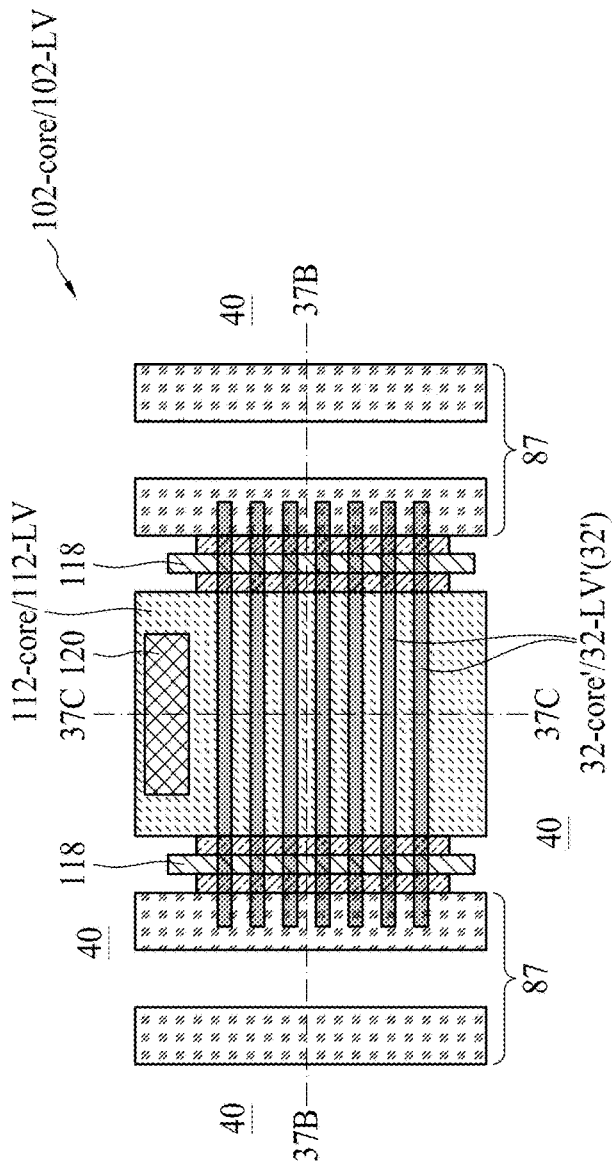
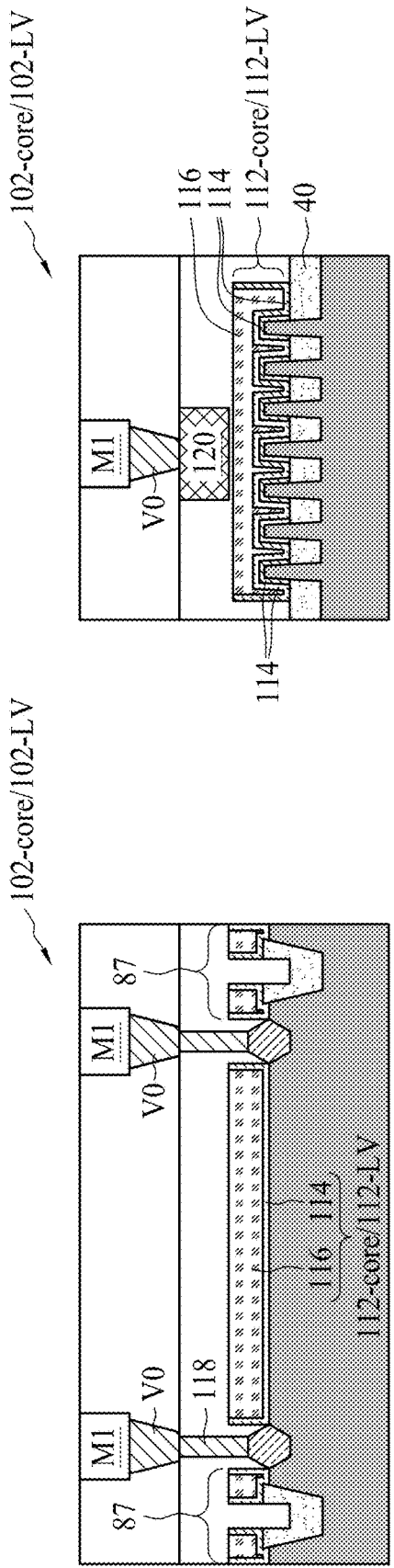
FIG. 37A
FIG. 37B
FIG. 37C

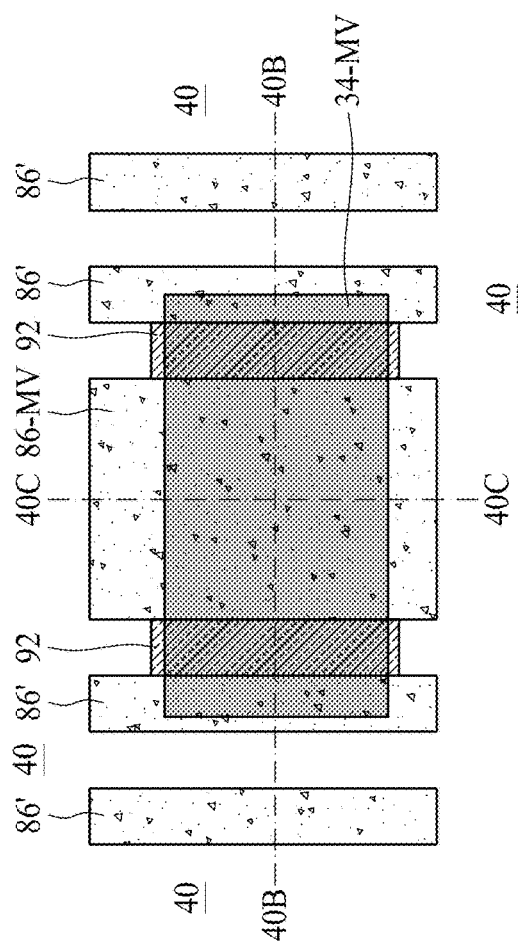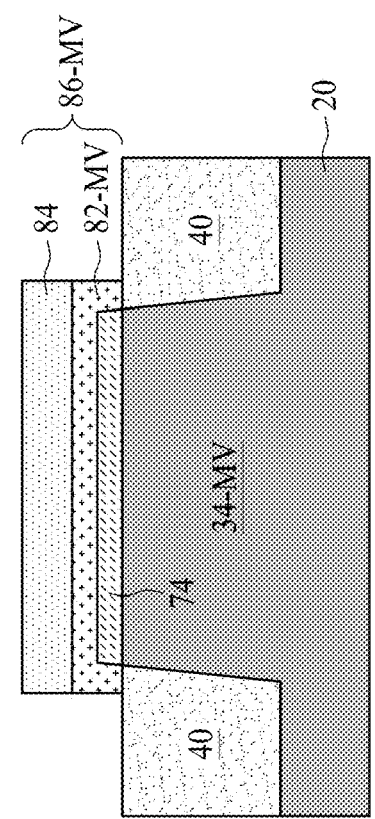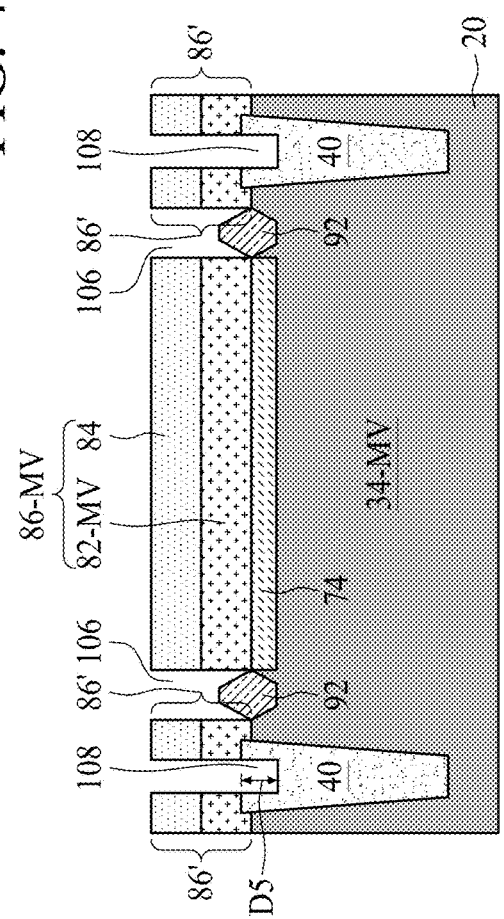
FIG. 40A
FIG. 40B
FIG. 40C

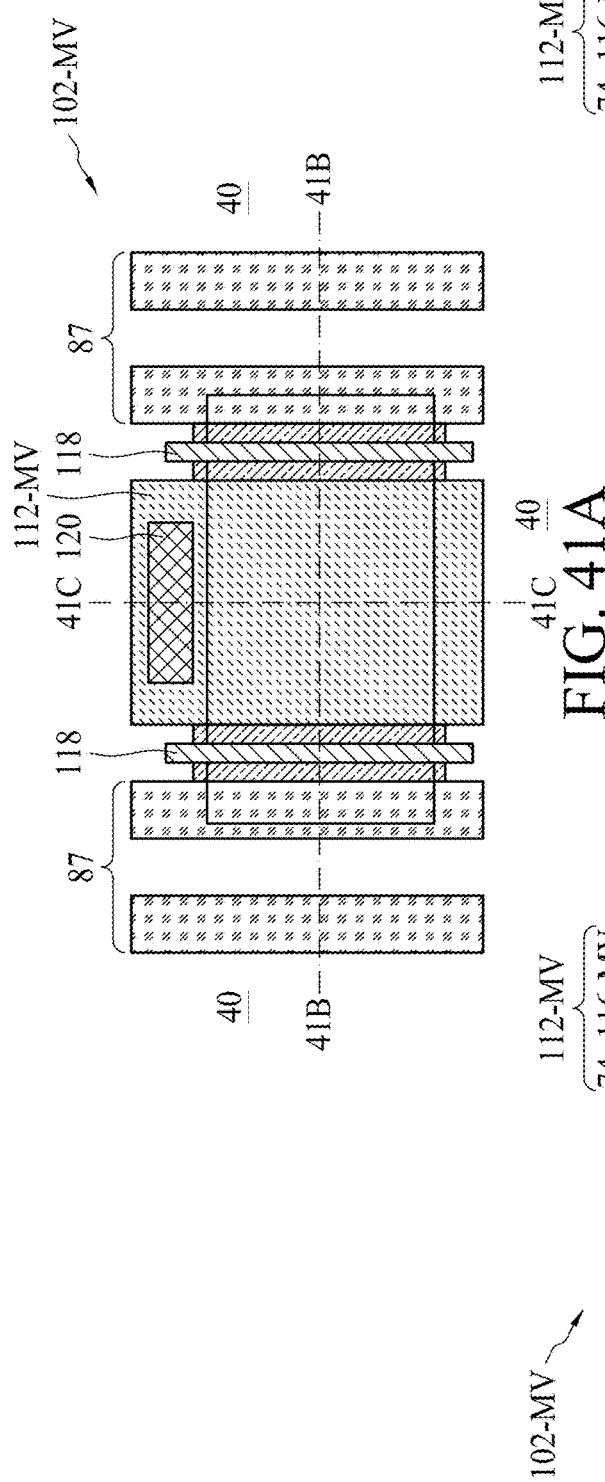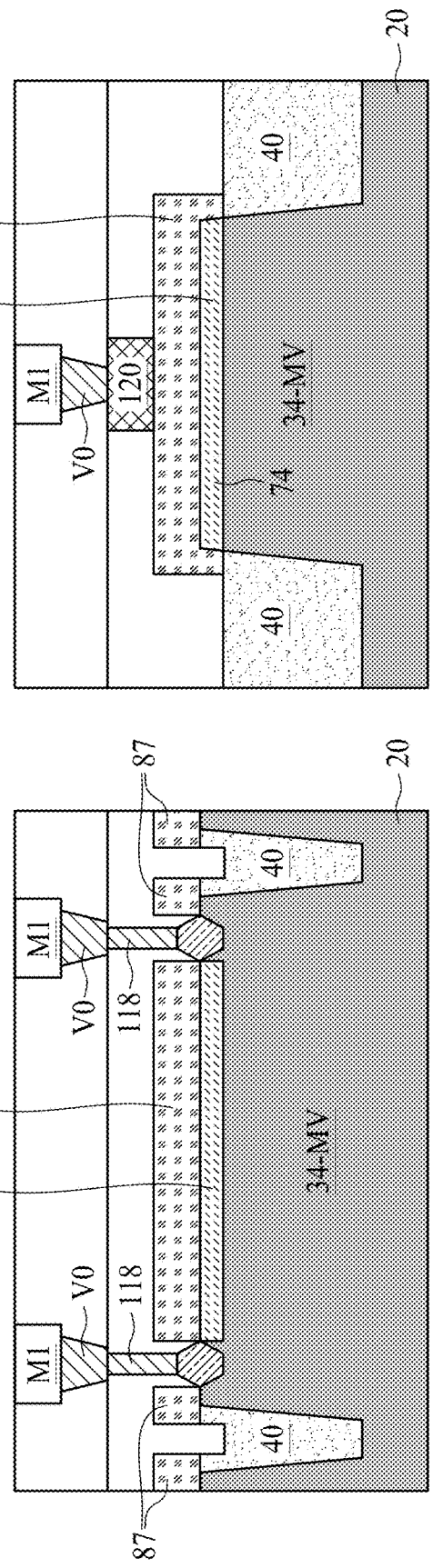
FIG. 41A
FIG. 41B
FIG. 41C

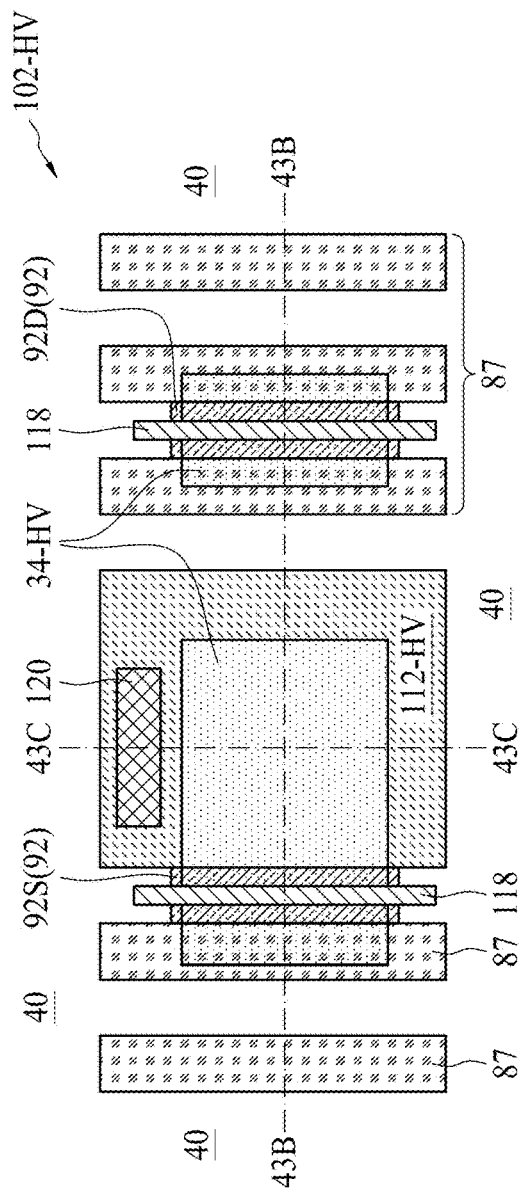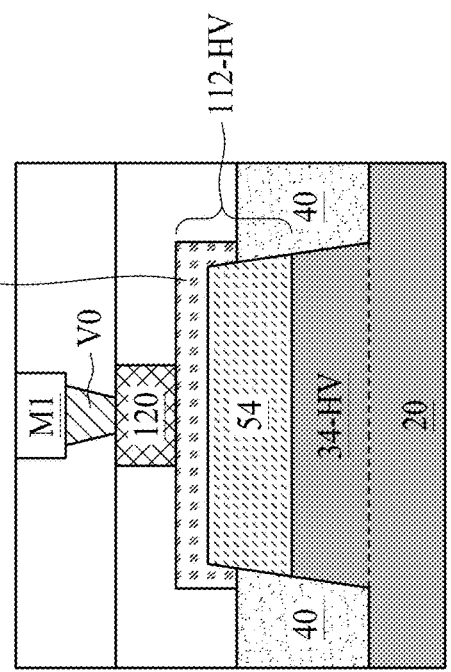
FIG. 43A
FIG. 43C
FIG. 43B

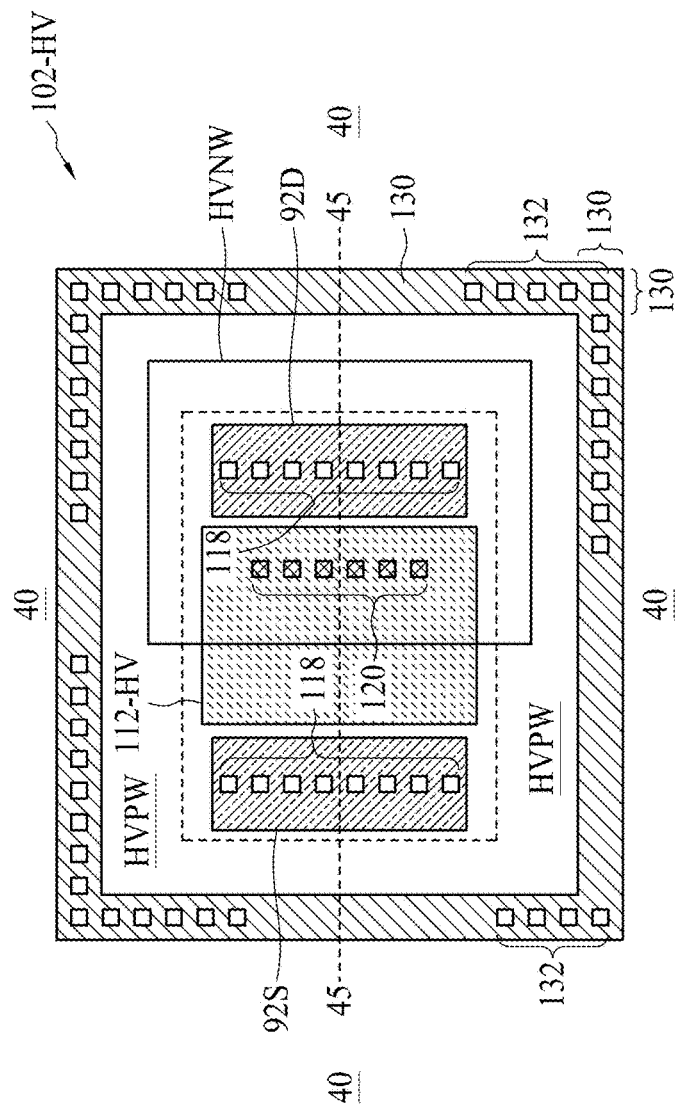
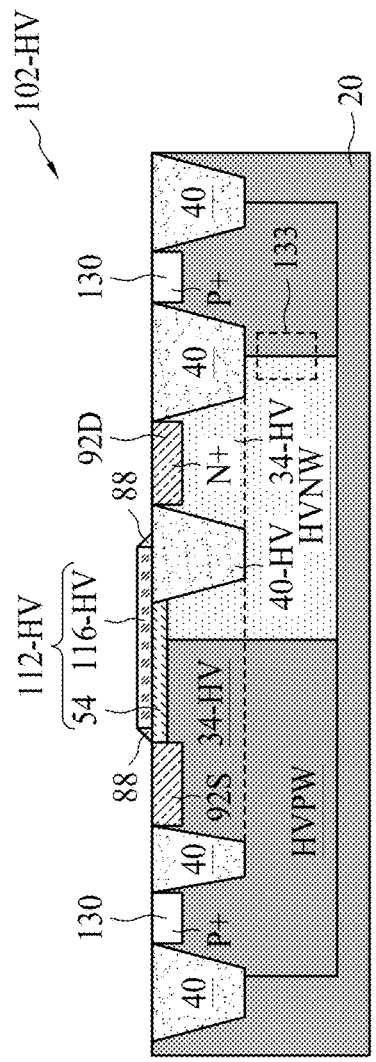
FIG. 44
FIG. 45

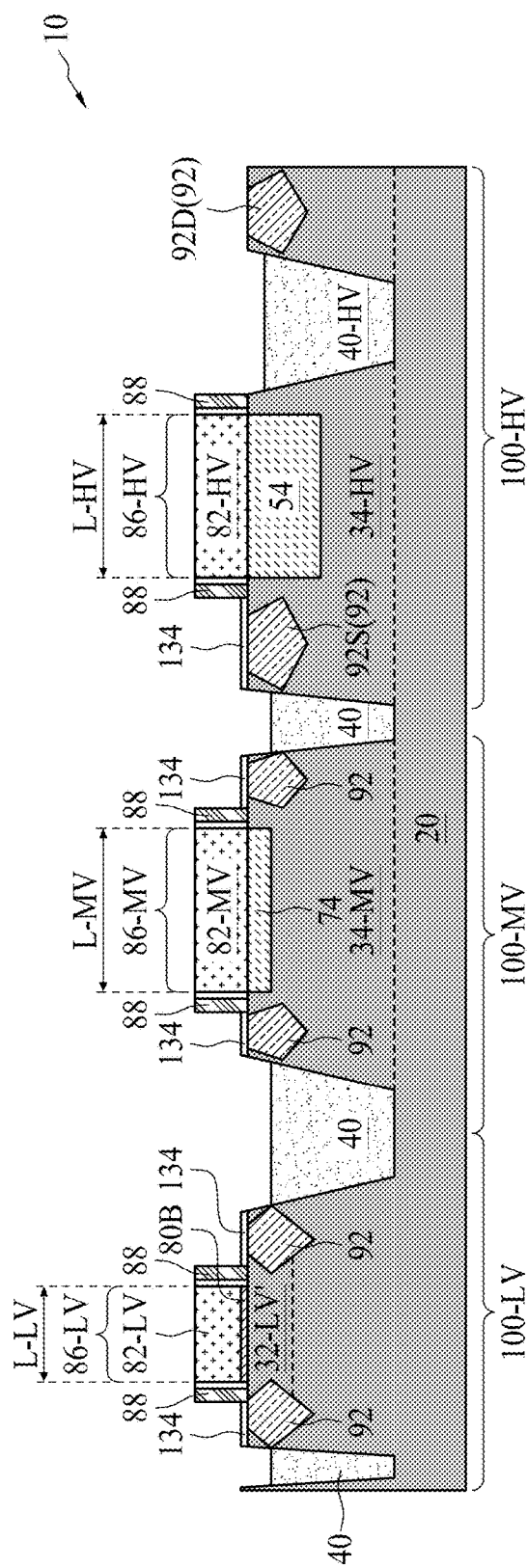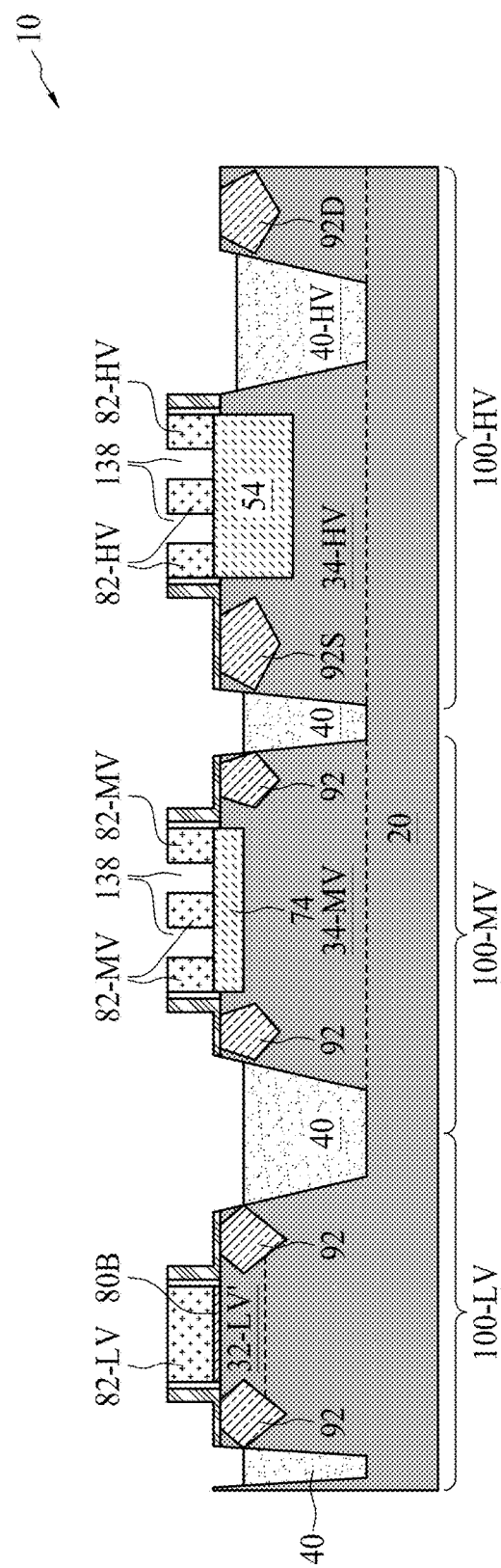
FIG. 49
FIG. 50

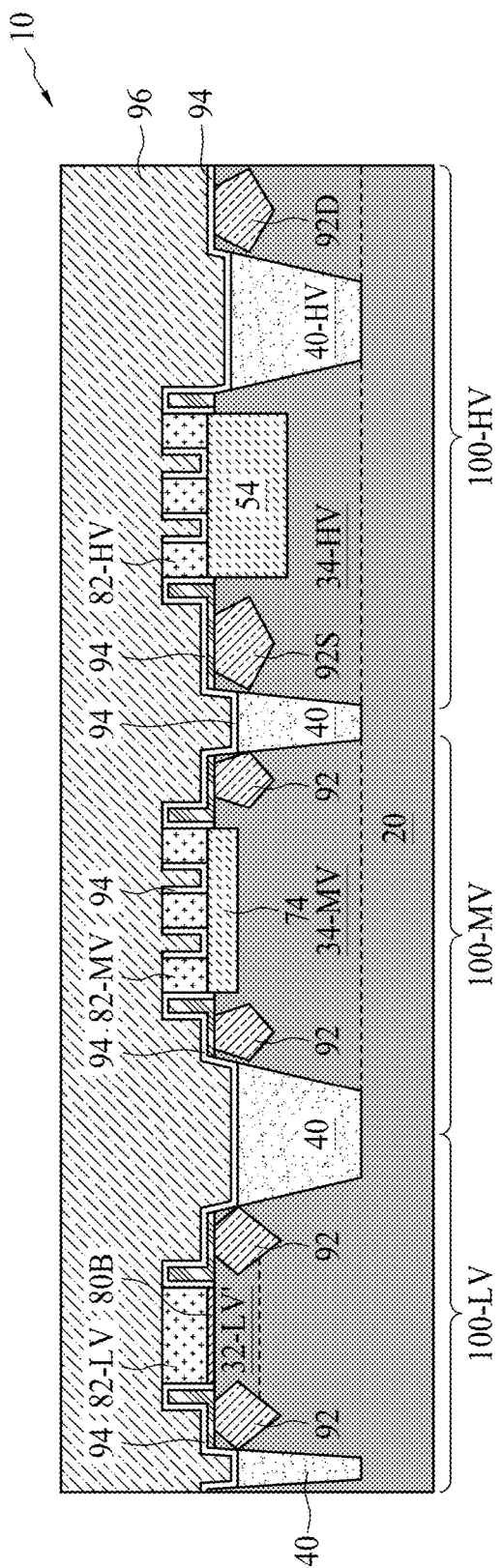
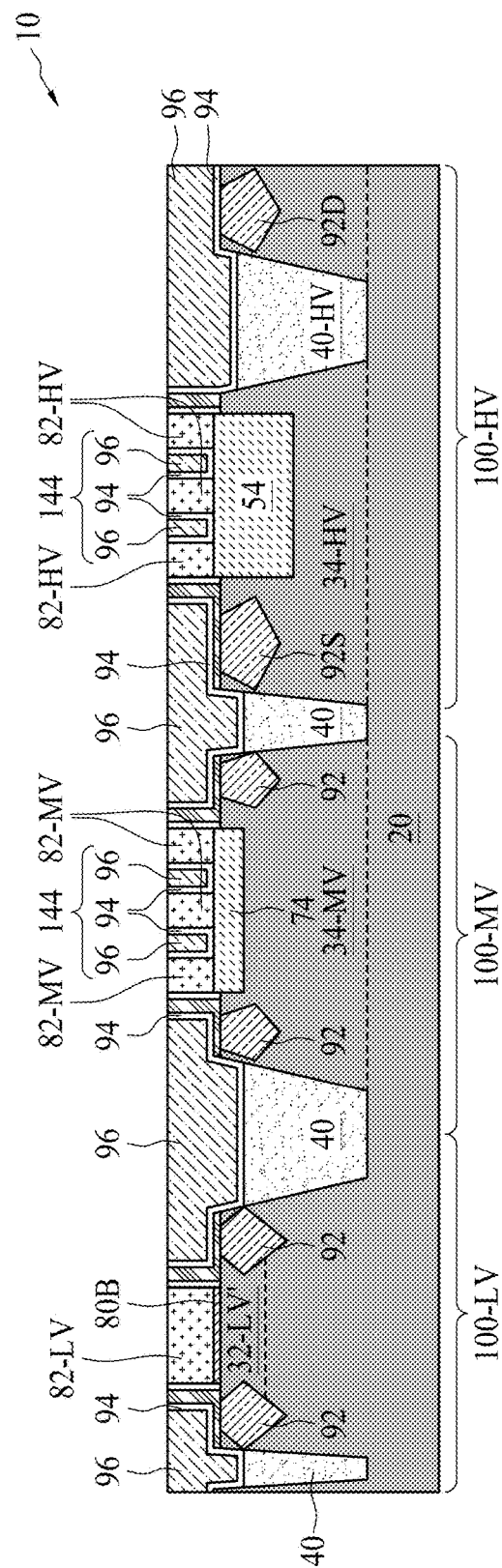
FIG. 51
FIG. 52

INTEGRATION OF MULTIPLE TRANSISTORS HAVING FIN AND MESA STRUCTURES

PRIORITY CLAIM AND CROSS-REFERENCE

This application claims the benefit of the following provisionally filed U.S. Patent application: Application No. 63/278,514, filed on Nov. 12, 2021, and entitled "MOSFET FiN/MESA LV/MV/HV 1.2V/8V/25V Devices," which application is hereby incorporated herein by reference.

BACKGROUND

A device die often needs a plurality of types of transistors to fit different requirements of circuits. For example, core transistors, low-voltage transistors, medium-voltage transistors, and high-voltage transistors are often used. In recent development of circuits, FinFETs have been used as core transistors and low-voltage transistors. The FinFETs, however, are not suitable for being used as the medium-voltage transistors and high-voltage transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-35 illustrate the cross-sectional views and a perspective view of intermediate stages in the formation of a core transistor, a low-voltage transistor, a medium-voltage transistor, and a high-voltage transistor on a same substrate in accordance with some embodiments.

FIGS. 36A, 36B, 36C, 37A, 37B, 37C, 38, 39, 40A, 40B, 40C, 41A, 41B, 41C, 42A, 42B, 42C, 43A, 43B, 43C, and 44-46 illustrate cross-sectional views and top views of various transistors in accordance with some embodiments.

FIGS. 49-55 illustrate the cross-sectional views of intermediate stages in the formation of replacement gate stacks having dielectric plugs therein in accordance with some embodiments.

DETAILED DESCRIPTION

Figure 5:
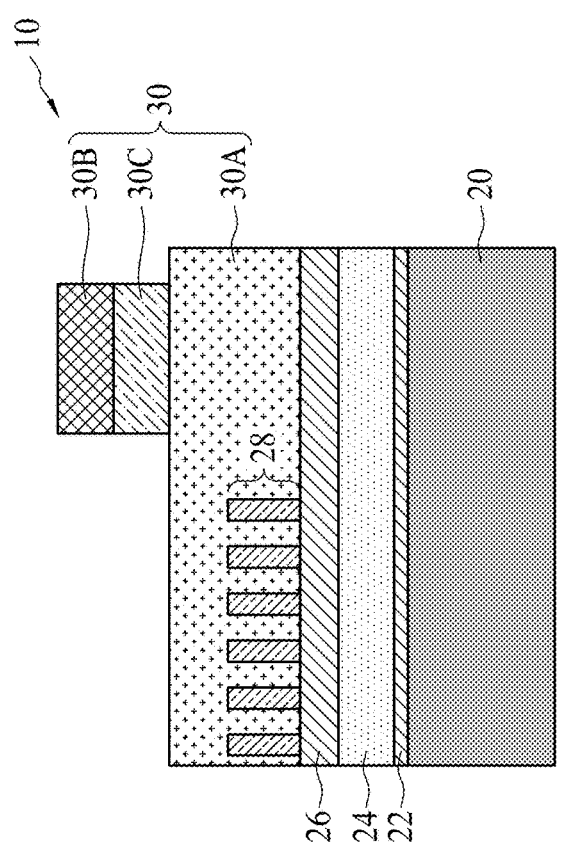

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integration process for integrating a core transistor, a Low-Voltage (LV) transistor, a Medium-Voltage (MV) transistor, and a High-Voltage (HV) transistor is provided. The structures of the resulting transistors are also provided. In accordance with some embodiments of the present disclosure, the core transistor, the LV transistor, the MV transistor, and the HV transistor are integrated on a same semiconductor substrate and in a same device die. Semiconductor fins are formed for forming the core transistor and the LV transistor, and mesa structures are formed for forming the MV transistor and HV transistor. The gates of the MV transistor and HV transistor may have dielectric plugs or polysilicon plugs therein. Dummy strips (which may include polysilicon or metal) may be formed on the Shallow Trench Isolation (STI) regions. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 69:
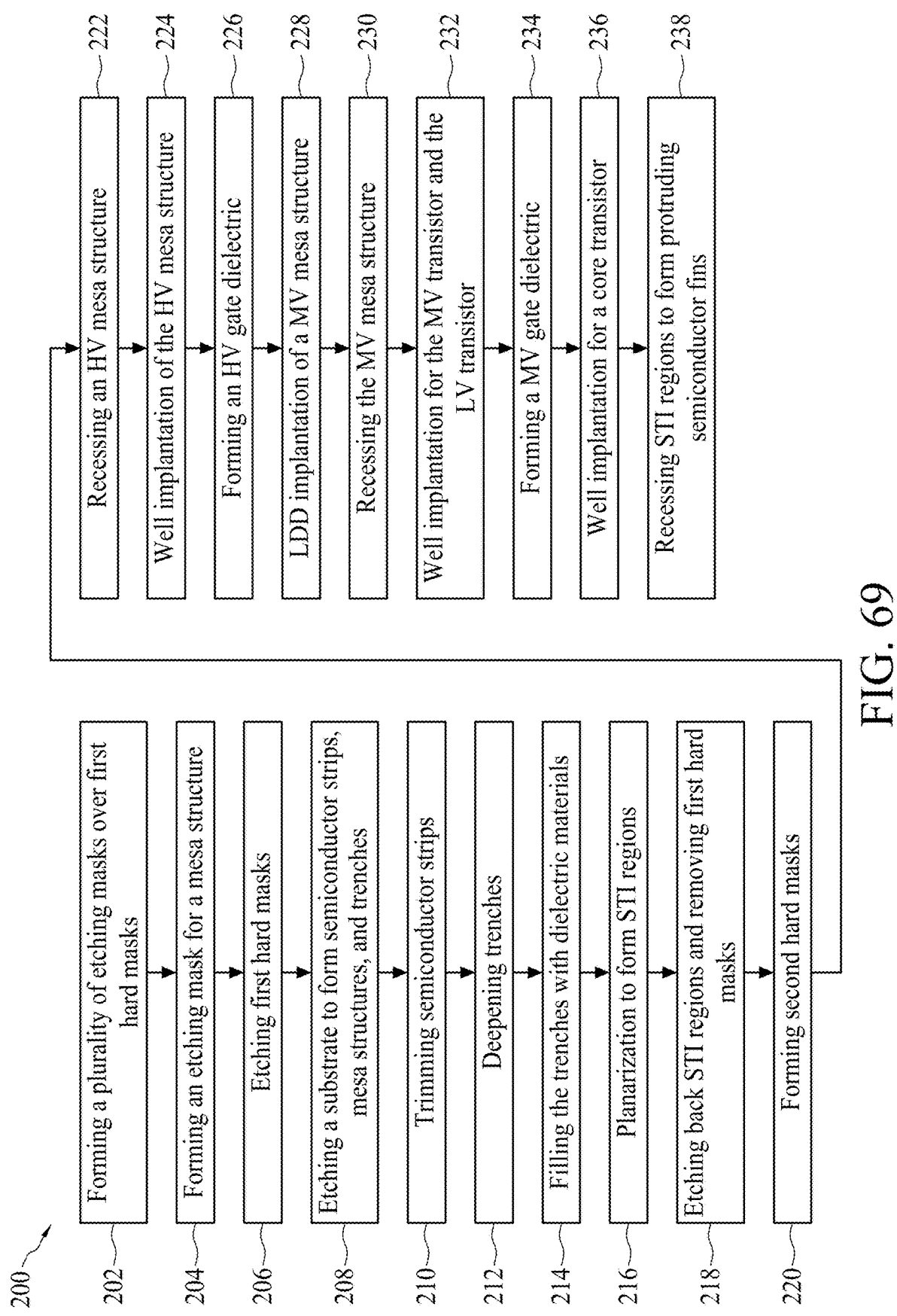
FIG. 69 illustrates a process flow for integrating a plurality of types of transistors in accordance with some embodiments.
Figure 69:
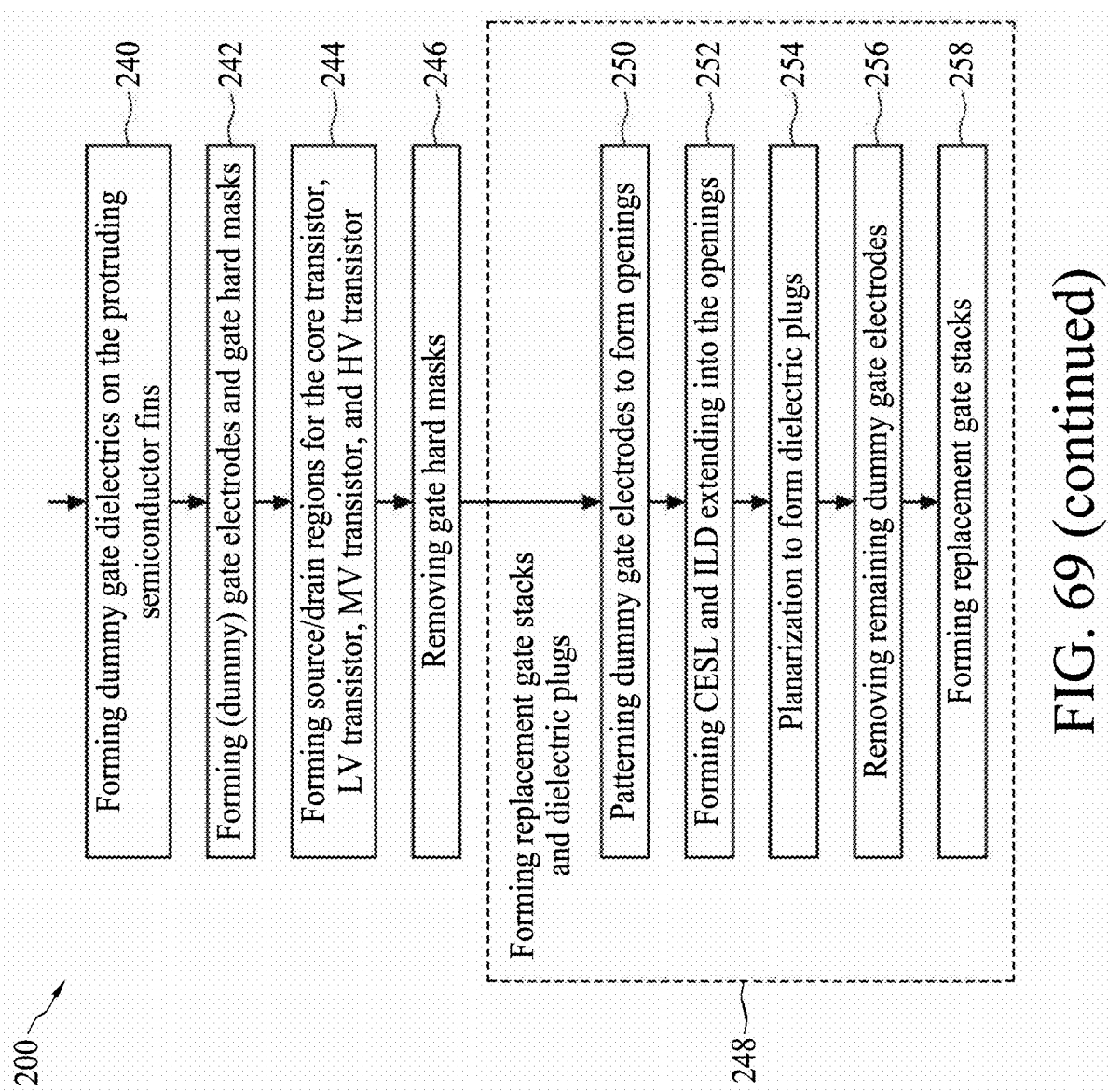

FIGS. 1 through 35 illustrate the cross-sectional views and a perspective view of intermediate stages in the formation of a core transistor, an LV transistor, a MV transistor, and an HV transistor in accordance with some embodiments of the present disclosure. The corresponding processes are also reflected schematically in the process flow 200 as shown in FIG. 69. Among FIGS. 1-35, FIGS. 1-9 illustrate the formation of semiconductor fins and mesa structures on a same semiconductor substrate, and FIGS. 10-35 illustrate the formation of the core transistor, an LV transistor, a MV transistor, and an HV transistor using the semiconductor fins and mesa structures. Some details of the core transistor or the LV transistor are shown in FIGS. 36A, 36B, 36C, 37A, 37B, and 37C. Some details of the MV transistor are shown in FIGS. 40A, 40B, 40C, 41A, 41B, and 41C. Some details of the HV transistor are shown in FIGS. 42A, 42B, and 42C through 46.

FIG. 1 illustrates the formation of an initial structure of wafer 10, which includes substrate 20. In accordance with some embodiments, substrate 20 may be formed of a semiconductor material such as silicon, silicon germanium, or the like. In some embodiments, substrate 20 is a crystalline semiconductor substrate such as a crystalline silicon substrate, while substrate 20 may also be formed of or comprises other materials such as silicon germanium. Substrate 20 may also be a bulk substrate, or may be a composite substrate including a plurality of layers, which may include a silicon layer and a silicon germanium layer over the silicon layer, or may include a silicon layer, a buried oxide layer over the silicon layer, and an additional silicon layer over the buried oxide layer.

A plurality of layers, which are used for etching the underlying substrate 20, are formed over substrate 20. An example of the plurality of layers are discussed herein. It is appreciated that the layers may be formed of different materials, and may include different number of layers therein. In accordance with some embodiments, pad oxide layer 22, hard mask 24, and oxide layer 26 are formed over substrate. In accordance with embodiments, pad oxide layer 22 comprises silicon oxide, and may be formed through oxidation of substrate or through a deposition process. The thickness of pad oxide layer 22 may be in the range between about 20 Å and about 60 Å. Hard mask 24 may be formed of silicon nitride, which may be formed through a deposition process such as a Chemical Vapor Deposition (CVD) process, a Plasma Enhanced Chemical Vapor Deposition (PECVD) process, an Atomic Layer Deposition (ALD) process, or the like. The thickness of hard mask 24 may be in the range between about 300 Å and about 500 Å.

Over hard mask 24, oxide layer 26 may be formed. Oxide layer 26 may be formed through a deposition process such as CVD, ALD, PECVD, or the like, and may be a silicon oxide layer. The thickness of oxide layer 26 may be in the range between about 400 Å and about 600 Å.

Etching masks 28 are formed over the plurality of layers. The respective process is illustrated as process 202 in the process flow 200 as shown in FIG. 69. In accordance with some embodiments, etching masks 28 are formed of or comprise silicon nitride, titanium nitride, or the like. Etching masks 28 may also be formed of or comprise an Ashing Removable Dielectric (ARD) material such as amorphous carbon. Etching masks 28 may be formed as a plurality of parallel strips (when viewed from top). The formation of etching masks 28 may include a deposition process (such as an ALD process) followed by a patterning process. The formation of etching masks 28 may also include a double-patterning process to reduce the pitch of etching masks 28. In accordance with some embodiments, the formation of etching masks 28 may be performed using a first photolithography apparatus having a first wavelength, which may be 193 nm, for example, so that the pitch of the etching masks 28 is small.

FIGS. 2 and 3 illustrate a lithography process for forming a bi-layer etching mask 30, which is used for forming mesa structures. The respective process is illustrated as process 204 in the process flow 200 as shown in FIG. 69. Referring to FIG. 2, etching mask 30 includes bottom layer 30A, and photoresist 30B over bottom layer 30A. Bottom layer 30A may be formed of an organic material such as a linked photoresist or an inorganic material such as silicon oxynitride. The bottom layer 30A also acts as a Bottom Anti-Reflective Coating (BARC). Photoresist 30B is formed over bottom layer 30A, and is then patterned through a light-exposure process and a development process. Photoresist 30B is then used to etch the bottom layer 30A. FIG. 3 illustrates a resulting structure, wherein photoresist 30B has been removed.

Figure 6:
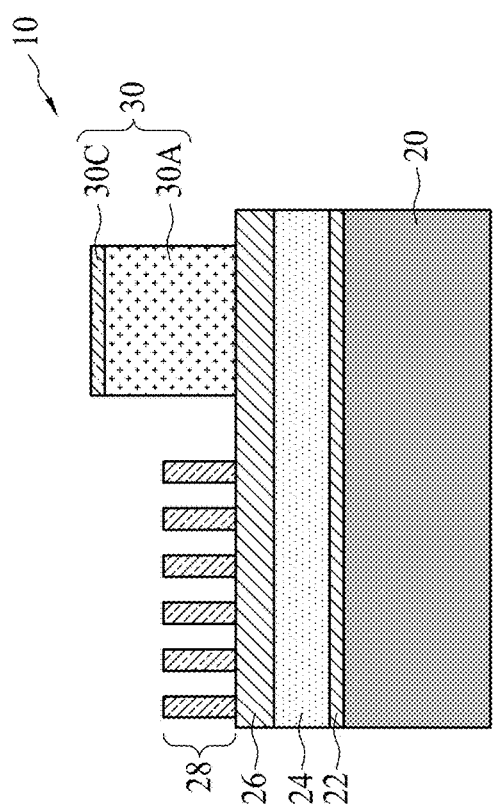

FIGS. 4-6 illustrate a photolithography process for forming a tri-layer etching mask 30 in accordance with alternative embodiments. The respective process is also illustrated as process 204 in the process flow 200 as shown in FIG. 69. Referring to FIG. 4, the tri-layer etching mask 30, besides bottom layer 30A and photoresist 30B, also includes middle layer 30C. In accordance with some embodiments, bottom layer 30A may be formed of a linked photoresist, and middle layer 30C may be formed of an inorganic material such as silicon oxynitride. The bottom layer 30A also acts as a Bottom Anti-Reflective Coating (BARC). Photoresist 30B is formed over bottom layer 30A, and is then patterned through a light-exposure process and a development process. Next, referring to FIG. 5, photoresist 30B is used to etch the middle layer 30C. FIG. 6 illustrates the etching of bottom layer 30A using middle layer 30C as an etching mask. Photoresist 30B may be consumed during the etching of bottom layer 30A.

In accordance with some embodiments, the patterning of etching mask 30 may be performed using a second photolithography apparatus, which is different from the first photolithography apparatus for patterning etching masks 28. The second photolithography apparatus for patterning etching mask 30 may use a second wavelength longer than the first wavelength. For example, the second wavelength may be 248 nm.

Figure 7:
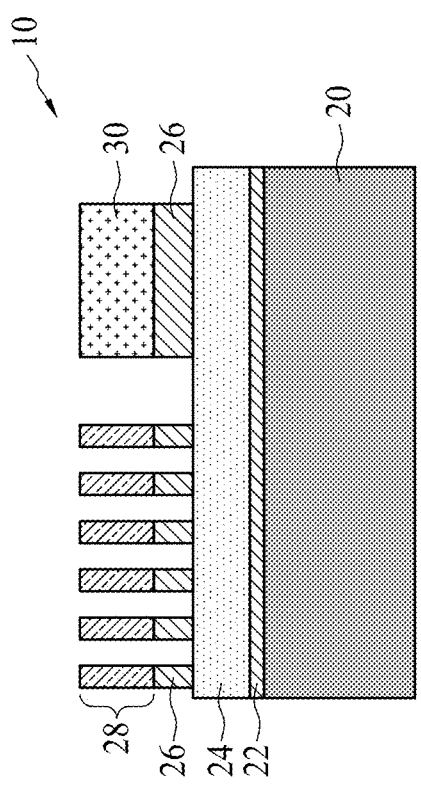
Figure 8:
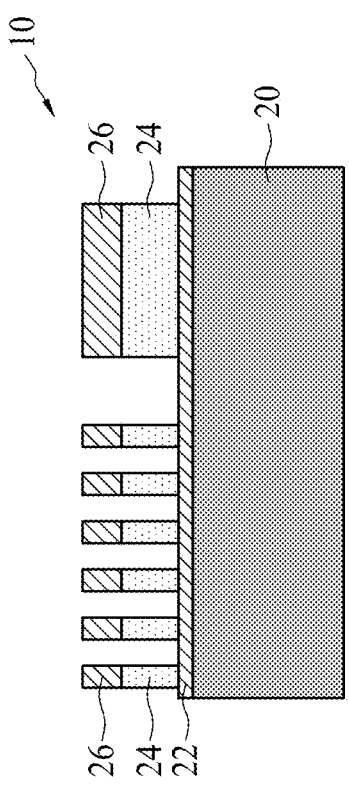

Referring to FIG. 7, oxide layer 26 is etched using hard masks 28 and etching mask 30 collectively to define patterns. In a subsequent process, as shown in FIG. 8, hard mask 24 is etched, wherein hard masks 28 and etching mask 30 are also used to define the patterns of the resulting hard mask 24. The etching may be stopped on pad oxide layer 22. Hard masks 28 and etching mask 30 are then removed in an etching process, and the resulting structure is shown in FIG. 8. The respective process is illustrated as process 206 in the process flow 200 as shown in FIG. 69.

Figure 9:
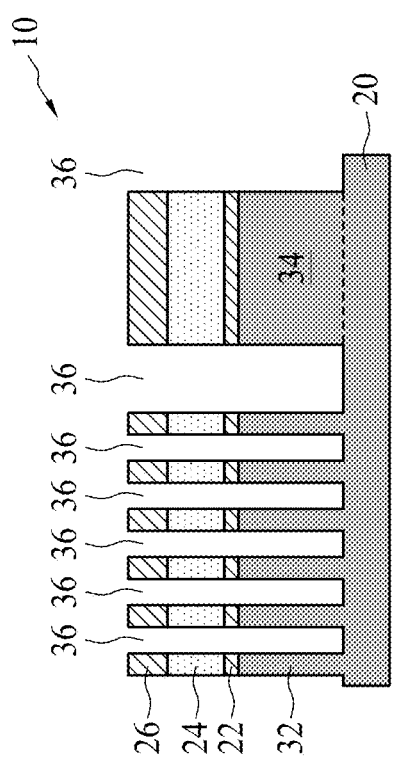

Referring to FIG. 9, semiconductor substrate 20 is etched to form semiconductor strips 32 and mesa structures 34, which protrude higher than the respective underlying portion of substrate 20. The respective process is illustrated as process 208 in the process flow 200 as shown in FIG. 69. Throughout the description, the portions of semiconductor substrate 20 underlying semiconductor strips 32 and mesa structures 34 are referred to as a bulk semiconductor substrate or a bulk portion of semiconductor substrate 20. Trenches 36 are formed in semiconductor substrate 20 to separate the semiconductor strips 32 and mesa structures 34. In the etching process, oxide layer 26 and hard mask 24 may be used as an etching mask. The etching is performed through an anisotropic etching process, wherein process gases such as fluorine ($F_2$), Chlorine ($Cl_2$), hydrogen chloride (HCl), hydrogen bromide (HBr), Bromine ($Br_2$), $C_2F_6$, CF$_4$, SO$_2$, the mixture of HBr, Cl$_2$, and O$_2$, or the mixture of HBr, Cl$_2$, O$_2$, and CH$_2$F$_2$, etc. may be used. In accordance with some embodiments, semiconductor strips 32 (including 32A and 32B as shown in FIG. 10) are used to form the core transistors and the LV transistors, and mesa structures 34 (including 34-MV and 34-HV as shown in FIG. 10) are used to form MV transistors and HV transistors.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The protruding semiconductor fins 32 and the mesa structures 34 as formed in FIGS. 1 through 9 are then used to form a core transistor, an LV transistor, a MV transistor, and a HV transistor in accordance with some embodiments, and the processes are shown in FIGS. 10 through 35.

Referring to FIG. 10, wafer 10 includes device region 100-*core* for forming the core transistor, device region 100-LV for forming the LV transistor, device region 100-MV for forming the MV transistor, and device region 100-HV for forming the HV transistor. In accordance with some embodiments, semiconductor strips 32A are formed in device region 100-*core*, and are used for forming the core transistor. Semiconductor strips 32B are formed in device region 100-LV, and are used for forming the LV transistor. Mesa structure 34-MV is formed in device region 100-MV, and is used to form the MV transistor. Mesa structure 34-HV is formed in device region 100-HV, and is used to form the HV transistor.

In accordance with some embodiments, the core transistor is operated under (and is configured to endure) a first positive power supply voltage (VDD-core). The LV transistor is operated under (and is configured to endure) a second positive power supply voltage (VDD-LV) higher than the first positive power supply voltage VDD-core. The MV transistor is operated under (and is configured to endure) a third positive power supply voltage (VDD-MV) higher than the second positive power supply voltage VDD-LV. The HV transistor operated under (and is configured to endure) a fourth positive power supply voltage (VDD-HV) higher than the third positive power supply voltage VDD-MV. In accordance with some example embodiments, the positive power supply voltage VDD-core may be lower than about 0.8V, and may be in the range between about 0.5V and about 0.8V. The positive power supply voltage VDD-LV may be lower than about 2.5V, and may be in the range between about 1.0V and about 2.5V. The positive power supply voltage VDD-MV may be lower than about 12V, and may be in the range between about 3V and about 12V. The positive power supply voltage VDD-HV may be lower than about 32V, and may be in the range between about 15V and about 32V.

FIG. 11 illustrates the trimming of some semiconductor strips 32A. The respective process is illustrated as process 210 in the process flow 200 as shown in FIG. 69. In accordance with some embodiments, the trimming process includes forming a patterned etching mask (not shown) such as a photoresist, and etching the undesirable semiconductor strips 32A. For example, in FIG. 11, two semiconductor strips 32A in the device region 100-*core* are removed, while the semiconductor strips 32B in device region 100-LV may also be removed or not removed, depending on the requirement of the performance of the core transistor and the LV transistor. After the trimming process, the etching mask is removed, for example, through etching or ashing. A wet clean process may be performed to remove the by-product generated in the preceding process. In FIG. 11, a dashed line 33 is drawn to show the bottom level of protruding semiconductor fins 32.

Figure 12:
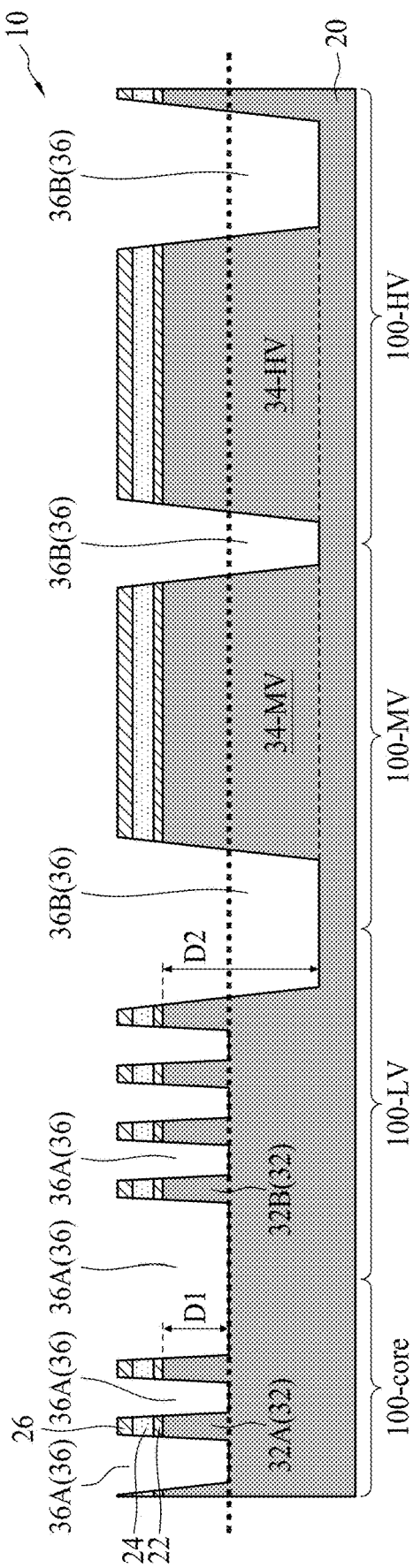

FIG. 12 illustrates the deepening of trenches 36 (denoted as 36B) in device region 100-MV and device region 100-HV. Trenches 36A, on the other hand, may not be deepened. The respective process is illustrated as process 212 in the process flow 200 as shown in FIG. 69. In accordance with some embodiments, trenches 36A in device region 100-*core* and device region 100-LV have depth D1, and trenches 36B in device region 100-MV and device region 100-HV have depth D2 greater than depth D1. The values of depth D1 and D2 are selected so that after the formation of the resulting transistors, the subsequently formed STI regions may have depths following into desirable ranges.

In accordance with some embodiments, the depth D1 may be in the range between about 900 Å and about 1,600 Å, and the depth D2 may be in the range between about 3,000 Å and about 4,200 Å. The trench deepening process may be performed by forming a patterned etching mask (not shown), with trenches 36B exposed to the openings in the patterned etching mask, etching the semiconductor substrate 20 to increase the depth D1 to depth D2, and removing the etching mask. After the trench deepening process, the etching mask is removed, for example, through etching or ashing. A wet clean process may be performed to remove the by-product generated in the preceding process.

Figure 13:
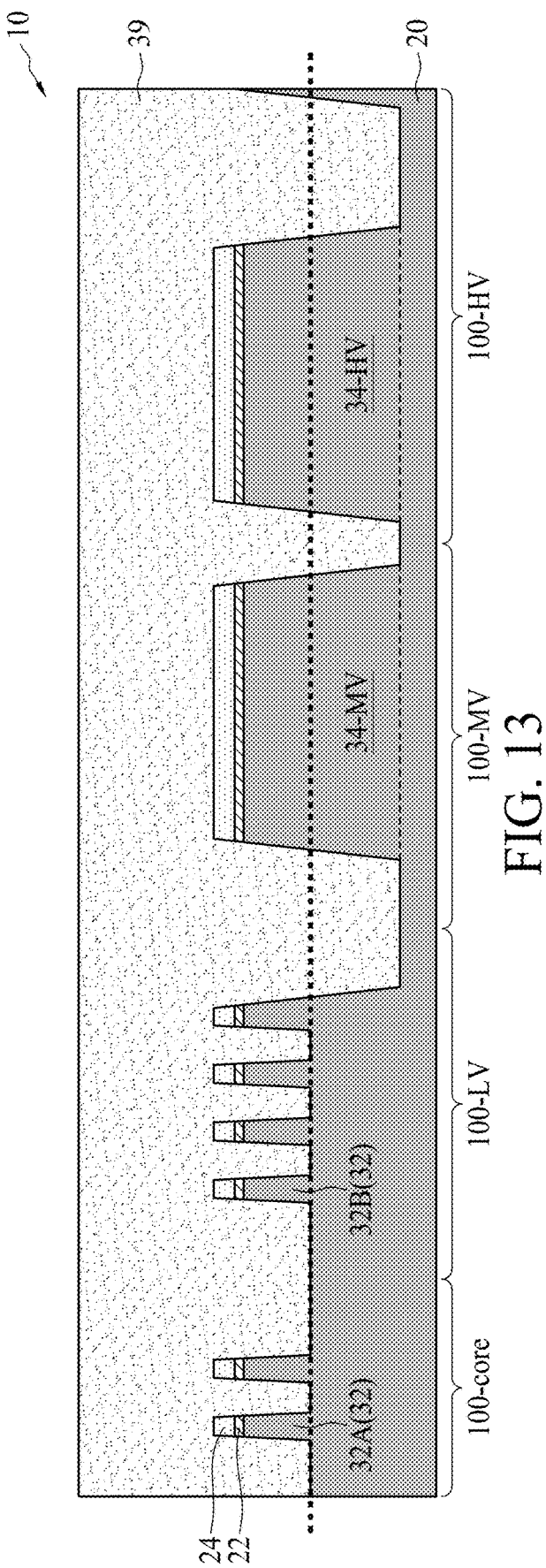
Figure 14:
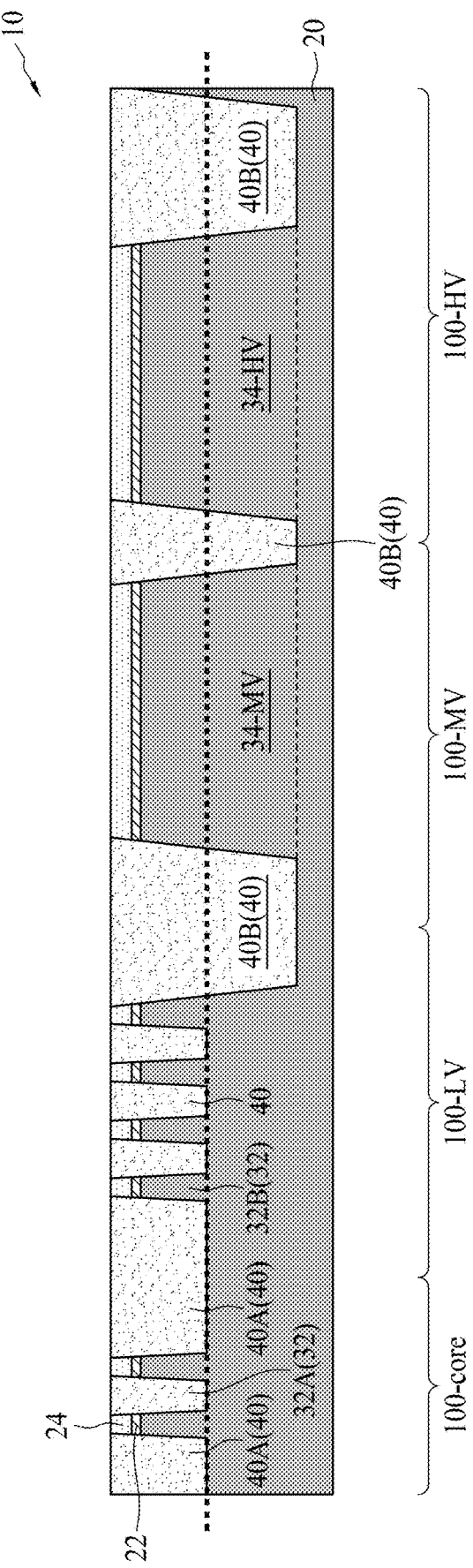

FIGS. 13 and 14 illustrate the formation of STI regions using dielectric materials 39. In accordance with some embodiment, a liner dielectric (not shown) is first formed at the bottoms of trenches 36 and extending on the sidewalls of semiconductor strips 32 and mesa structures 34. The liner dielectric may be a conformal layer, whose horizontal portions and vertical portions have thicknesses close to each other, for example, with a thickness variation smaller than about 20 percent or 10 percent. In accordance with some embodiments of the present disclosure, the liner dielectric is formed using a deposition method such as CVD, Sub Atmospheric Chemical Vapor Deposition (SACVD), ALD, or the like. The liner dielectric may be formed of or comprise silicon oxide, silicon nitride, silicon oxynitride, and/or the like.

After the formation of the liner dielectric, a dielectric filling material is deposited to fill the remaining portions of trenches 36, resulting in the structure shown in FIG. 13. The respective process is illustrated as process 214 in the process flow 200 as shown in FIG. 69. The deposition method of the dielectric filling material may be selected from Flowable Chemical Vapor Deposition (FCVD), spin-on coating, CVD, ALD, and the like. In accordance with some embodiments in which FCVD is used, a silicon-and-nitrogen-containing precursor (for example, trisilylamine (TSA) or disilylamine (DSA)) is used, and hence the resulting dielectric filling material is flowable. In accordance with alternative embodiments of the present disclosure, the flowable dielectric filling material is formed using an alkylamino silane-based precursor.

After the dielectric filling material is deposited, an annealing/curing process is performed, which converts the flowable dielectric filling material into a solid dielectric material. In accordance with some embodiments of the present disclosure, the annealing process is performed in an oxygen-containing environment including oxygen ($O_2$), ozone ($O_3$), or combinations thereof. Steam ($H_2O$) may also be used, and may be used along with or without oxygen ($O_2$) or ozone.

Referring to FIG. 14, a planarization process such as a Chemical Mechanical Polish (CMP) process or a mechanical grinding process is performed. The respective process is illustrated as process 216 in the process flow 200 as shown in FIG. 69. The portions of the dielectric materials over hard mask 24 are removed. STI regions 40 (including 40A and 40B) are thus formed, which include the remaining portions of the liner dielectric and the dielectric filling material. Hard mask 24 may be used as the CMP stop layer, and hence the top surface of STI regions 40 are coplanar with the top surfaces of hard mask 24.

After the planarization process, a second annealing process may be performed. The second annealing process may be a dry annealing process, and may be performed, for example, in a furnace. An oxygen-containing gas (such as $O_2$) may also be conducted into the furnace when the anneal is performed. Through the annealing, STI regions 40 are densified.

Figure 15:
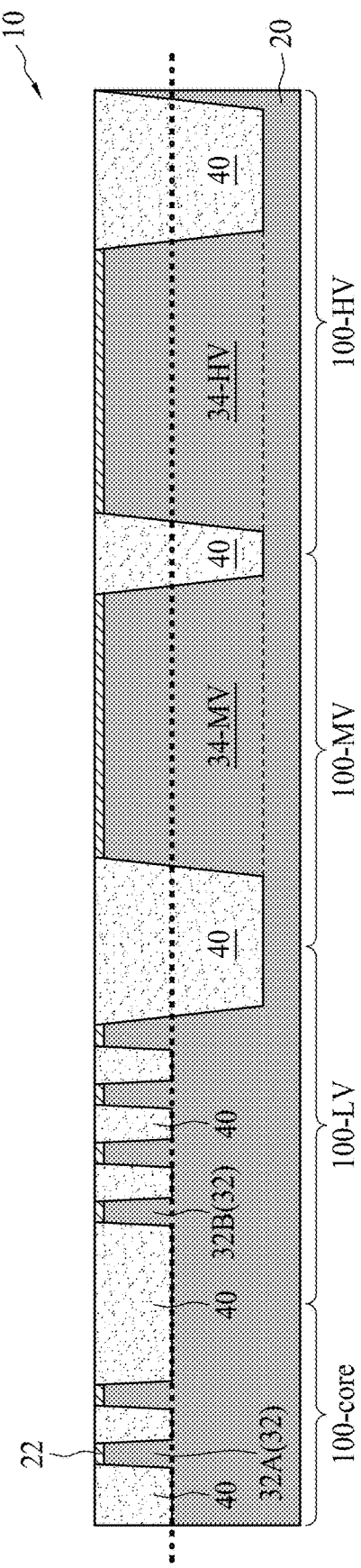

FIG. 15 illustrates the etch-back of STI regions 40 and the removal of hard mask 24, wherein hard mask 24 is removed through an etching process. The respective process is illustrated as process 218 in the process flow 200 as shown in FIG. 69. Pad oxide layer 22 is thus exposed. The top surfaces of STI regions 40 and pad oxide layer 22 are thus substantially coplanar.

Figure 16:
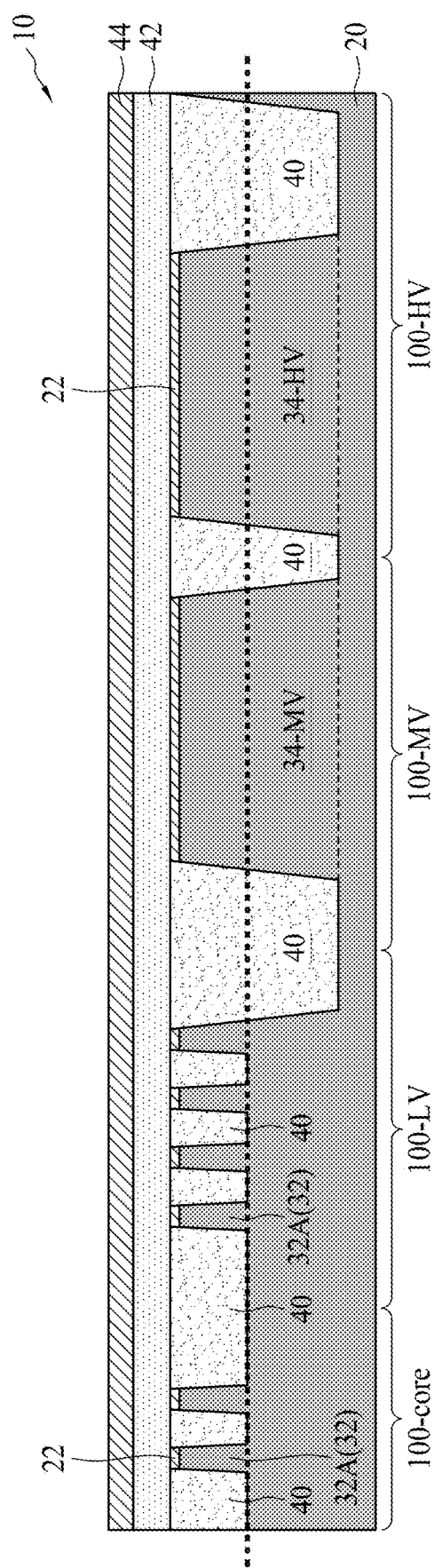

Next, as shown in FIG. 16, hard mask 42 and oxide layer 44 are deposited. The respective process is illustrated as process 220 in the process flow 200 as shown in FIG. 69. The materials and the formation processes of hard mask 42 and oxide layer 44 may be selected from the candidate materials and formation processes of hard mask 24 and oxide layer 26, respectively. For example, hard mask 42 may be formed of or comprise silicon nitride, and oxide layer 44 may be formed of or comprise silicon oxide. In accordance with some embodiments, pad oxide layer 44 may be formed using Tetraethyl orthosilicate (TEOS) as a precursor.

Figure 17:
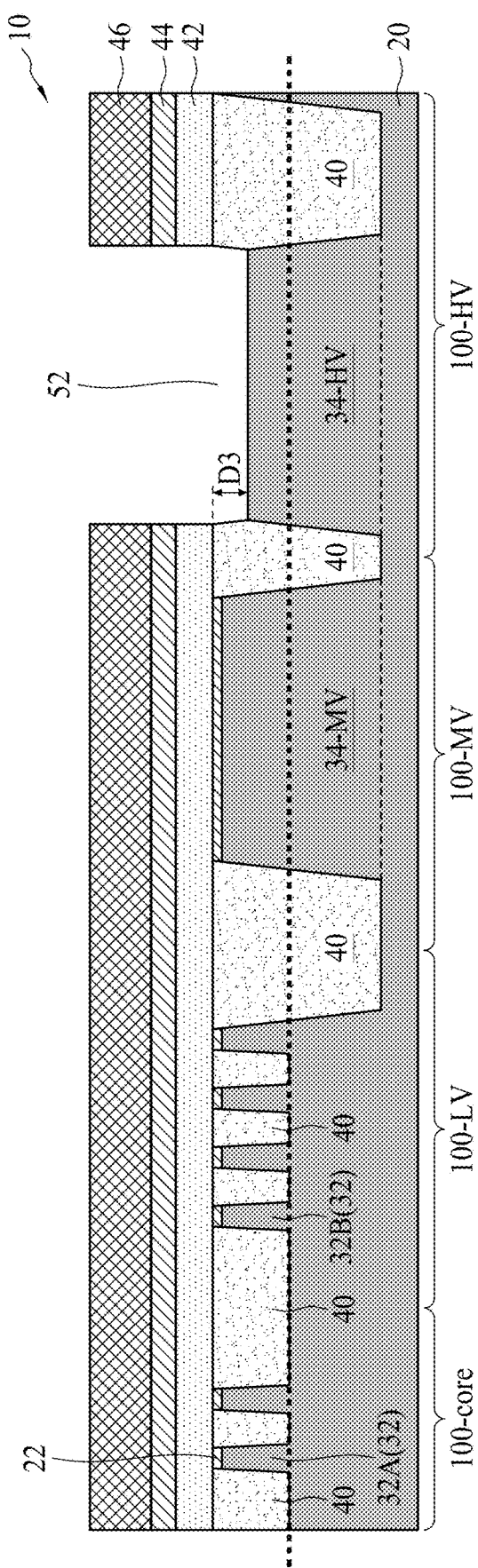

FIG. 17 illustrates the patterning of oxide layer 44 and hard mask 42, which is performed through a photolithography process. Hard mask 42 and oxide layer 44 are etched using the patterned photoresist 46 as an etching mask, hence exposing a portion of oxide layer 22. Next, the exposed portion oxide layer 22 is removed, followed by the recessing of mesa structure 34-HV through an etching process. The respective process is illustrated as process 222 in the process flow 200 as shown in FIG. 69. The recessing may be performed through an anisotropic etching process. The recessing depth D3 of the recess 52 may be in the range between about 200 Å and about 400 Å. After the gate recessing process, a cleaning process is performed to clean the recess 52.

The recessing of mesa structure 34-HV may leave a space for the subsequently formed thick gate oxide for the HV transistor, so that the top surface of the gate oxide for the HV transistor is not at a too-high level. An advantageous feature is that with the recessing, the top surfaces of the subsequently formed gate electrodes of the core transistor, the LV transistor, the MV transistor, and the HV transistor may be coplanar. This will enable some common processes to be shared by the formation of the various types of transistors to reduce manufacturing cost. For example, in the processes as shown in FIGS. 32-35, same processes may be performed in device regions 100-*core*, 100-LV, 100-MV, and 100-HV using common processes. After the gate recessing process, photoresist 46 (FIG. 17) is removed. Oxide layer 44 may also be removed, or may be left not removed.

Figure 46:
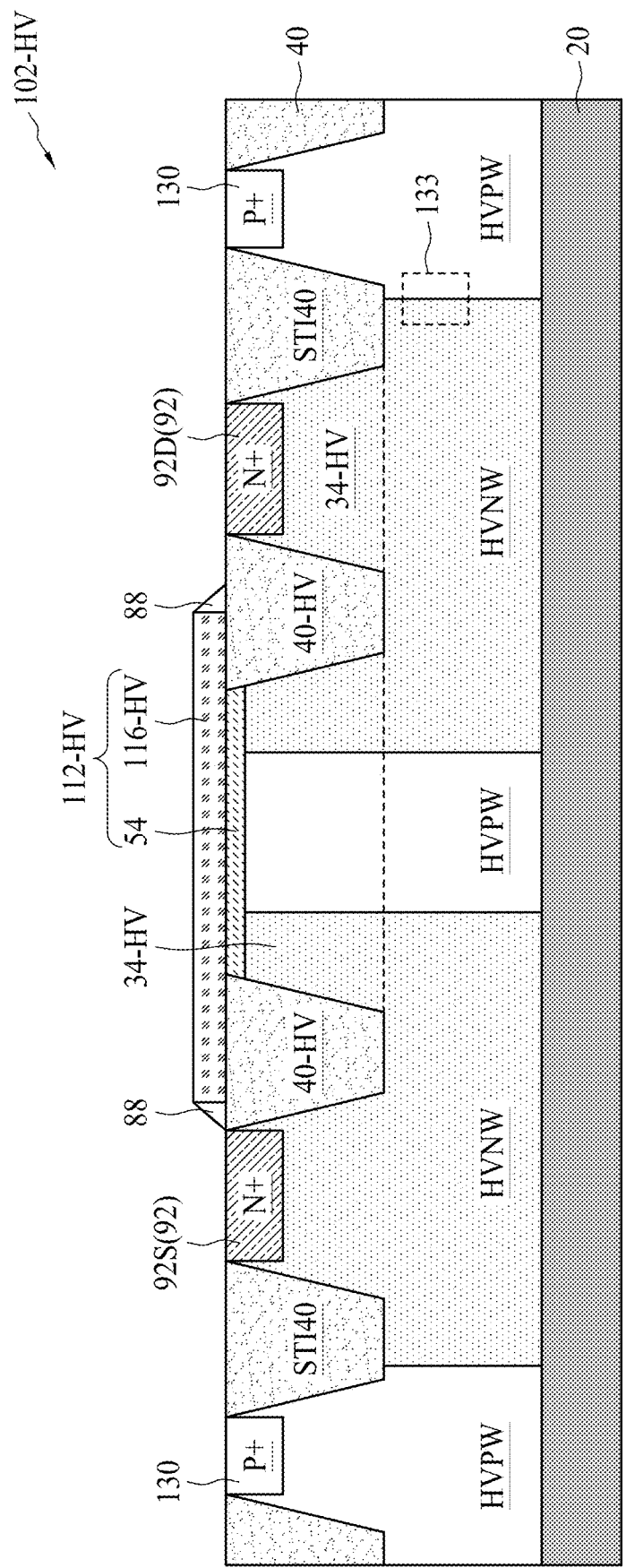

FIG. 18 illustrates the well implantation processes for the HV transistor. The respective process is illustrated as process 224 in the process flow 200 as shown in FIG. 69. First, a patterned implantation mask 48, which may include a photoresist, is formed. An implantation process 50 is then performed to implant a p-type dopant or an n-type dopant to form a p-well region or an n-well region. It is appreciated that implantation mask 48 and implantation process 50 may represent the formation of a plurality of well regions including both of p-well regions and n-well regions, and may also represent the corresponding deep well region such as a deep n-well region. For example, FIGS. 45 and 46 illustrate that the HV transistor includes both of HV p-well regions and HV n-well regions, which are formed in separate implantation processes. For each of the p-well region and n-well region, an implantation mask may be formed, and the implantation mask is removed after the implantation process. The well implantation processes may be followed by an anneal process. After the implantation, the patterned implantation mask 48 is removed.

Next, as shown in FIG. 19, HV gate oxide 54 is formed, for example, through a deposition process. The respective process is illustrated as process 226 in the process flow 200 as shown in FIG. 69. The deposition may be conducted through an ALD process, a CVD process, a PECVD process, or the like. In accordance with some embodiments, the formation of HV gate oxide 54 is performed through a deposition process followed by a planarization process such as a CMP process or a mechanical grinding process. The planarization process removes excess portion of the HV gate oxide 54 higher than the top surface of hard mask 42. In accordance with some embodiments, the deposition is selective, for example, by selectively forming an inhibitor film (not shown) on the surfaces of dielectric materials including hard mask 42, selectively depositing HV gate oxide 54, and removing the inhibitor film. HV gate oxide 54 may comprise silicon oxide.

Figure 20:
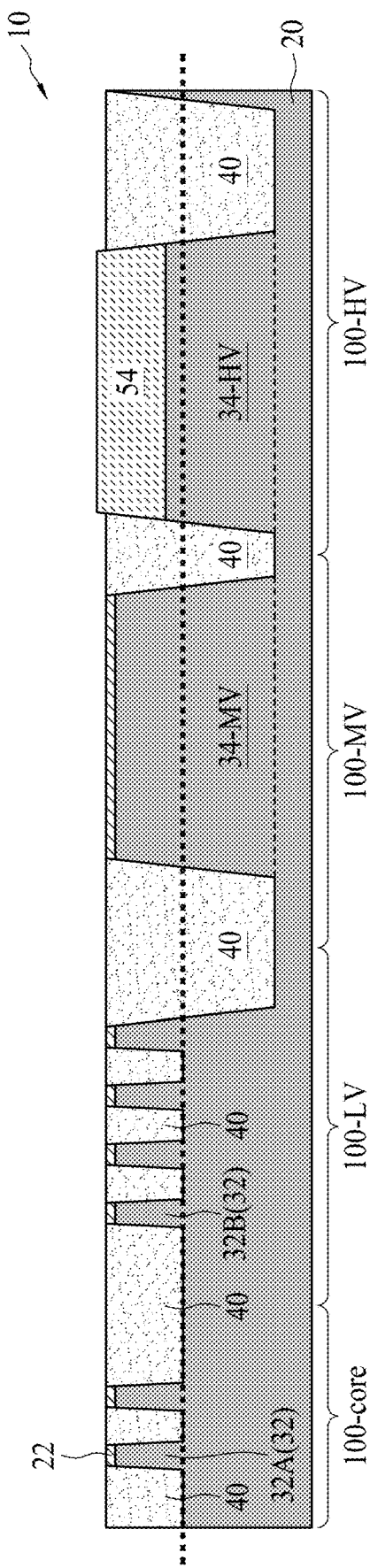
Figure 21:
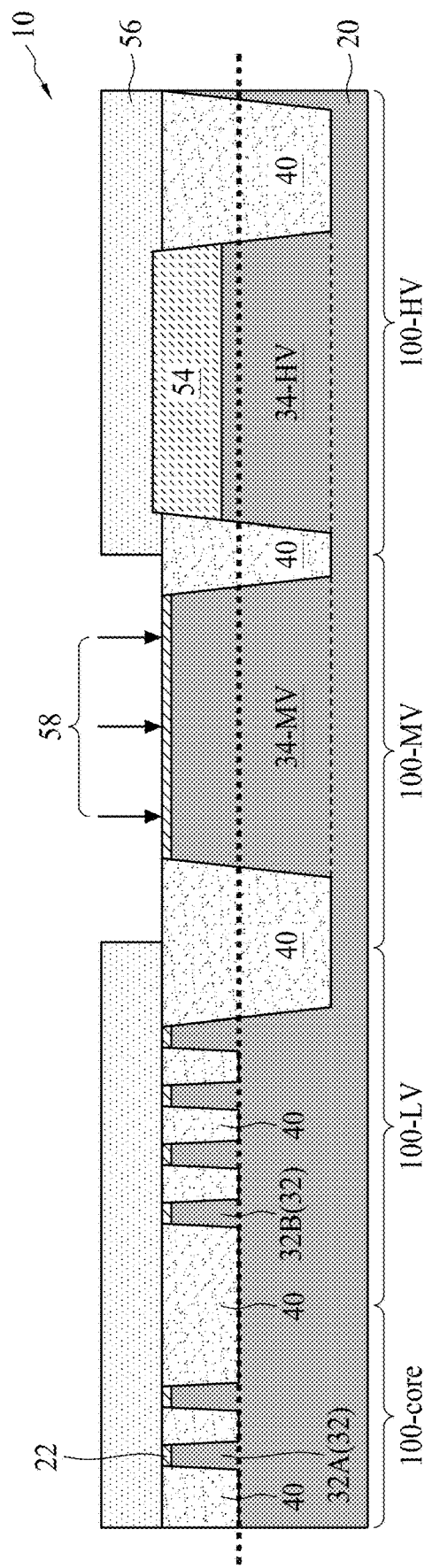

Hard mask 42 is then removed, and the resulting structure is shown in FIG. 20. Referring to FIG. 21, implantation mask 56, which may include a photoresist, is formed and patterned, so that device region 100-MV is exposed. A first implantation process 58 is then preformed to form the Lightly-Doped Drain (and source) LDD regions (not shown) for the MV transistor. The respective process is illustrated as process 228 in the process flow 200 as shown in FIG. 69. The dopant is selected based on whether the MV transistor is p-type or n-type. For example, when an n-type MV transistor is formed, phosphorous and/or arsenic may be doped, and when a p-type MV transistor is formed, boron and/or indium may be doped. After the implantation, implantation mask 56 is removed.

Figure 22:
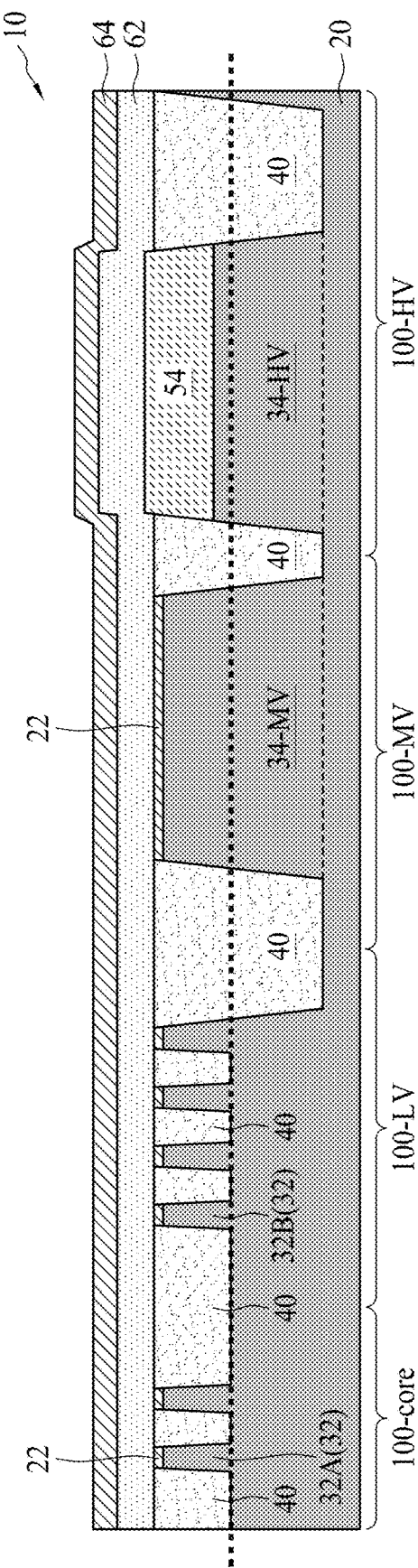

Next, as shown in FIG. 22, hard mask 62 and oxide layer 64 are deposited. The materials and the formation processes of hard mask 62 and oxide layer 64 may be selected from the candidate materials and formation processes of hard mask 24 and oxide layer 26, respectively. For example, hard mask 62 may be formed of or comprise silicon nitride, and oxide layer 64 may be formed of or comprise silicon oxide. In accordance with some embodiments, pad oxide layer 64 may be formed using TEOS as a precursor.

Figure 23:
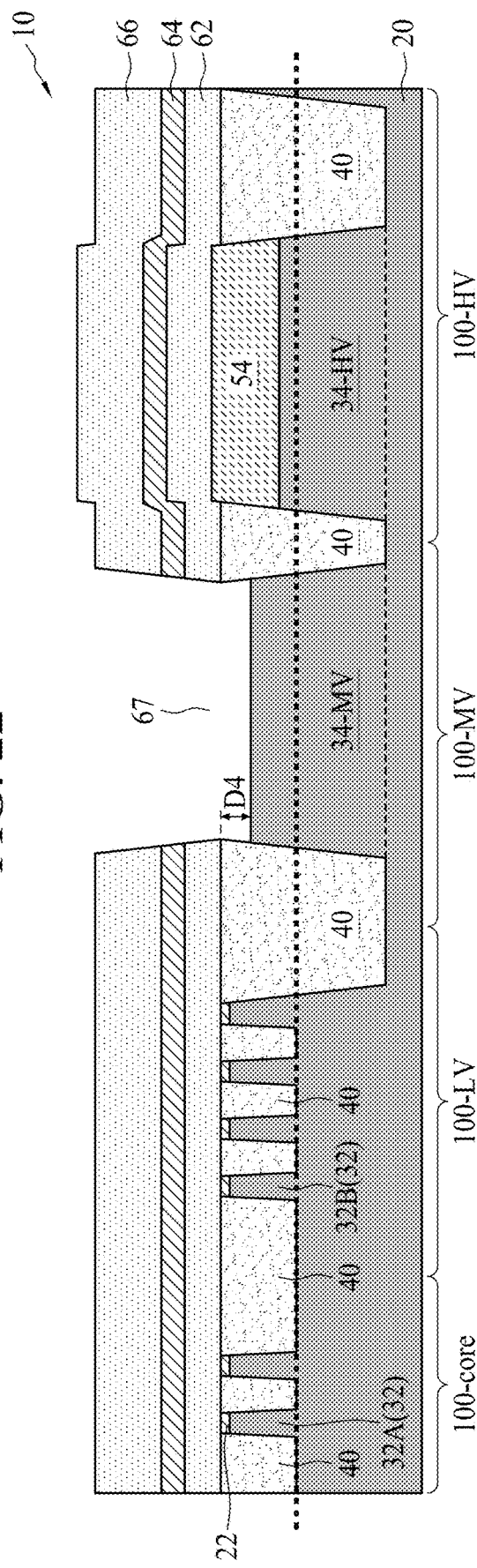

FIG. 23 illustrates the patterning of hard mask 62 and oxide layer 64 to form a recess 67, which is performed through a photolithography process using a patterned photoresist 66. Hard mask 62 and oxide layer 64 are etched using the patterned photoresist 66 as an etching mask, hence exposing a portion of oxide layer 22. Next, the exposed portion of oxide layer 22 is removed, followed by the recessing of mesa structure 34-MV through an etching process. The respective process is illustrated as process 230 in the process flow 200 as shown in FIG. 69. The etching may be performed through an anisotropic etching process. The recessing depth D4 of the recess 67 is smaller than recessing depth D3 of recess 52 (FIG. 17), and may be in the range between about 50 Å and about 200 Å. The recessing of mesa structure 34-MV may leave a space for the subsequently formed gate oxide of the MV transistor, so that the top surfaces of the gate oxides of the core transistor, the LV transistor, the MV transistor, and the HV transistor are coplanar. After the gate recessing process, photoresist 66 is removed. Oxide layer 64 may also be removed.

Figure 24:
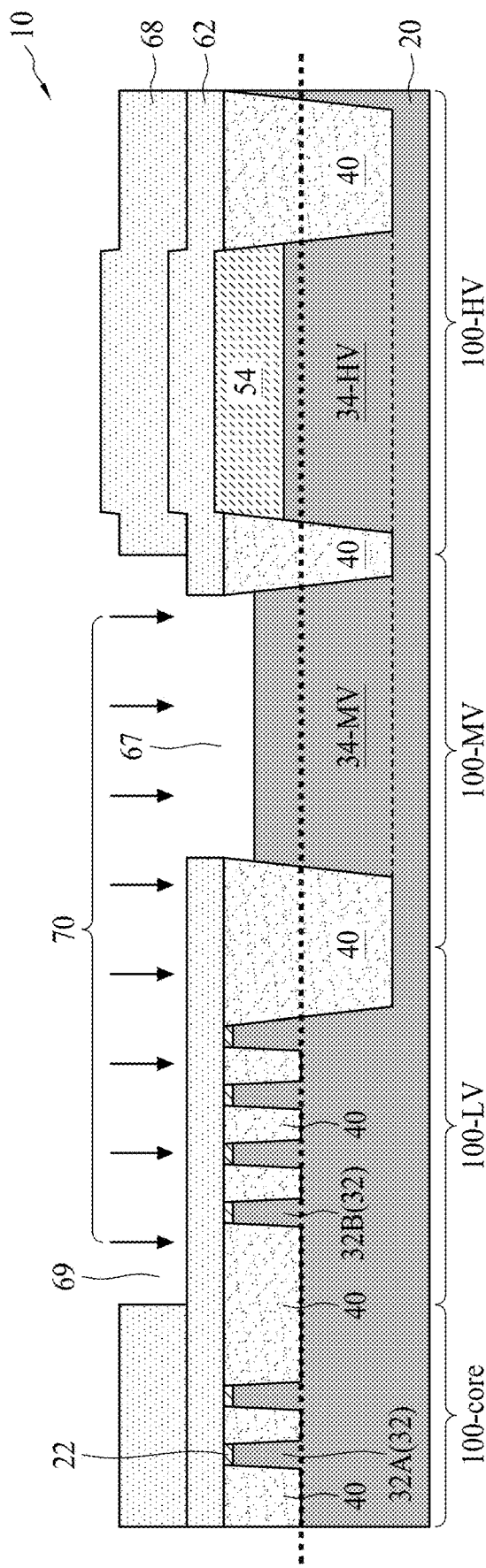

FIG. 24 illustrates the well implantation process (a second implantation process) for the MV transistor and the LV transistor. The respective process is illustrated as process 232 in the process flow 200 as shown in FIG. 69. First, a patterned implantation mask 68, which may include a photoresist, is formed. The opening 69 in implantation mask 68 may expand into both of device region 100-MV and device region 100-LV in accordance with some embodiments. An implantation process 70 is then performed to implant a p-type dopant or an n-type dopant to form a p-well region or an n-well region in both of device region 100-MV and device region 100-LV. The well regions are accordingly formed in both of the semiconductor strips 32B and mesa structure 34-MV by a common implantation process. In device region 100-LV, the implanted dopant penetrates through hard mask 62, while in device region 100-LV, the implanted dopant may be implanted without penetrating through hard mask 62. Accordingly, the well region in device region 100-MV is deeper than the well region in device region 100-LV. The dopant concentration in device region 100-MV may also be greater than in the well region in device region 100-LV.

With the well regions in device region 100-MV and device region 100-LV being formed in a same implantation process, the manufacturing cost is reduced. After the implantation processes, an anneal process may be performed. After the implantation process, implantation mask 68 is removed. A cleaning process may be performed to clean the opening 69 and recess 67.

Figure 25:
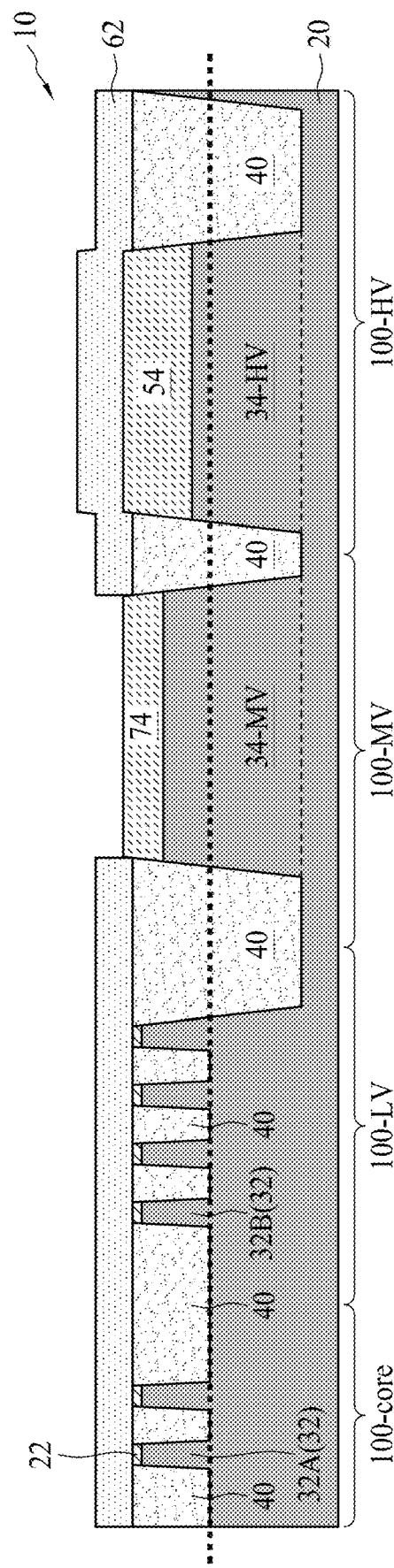
Figure 26:
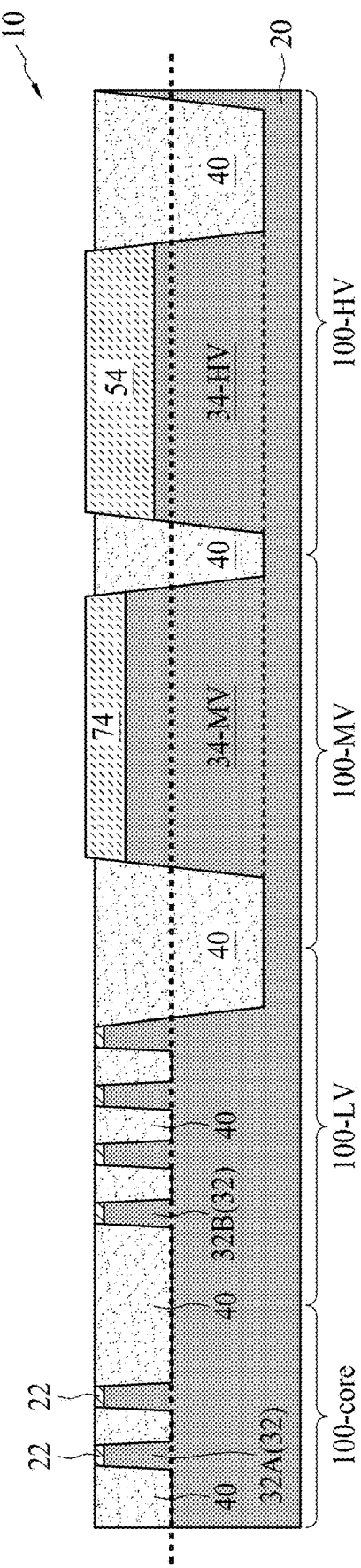

Next, as shown in FIG. 25, MV gate oxide 74 is deposited. The respective process is illustrated as process 234 in the process flow 200 as shown in FIG. 69. The deposition may be conducted through an ALD process, a CVD process, a PECVD process, or the like. The formation process and the material of MV gate oxide 74 may also be selected from the candidate processes and candidate materials of HV gate oxide 54. For example, MV gate oxide 74 may comprise silicon oxide. Hard mask 62 is then removed, and the resulting structure is shown in FIG. 26.

Figure 27:
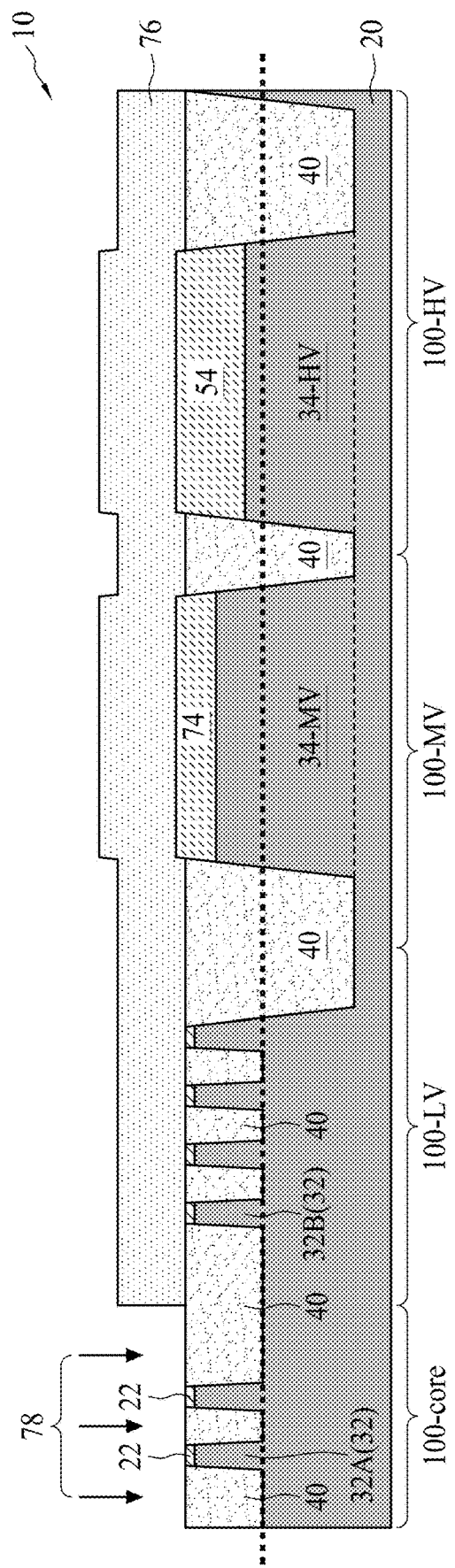

FIG. 27 illustrates the formation of the well region in device region 100-core. The respective process is illustrated as process 236 in the process flow 200 as shown in FIG. 69. In accordance with some embodiments, a patterned implantation mask 76, which may include a photoresist, is formed. An implantation process 78 is then performed to implant a p-type dopant or an n-type dopant to form a p-well region or an n-well region. It is appreciated that implantation mask 76 and implantation process 78 may represent the formation of both of p-well regions and n-well regions for the core transistors. For example, for a p-type core transistor, an n-well region is formed, and for an n-type core transistor, a p-well region formed. After the implantation process 78, the implantation mask 76 is removed. An anneal process may then be performed. The anneal process may be performed using a Rapid Anneal process (RTA), while other anneal processes may also be adopted.

Figure 28:
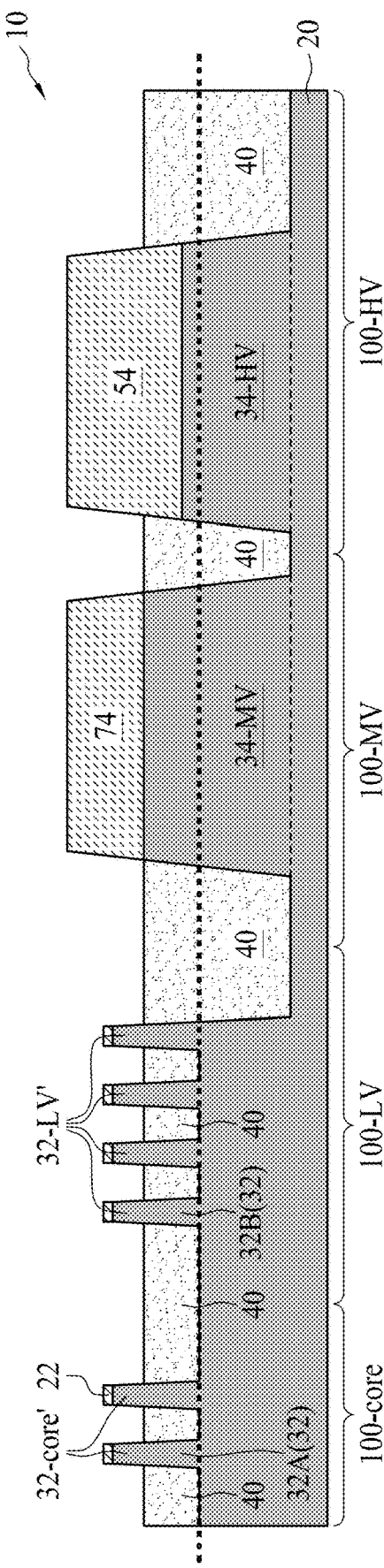

Next, STI regions 40 are recessed, and the resulting structure is shown in FIG. 28. The respective process is illustrated as process 238 in the process flow 200 as shown in FIG. 69. The top portions of semiconductor strips 32A and 32B protrude higher than the top surface of the remaining STI regions 40 to form protruding semiconductor fins 32-core' and 32-LV', respectively. In accordance with some embodiments of the present disclosure, the recessing of STI regions 40 is performed through a dry etch process, in which the process gases including $NH_3$ and HF, for example, are used. In accordance with alternative embodiments of the present disclosure, the recessing of STI regions 40 is performed using a wet etch process, in which the etchant solution such as a dilution HF solution may be used.

Since MV gate oxide 74 and HV gate oxide 54 are formed on the recessed mesa structures 34-MV and 34-HV, respectively, after the recessing of STI regions 40, the bottom surfaces of MV gate oxide 74 may remain to be higher than, lower than, or level with the top surfaces of the surrounding STI regions 40. The bottom surface of HV gate oxide 54 may be lower than the top surfaces of the surrounding STI regions 40.

Figure 29:
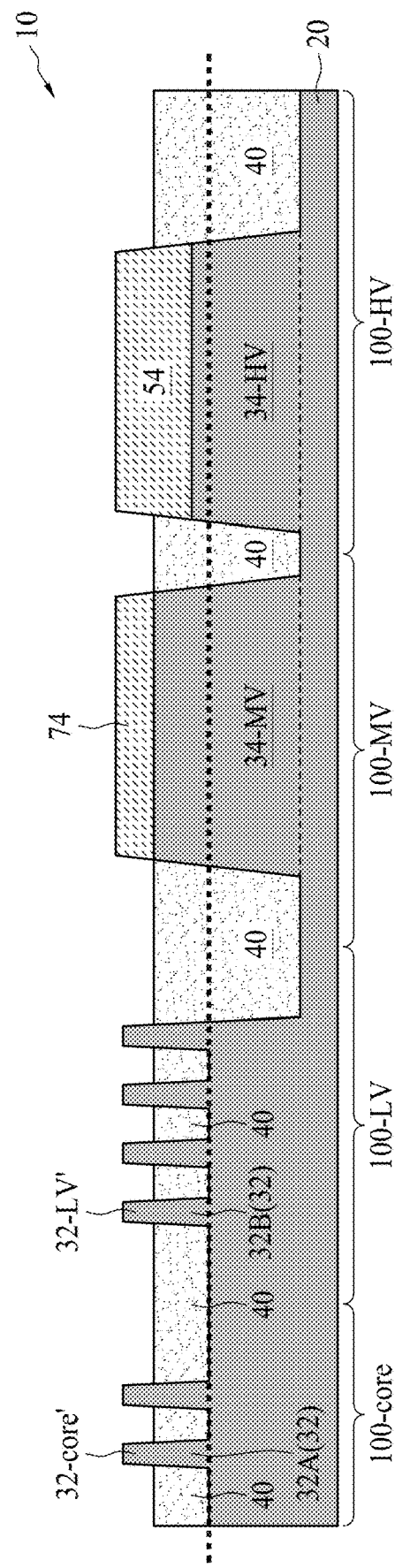

The oxide layer 22 on tops of protruding semiconductor fins 32-core' and 32-LV' are then removed, for example, in an anisotropic etching process or an isotropic etching process. The resulting structure is shown in FIG. 29. In accordance with some embodiments, MV gate oxide 74 and HV gate oxide 54 are thinned due to their similarity in material to materials of oxide layer 22.

Figure 30:
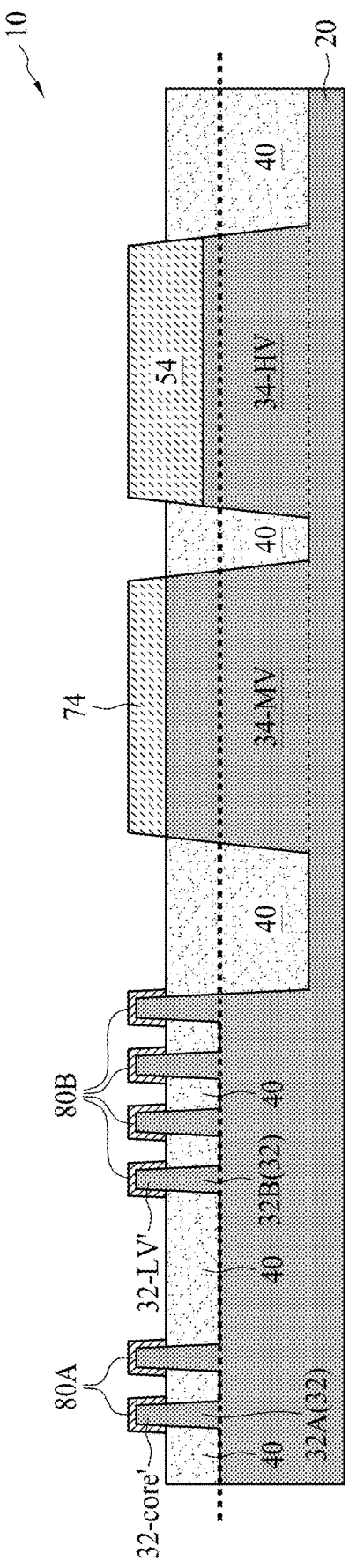

Referring to FIG. 30, dummy gate dielectrics 80A and 80B are formed on protruding semiconductor fins 32-core' and 32-LV', respectively. The respective process is illustrated as process 240 in the process flow 200 as shown in FIG. 69. Dummy gate dielectrics 80A and 80B may be formed through thermal oxidation, chemical oxidation, or a deposition process, and may be formed of or comprise, for example, silicon oxide. Dummy gate dielectrics 80A and 80B include horizontal portions on the top surfaces and sidewalls of semiconductor fins 32-core' and 32-LV', and may extend on STI regions 40 when formed through deposition. Otherwise, when dummy gate dielectrics 80A and 80B are formed through oxidation, dummy gate dielectrics 80A and 80B are formed on the surfaces of protruding fins 32-core' and 32-LV', and do not include horizontal portions on STI regions 40.

Figure 31A:
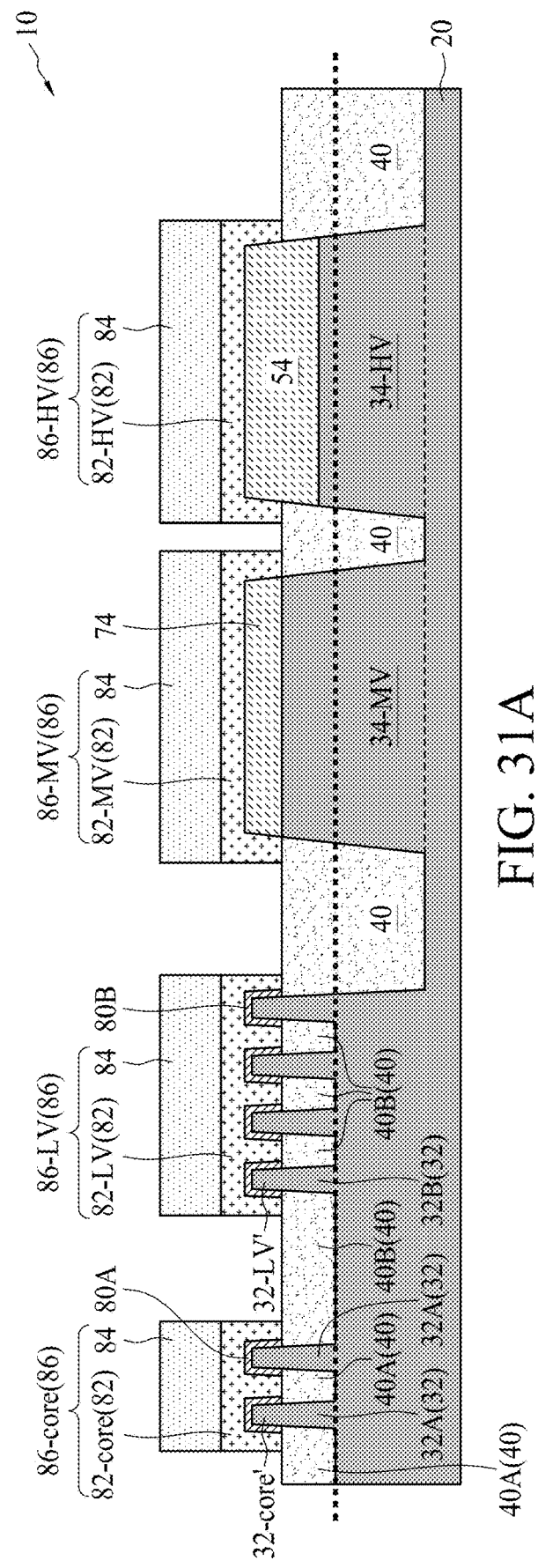

FIG. 31A illustrates the formation of gate electrodes 82 (including 82-core, 82-LV, 82-MV, and 82-HV), which may be dummy gate electrodes in accordance with some embodiments, or may be used as the actual gate electrodes. The respective process is illustrated as process 242 in the process flow 200 as shown in FIG. 69. Gate electrodes 82 may be formed of or comprise polysilicon or amorphous silicon or other applicable materials. Hard masks 84 are also formed. Hard masks 84 may comprise silicon oxide, silicon nitride, silicon oxynitride, or the like, and may be formed as a single layer or a multi-layer. For example, each of hard mask 84 may include a silicon nitride layer and an oxide layer over the silicon nitride layer. In accordance with some embodiments, the formation process comprises depositing a blanket gate electrode layer(s), planarizing the top surface of the blanket gate electrode layer(s), depositing blanket hard masks, and patterning the deposited layers. Throughout the description, the gate dielectrics, gate electrodes, and the hard masks are collectively referred to as gate stacks 86, which includes gate stacks 86-*core*, 86-LV, 86-MV, and 86-HV.

Figure 31B:
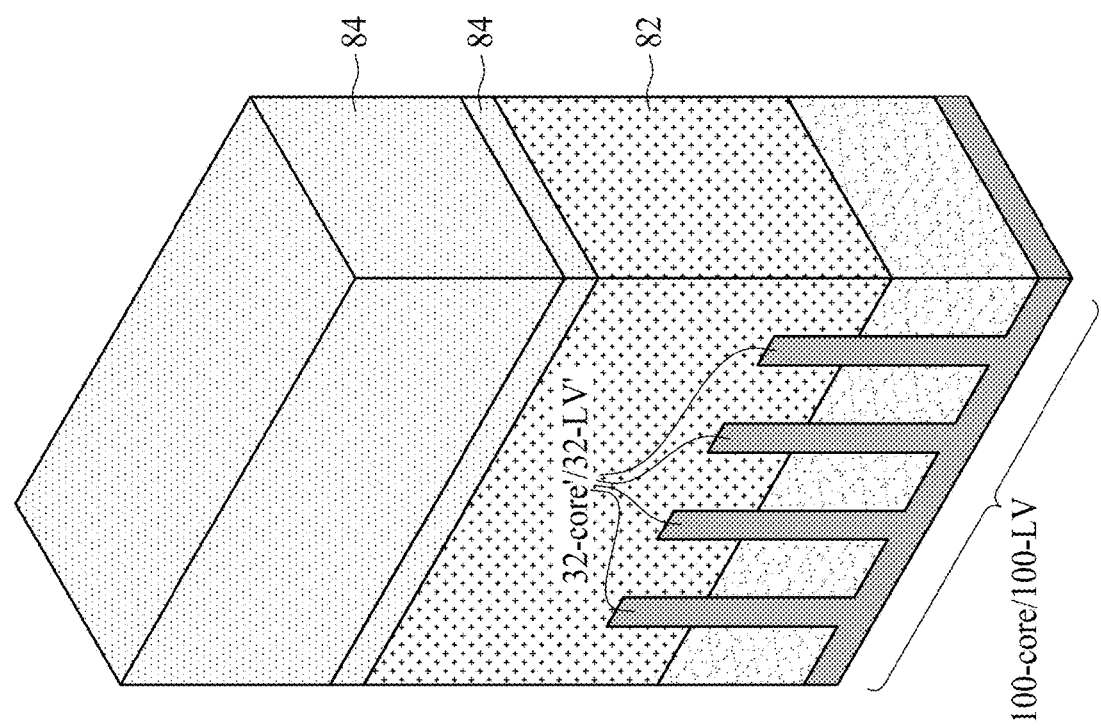

FIG. 31B illustrates a perspective view of a portion of the structure in device region 100-*core* or device region 100-LV in accordance with some embodiments, wherein protruding semiconductor fins 32-*core*' or 32-LV', gate electrodes 82, and hard mask 84 are illustrated as an example.

In subsequent processes, additional features (not shown) are formed. These additional features may be found in subsequent discussion of each of the core transistor, LV transistor, MV transistor, and HV transistor. For example, gate spacers are formed on the sidewalls of gate stacks 86. Source/drain regions (not shown) are formed on opposing sides of each of gate stacks 86-*core*, 86-LV, 86-MV, and 86-HV. The respective process is illustrated as process 244 in the process flow 200 as shown in FIG. 69. The formation processes are shown in detail in subsequent Figures.

Figure 32:
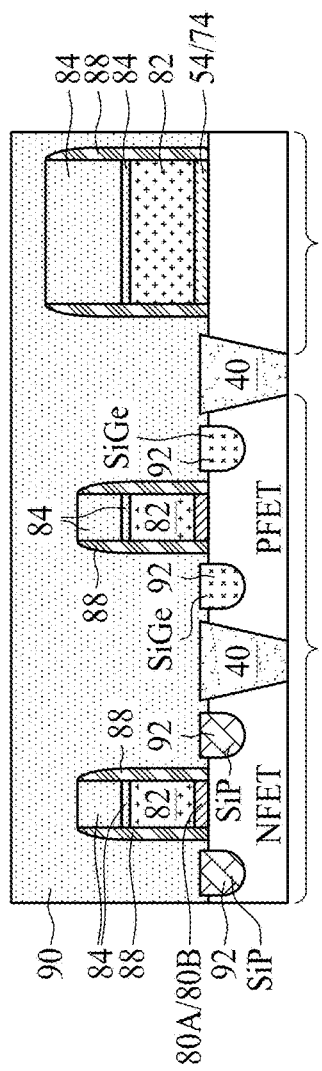

In accordance with some embodiments, after the formation of gate spacers and source/drain regions, hard masks 84 are removed in order to form replacement gate stacks. Referring to FIG. 32, device region 100-*core* and/or 100-LV (denoted as device region 100-*core*/100-LV) and device region 100-MV and/or 100-HV (denoted as 100-MV/100-LV) are shown. Also, gate spacers 88 and source/drain regions 92 are formed. In device region 100-*core*/100-LV, an NFET and a PFET are illustrated, whose source/drain regions may comprise SiP and SiGe, respectively. A sacrificial layer 90, which may be formed of photoresist or another material that is different from the materials of gate spacers 88 and hard masks 84, is formed.

Figure 33:
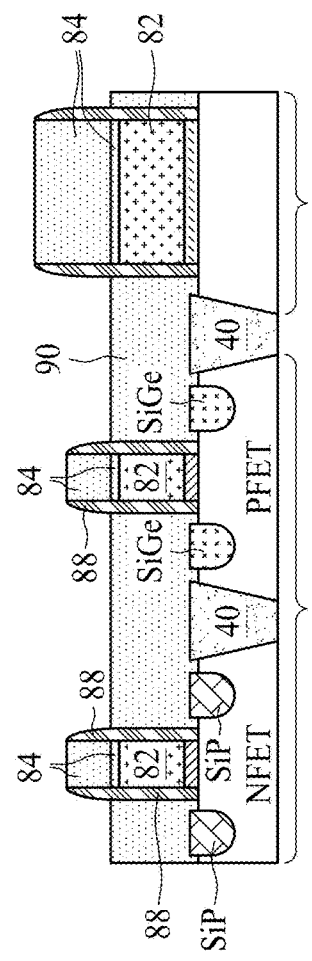

Next, as shown in FIG. 33, sacrificial layer 90 is recessed to have its top surface level with or substantially level with the top surfaces of gate electrodes 82. The hard masks 84 are then removed, and the top portions of gate spacers 88 are also removed, while the lower portions of the gate spacers 88 are protected by sacrificial layer 90. The respective process is illustrated as process 246 in the process flow 200 as shown in FIG. 69. In a subsequent process, sacrificial layer 90 is removed, revealing source/drain regions 92. The resulting structure is shown in FIG. 34.

Figure 34:
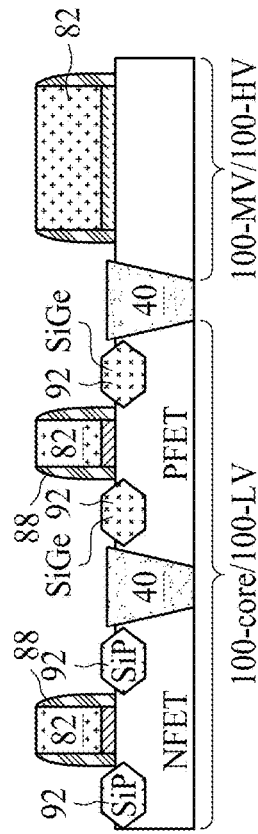

FIGS. 32, 33, and 34 illustrate an embodiment in which hard masks 84 are removed through etching, and are formed before the formation of Contact Etch Stop Layer (CESL) and Inter-Layer Dielectric (ILD). In accordance with alternative embodiments, hard masks 84 may be removed after the formation of the CESL and the ILD, and may be removed through a CMP process.

Figure 35:
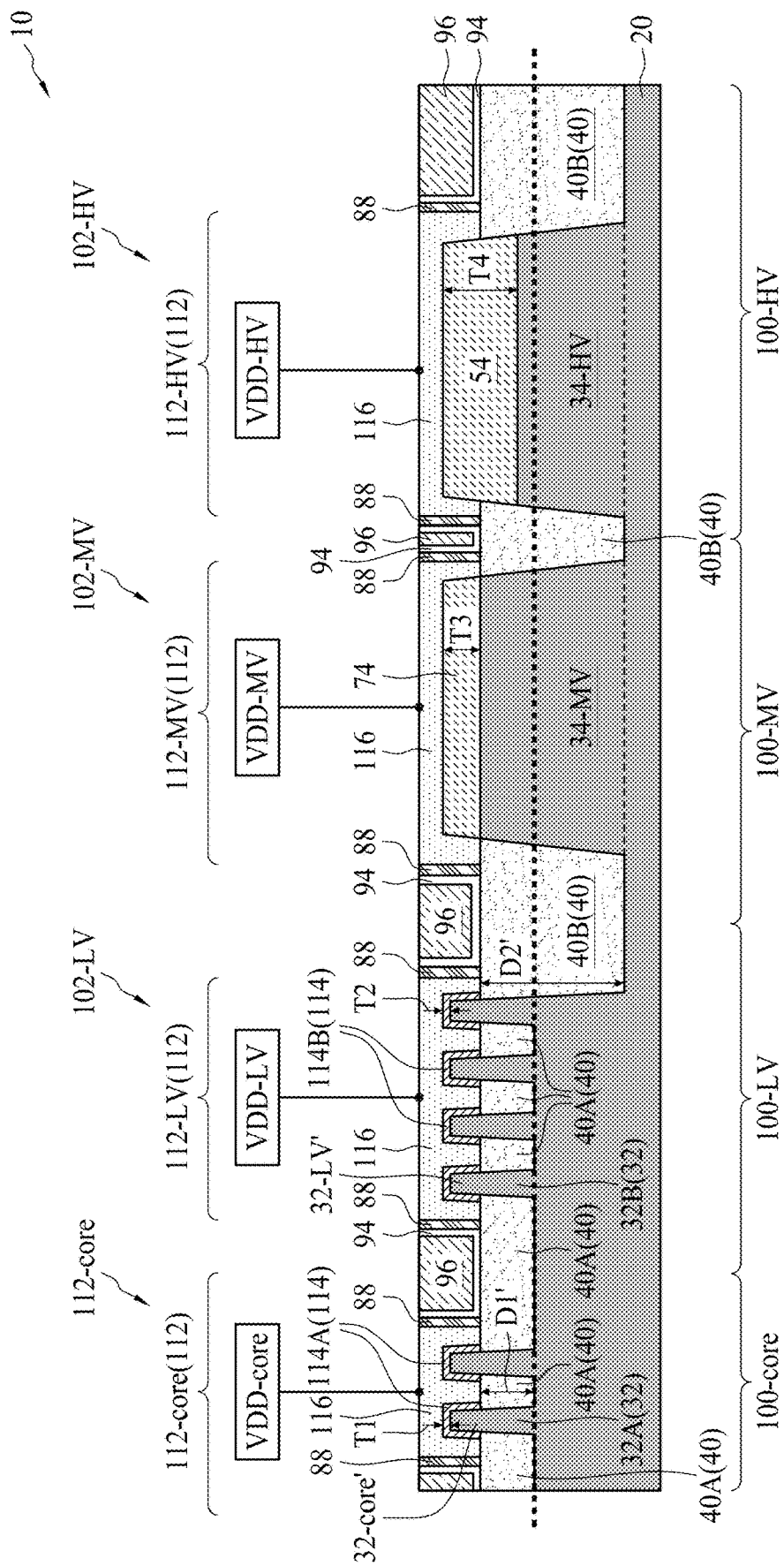

In subsequent processes, replacement gate stacks are formed, and the resulting structure is shown in FIG. 35. The respective process is illustrated as process 248 in the process flow 200 as shown in FIG. 69. Dielectric plugs may also be formed, and the formation processes of the replacement gate stacks and dielectric plugs are shown in FIGS. 49 through 55. Power supply voltages VDD-core, VDD-LV, VDD-MV, and VDD-HV, which may be increasingly higher, are connected to transistors 102-*core*, 102-LV, 102-MV, and 102-HV, respectively, as schematically illustrated in FIG. 35. Depending on the usage, the power supply voltages may be provided to the gate electrode, source regions, or drain regions of the transistors.

The structure as shown in FIG. 35 is discussed briefly herein, and the detailed formation process of the replacement gate stacks may be found referring to FIGS. 49-55. As shown in FIG. 35, CESL 94 and ILD 96 are formed. In accordance with some embodiments of the present disclosure, CESL 94 is formed of silicon nitride, silicon carbonitride, or the like. CESL 94 may be formed through a conformal deposition process such as ALD or CVD, for example. ILD 96 is formed on CESL 94, and may be formed using, for example, FCVD, spin-on coating, CVD, or the like. ILD 96 may be formed of Phospho-Silicate Glass (PSG), Boro-Silicate Glass (BSG), Boron-Doped Phospho-Silicate Glass (BPSG), silicon oxide, or the like. A planarization process such as a Chemical Mechanical Polish (CMP) process or a mechanical grinding process may be performed to level the top surfaces of CESL 94, ILD 96, replacement gate stacks, and gate spacers 88 with each other.

Some of the gate electrodes 82 (include 82-*core*, 82-LV, 82-MV and 82-HV) or the entire gate stacks 86 as shown in FIGS. 31A and 35 may be replaced with replacement gate electrodes or replacement gate stacks, which are shown as replacement gate stacks 112 in FIG. 35. An example formation process of the replacement gate electrodes for the MV transistor and the HV transistor is also discussed referring to FIGS. 49 through 55. Core transistor 102-*core*, LV transistor 102-LV, MV transistor 102-MV, and HV transistor 102-HV are thus formed.

As shown in FIG. 35, the STI regions 40A surrounding core transistor 102-*core*, LV transistor 102-LV have depth D1'. The STI regions 40B surrounding MV transistor 102-MV and HV transistor 102-HV have depth D2', which is greater than depth D1'. In accordance with some embodiments, depth D1' is in the range between about 1,000 Å and about 1,400 Å, and depth D2' is in the range between about 3,300 Å and about 3,900 Å. Also, the gate dielectrics of core transistor 102-*core*, LV transistor 102-LV, MV transistor 102-MV, and HV transistor 102-HV are increasingly thicker. For example, the thickness T1 of the gate dielectrics 114A of the core transistor 102-*core* may be smaller than about 8 Å. The thickness T2 of the gate dielectrics 114B of the LV transistor 102-LV may be in the range between about 12 Å and about 66 Å. The thickness T3 of the gate dielectrics 74 of the MV transistor 102-MV may be in the range between about 100 Å and about 300 Å. The thickness T4 of the gate dielectrics 54 of the HV transistor 102-HV may be in the range between about 750 Å and about 1,200 Å.

Also, the chip area occupied by core transistor 102-*core*, LV transistor 102-LV, MV transistor 102-MV, and HV transistor 102-HV may be increasingly larger. For example, the chip area of the core transistor 102-*core* may be smaller than about 1 μm×1 μm. The chip area the LV transistor 102-LV may be smaller than about 2 μm×2 μm. The chip area the MV transistor 102-MV may be smaller than about 10 μm×10 μm. The chip area the LV transistor 102-LV may be smaller than about 28 μm×28 μm.

FIGS. 36A, 36B, 36C, 37A, 37B, and 37C illustrate some top views and cross-sectional views of intermediate stages in the formation of core transistor 102-*core* and/or LV transistor 102-LV (referred to as 102-*core*/102-LV) in accordance with some embodiments. The illustrated transistor 102-*core*/102-LV has a symmetric structure. It is appreciated that gate spacers, CESL, ILD, and the like may have also been formed, while these features are not shown in these Figures.

Figure 36A:
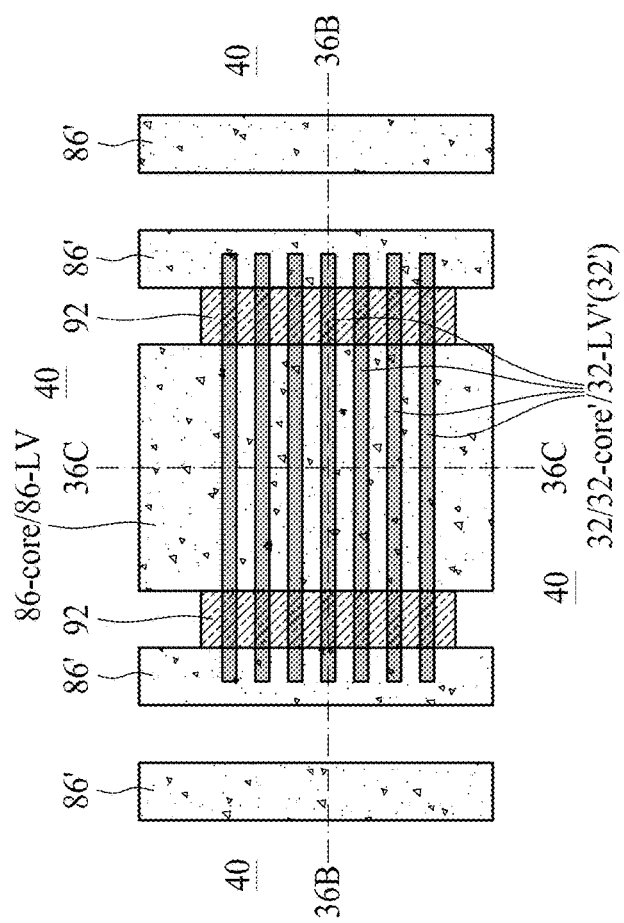
Figure 36C:
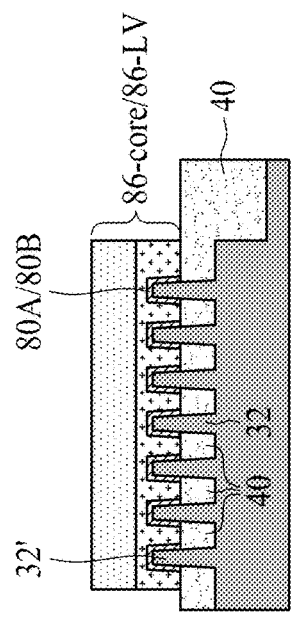
Figure 36B:
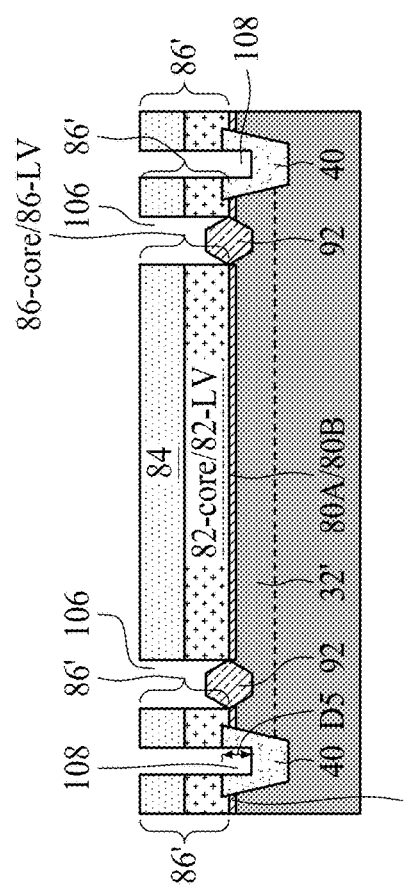

FIG. 36A illustrates a top view. FIG. 36B illustrates the cross-section 36B-36B in FIG. 36A, and FIG. 36C illustrates the cross-section 36C-36C in FIG. 36A. Referring to FIG. 36A, a plurality of protruding semiconductor fins 32-*core*'/ 32-LV' are formed, which represent either protruding semiconductor fins 32-*core*' or protruding semiconductor fins 32-LV'. The semiconductor strips 32 underlying the protruding semiconductor fins 32' are also illustrated. Gate stack 86-*core*/86-LV, which may be a dummy gate stack, crosses over the plurality of protruding semiconductor fins 32'. Source and drain regions 92 are formed on the opposite sides of gate stack 86-*core*/86-LV. STI regions 40 are formed around the illustrated features.

A plurality of dummy strips 86', which are formed in the same processes as for forming gate stack 86, are formed adjacent to gate stack 86-*core*/86-LV. In accordance with some embodiments, the plurality of dummy strips 86' are formed as a plurality of parallel strips, which may have lengthwise directions perpendicular to the lengthwise directions of the protruding semiconductor fins 32'. Dummy strips 86' may extend directly over protruding semiconductor fins 32' and/or STI regions 40.

Referring to FIG. 36B, contact openings 106 are formed, which extend into the CESL 94 (FIG. 35) and ILD 96, which are formed on the opposite sides of gate stack 86-*core*/86-LV and dummy strips 86'. Source/drain regions 92 are revealed through contact openings 106. Also, as shown in FIG. 36B, in the patterning process of the dummy gate electrode layer and hard mask layers for forming the dummy gate stack 86-*core*/86-LV and dummy strips 86', STI regions 40 may also be recessed to form recesses 108. It is appreciated that although the top surfaces of the illustrate STI regions 40 may be level with the bottom of protruding semiconductor fins 32', although they are shown as being higher. The dummy strips 86' extending on STI regions 40 may have sidewalls flush with the edges of recesses 108. Furthermore, dummy strips 86' may further extend on the joining protruding semiconductor fins 32'. Furthermore, some of gate dielectrics 80A/80B may separate the dummy strips 86' from the protruding semiconductor fins 32'. Referring to FIG. 36C, gate stack 86-*core*/86-LV extends on the sidewalls and the top surfaces of protruding semiconductor fins 32'.

FIGS. 37A, 37B, and 37C illustrate the formation of contact plugs in accordance with some embodiments. FIG. 37A illustrates a top view. FIG. 37B illustrates the cross-section 37B-37B in FIG. 37A, and FIG. 37C illustrates the cross-section 37C-37C in FIG. 37A.

The dummy gate stack 86-*core*/86-LV in FIG. 36A is replaced with replacement gate stack 112-*core*/112-LV as shown in FIGS. 37A, 37B, and 37C, wherein replacement gate stack 112-*core* represents the replacement gate stack of the core transistor 102-*core*, and replacement gate stack 112-LV represents the replacement gate stack of the LV transistor 102-LV. Replacement gate stack 112-*core*/112-LV crosses over the plurality of protruding semiconductor fins 32'. In accordance with some embodiments, the replacement gate stack 112-*core*/112-LV includes a replacement gate dielectric 114 and a replacement gate electrode 116 over replacement gate dielectric 114. Replacement gate dielectric 114 may include an interfacial layer, which may be an oxide layer, and a high-k dielectric layer over the interfacial layer. Replacement gate electrode 116 may include a metal gate electrode, and the metal is selected depending on whether the transistor 102-*core*/102-LV is a p-type or an n-type transistor. For example, when the transistor 102-*core*/102-LV is a p-type transistor, metal gate electrode 116 may include a TiN layer as its work-function layer. When the device region 200 is an n-type device region, metal gate electrode 116 may include an aluminum-containing metal layer (such as TiAl, TiAlC, TiAlN, or the like) as its work-function layer. Gate electrode 116 may also include tungsten, cobalt, or the like.

FIGS. 37A and 37B also illustrate dummy strips 87. In accordance with some embodiments, dummy strips 87 are formed by replacing the dummy strips 86' (FIGS. 36A and 36B) when the dummy gate stack is replaced with the replacement gate stack 112-*core*/112-LV. Accordingly, dummy strips 87 have the same structure and material(s) as replacement gate stack 112-*core*/112-LV. In accordance with alternative embodiments, the dummy strips 86' in FIGS. 36A and 36B are not replaced, and accordingly, dummy strips 87 in FIGS. 37A and 37B are the dummy strips 86' in FIGS. 36A and 36B, and may include polysilicon. In accordance with some embodiments, in the final structure, dummy strips 87 are electrically floating.

As shown in FIG. 37B, source/drain contact plugs 118 are formed to connect to source/drain regions 92. Silicide regions (not shown) may be formed between source/drain contact plugs 118 and source/drain regions 92. Vias and metal lines such as the vias in via layer V0 and the metal lines in metal layer M1 are also formed to electrically connect to the source/drain contact plugs 118.

As shown in FIG. 37C, gate contact plug 120 is formed over and electrically connecting to replacement gate stack 112-*core*/112-LV. Vias and metal lines such as the vias in via layer V0 and the metal lines in metal layer M1 are also formed to electrically connect to gate contact plug 120.

Figure 38:
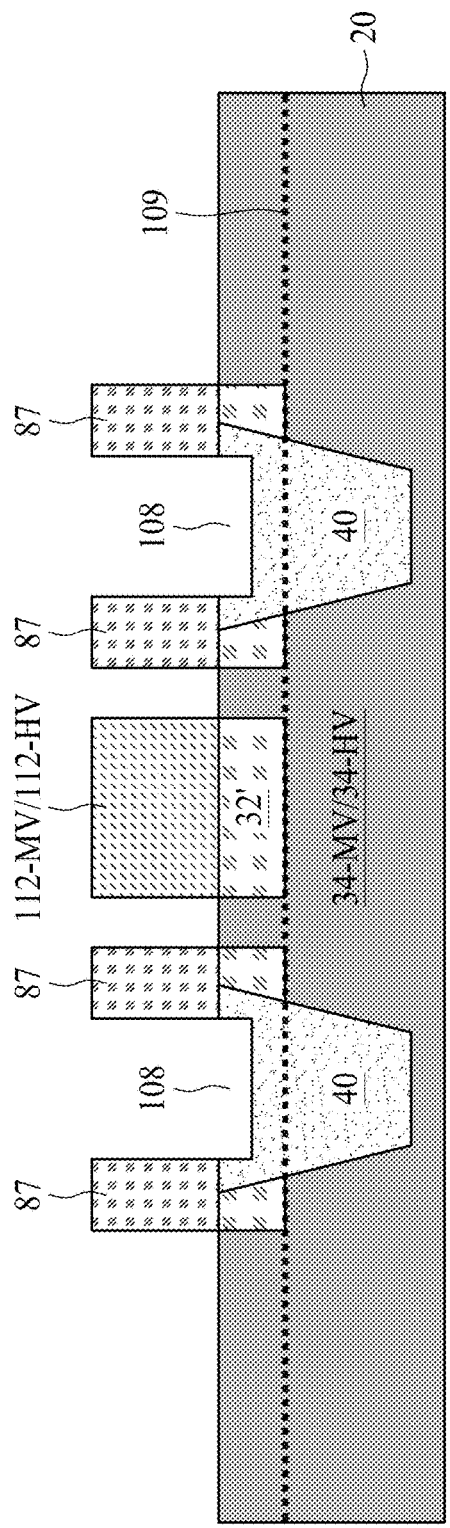
Figure 39:
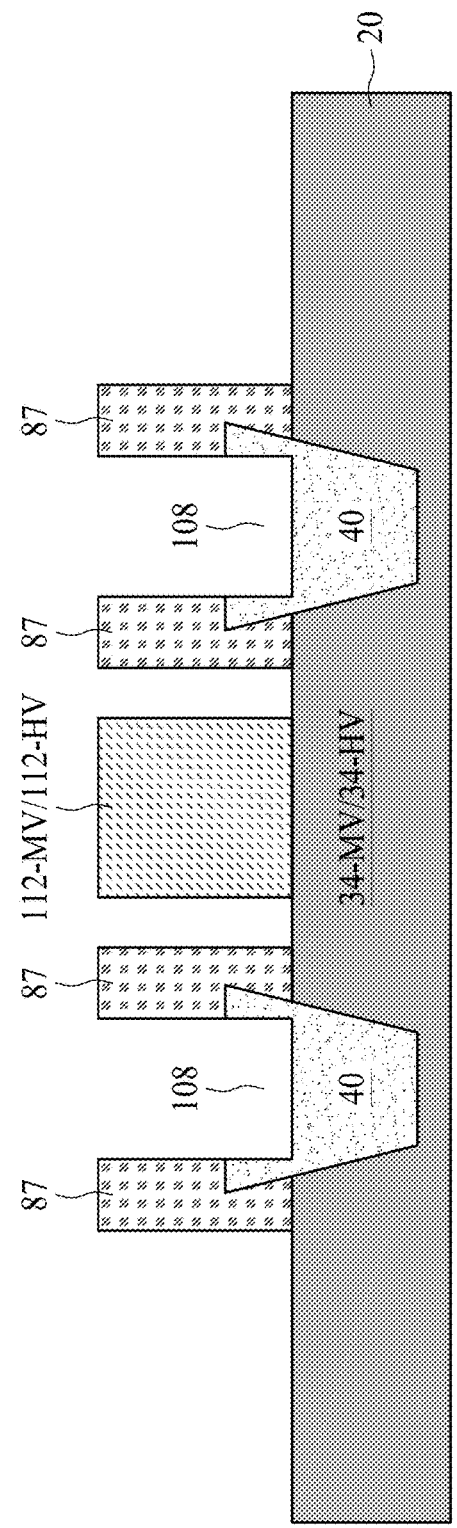

FIGS. 38 and 39 illustrate some examples of the relative heights of the STI regions 40, mesa structures 34-MV/34-HV, and dummy strips 87 in accordance with some embodiments. Referring to FIG. 38, the mesa structure 34-MV/34-HV between two STI regions 40 are partially recessed, and replacement gate stack 112-MV/112-HV (which include gate oxides 54/74) extend into mesa structure 34-MV/34-HV. In FIG. 39, all of the mesa structure 34-MV/34-HV between two STI regions 40 are recessed.

FIGS. 40A, 40B, 40C, 41A, 41B, and 41C illustrate some top views and cross-sectional views of intermediate stages in the formation of MV transistor 102-MV in accordance with some embodiments. The illustrated transistor 102-MV has a symmetric structure. FIGS. 40A, 40B, and 40C illustrate the formation of source/drain regions 92 and contact openings in accordance with some embodiments. It is appreciated that gate spacers, CESL, ILD, and the like may have also been formed, while these features are not shown in these Figures. FIG. 40A illustrates a top view. FIG. 40B illustrates the cross-section 40B-40B in FIG. 40A, and FIG. 40C illustrates the cross-section 40C-40C in FIG. 40A.

Referring to FIG. 40A, mesa structure 34-MV is formed. Gate stack 86-MV, which is a dummy gate stack, crosses over mesa structure 34-MV. Source and drain regions 92 are formed on the opposite sides of gate stack 86-MV. STI regions 40 are formed around the illustrated features.

A plurality of dummy strips 86', which are formed in the same processes as forming gate stack 86-MV, are formed adjacent to gate stack 86-MV. In accordance with some embodiments, the plurality of dummy strips 86' are formed as a plurality of parallel strips, which are parallel to each other. Dummy strips 86' may extend directly over mesa structure 34-MV and/or STI regions 40.

Referring to FIG. 40B, contact openings 106 are formed, which extend into the CESL 94 (FIG. 35) and ILD 96, which are not shown in FIG. 40B. Source/drain regions 92 are revealed through contact openings 106. Also, STI regions 40 may also be recessed to form recesses 108, and the recesses 108 may have sidewalls flush with the edges of dummy strips 86'. Referring to FIG. 40C, gate dielectric 74 and dummy gate stack 86 extend on top of mesa structure 34-MV.

FIGS. 41A, 41B, and 41C illustrate the formation of contact plugs in accordance with some embodiments. FIG. 41A illustrates a top view. FIG. 41B illustrates the cross-section 41B-41B in FIG. 41A, and FIG. 41C illustrates the cross-section 41C-41C in FIG. 41A. In accordance with some embodiments, the gate electrode 82-MV in FIG. 40A is replaced with replacement gate electrode 116-MV to form replacement gate stack 112-MV. In accordance with alternative embodiments, the gate electrode 82-MV (which comprise polysilicon) in FIG. 41A is not replaced, and is used as the actual gate electrode. Gate dielectric 74, on the other hand, is kept un-replaced, and is used as the final gate dielectric of the MV transistor 102-MV. In accordance with some embodiments, the replacement gate electrode 116-MV is a metal gate electrode, and the metal is selected depending on whether the transistor 102-MV is a p-type or an n-type transistor. The materials of the replacement gate electrode 116-MV may be similar to that of the metal gates of transistor 102-core/102-LV, as shown in FIG. 37B.

FIGS. 41A and 41B also illustrate dummy strips 87. In accordance with some embodiments, dummy strips 87 are formed by replacing the dummy strips 86' (FIGS. 40A and 40B) when the dummy gate electrode 86 is replaced with the replacement gate electrode 116-MV. Accordingly, dummy strips 87 have the same structure and material(s) as replacement gate electrode 116-MV. In accordance with alternative embodiments, the dummy strips 86' in FIGS. 40A and 40B are not replaced, and accordingly, dummy strips 87 in FIGS. 41A and 41B are dummy strips 86', and may include polysilicon.

FIGS. 41A, 41B, and 41C also illustrate the formation of source/drain contact plugs 118 to connect to source/drain regions 92. Silicide regions (not shown) may be formed between source/drain contact plugs 118 and source/drain regions 92. As shown in FIG. 41C, gate contact plug 120 is formed over and electrically connecting to replacement gate electrode 116-MV. Vias and metal lines such as the vias in via layer V0 and the metal lines in metal layer M1 are also formed to electrically connect to source/drain regions 118 and gate contact plug 120.

Figure 42A:
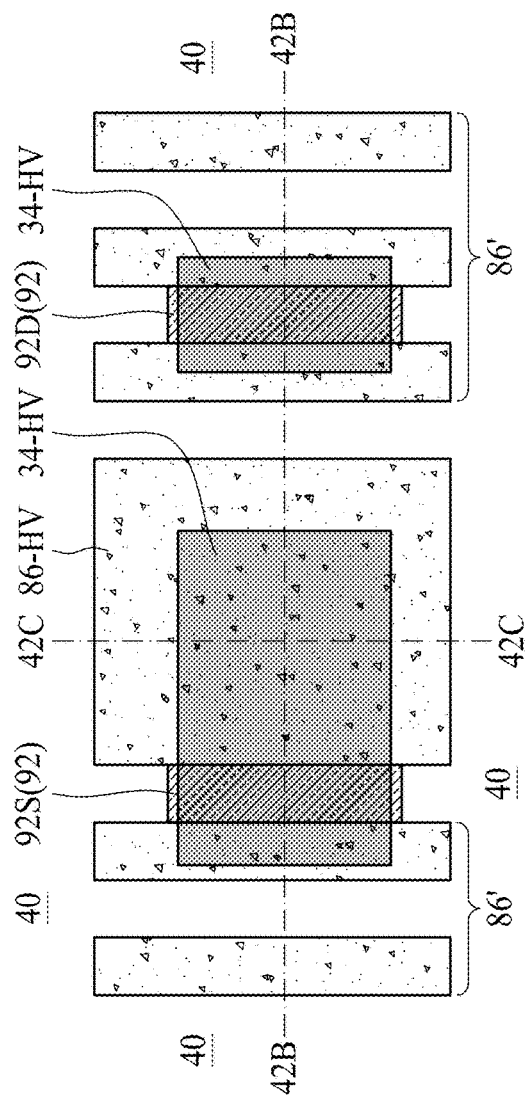
Figure 42B:
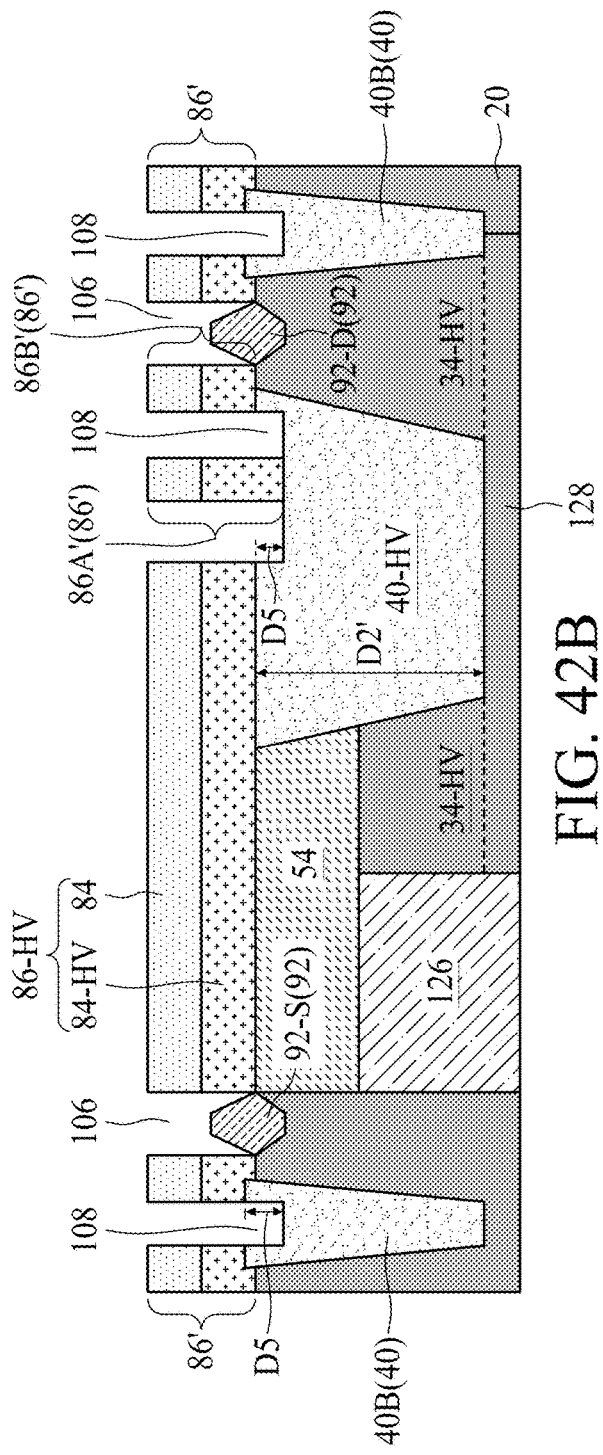
Figure 42C:
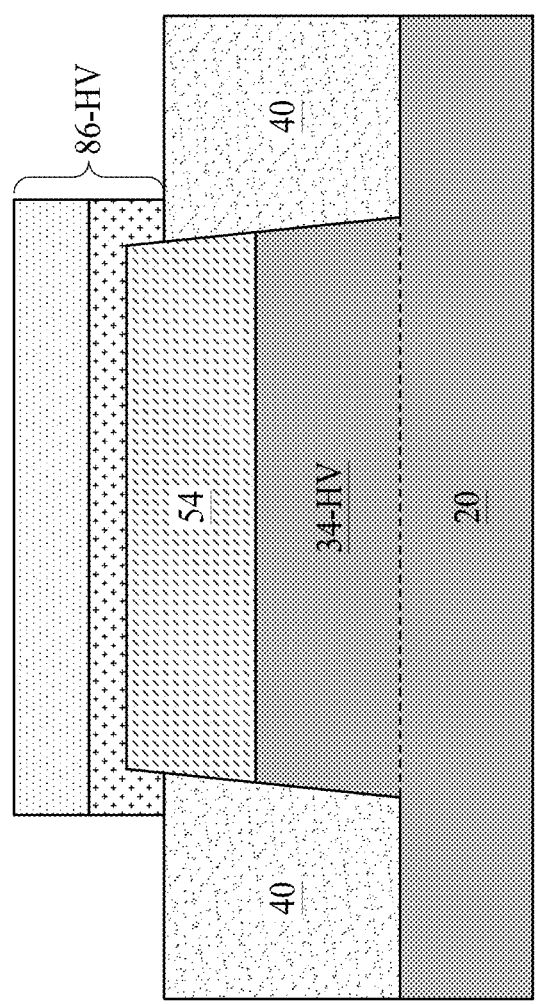

FIGS. 42A, 42B, 42C, 43A, 43B, and 43C illustrate some top views and cross-sectional views of intermediate stages in the formation of HV transistor 102-HV in accordance with some embodiments. FIGS. 42A, 42B, and 42C illustrate the formation of source/drain regions and contact openings in accordance with some embodiments. It is appreciated that gate spacers, CESL, ILD, and the like may have also been formed, while these features are not shown in the Figures. FIG. 42A illustrates a top view. FIG. 42B illustrates the cross-section 42B-42B in FIG. 42A, and FIG. 42C illustrates the cross-section 42C-42C in FIG. 42A.

Referring to FIG. 42A, mesa structure 34-HV is formed. Gate stack 86-HV, which may be a dummy gate stack, crosses over 34-HV (FIG. 42B). Source and drain regions 92 are on the opposite sides of gate stack 86-HV. STI regions 40 are formed around HV transistor 102-HV.

A plurality of dummy strips 86', which are formed in the same processes as forming gate stacks 86-HV, 86MV, 86-LV, and 86-*core*, are formed adjacent to gate stack 86-HV. In accordance with some embodiments, the plurality of dummy strips 86' are formed as a plurality of parallel strips, which are parallel to each other. Dummy strips 86' may extend directly over mesa structure 34-HV and/or STI regions 40. One of the dummy strips 86' (marked as 86A' in FIG. 42B), which is directly over the STI region 40-HV, is shown as being dashed to indicate this dummy strip 86' may be, or may not be, formed.

Referring to FIG. 42B, contact openings 106 are formed, which extend into the CESL 94 (FIG. 35) and ILD 96, which are not shown in FIG. 42B. Source/drain regions 92 (including source region 92S and drain region 92D) are revealed through contact openings 106. Also, STI regions 40 may also be recessed to form recesses 108, and the recesses 108 may have sidewalls flush with the edges of dummy strips 86'. In accordance with some embodiments, the depths D5 of recesses 108 as shown in FIGS. 42B, 40B, and 36B may be greater than about the thickness of dummy gate dielectric 80A (FIG. 36B), and may also be greater than, equal to, or smaller than the thickness of gate dielectric 74 (FIG. 40B). Depth D5 may also be smaller than the thickness of gate dielectric 54 (FIG. 42B).

Referring to FIG. 42B, mesa structure 34-HV includes a first high-voltage well (HVW) region 126 of a first conductivity type, and a second HVW region 128 of a second conductivity type opposite to the first conductivity type. The first conductivity type may be p-type or n-type. Source region 92S may be formed next to gate dielectric 54. STI region 40-HV extends partially underlying dummy gate electrode 82-HV. STI region 40-HV may be formed in the same formation process, and thus has the same depth as, other STI regions 40B. For example, depth D2' may be in the range between about 3,000 Å and about 3,900 Å. STI region 40-HV has the function of increasing the operation voltage of the corresponding HV transistor 102-HV (FIG. 43B). In accordance with some embodiments, one of dummy strips 86' (marked as dummy 86B') partially overlaps STI region 40-HV, and separates STI region 40-HV from drain region 92D. Another one of dummy strips 86' (marked as dummy 86A') may be formed directly over STI region 40-HV. Dummy strip 86A' may be or may not be formed, and hence is illustrated using dashed lines. FIG. 42C illustrates that gate dielectric 54 extends on top of mesa structure 34-HV.

FIGS. 43A, 43B, and 43C illustrate the formation of contact plugs in accordance with some embodiments. FIG. 43A illustrates a top view. FIG. 43B illustrates the cross-section 43B-43B in FIG. 43A, and FIG. 43C illustrates the cross-section 43C-43C in FIG. 43A.

In accordance with some embodiments, the gate electrode 82-HV in FIG. 42B is replaced with replacement gate electrode 116-HV. In accordance with alternative embodiments, the gate electrode 82-HV (which comprise polysilicon) in FIG. 42A is not replaced, and is used as the final gate electrode. Gate dielectric 54, on the other hand, is kept un-replaced, and is used as the final gate dielectric of the HV transistor 102-HV. In accordance with some embodiments, the replacement gate electrode 116-HV is a metal gate electrode, and the metal is selected depending on whether the transistor 102-HV is a p-type or an n-type transistor. The materials of replacement gate electrode 116-HV may be similar to that of the metal gates of transistor 102-*core*/102-LV (as shown in FIG. 37B) and the metal gate of transistor 102-MV (as shown in FIG. 41B).

FIGS. 43A and 43B also illustrate dummy strips 87. In accordance with some embodiments, dummy strips 87 are formed by replacing the dummy strips 86' (FIGS. 42A and 42B) when the dummy gate electrode 116-HV is replaced with the replacement gate electrode 116-HV. Accordingly, dummy strips 87 may have the same structure and material as replacement gate electrode 116-HV. The replacement gate electrodes 116-MV and 116-HV, and dummy strips 87 may be formed by the same process, and hence may be formed of the same materials and have same structures. In accordance with alternative embodiments, the dummy strips 86' in FIGS. 42A and 42B are not replaced, and accordingly, the dummy strips 87 in FIGS. 43A and 43B are dummy strips 86', and may include polysilicon. The dummy strips 86A' and 86B', when replaced, become dummy strips 87A and 87B, respectively, in FIG. 43B.

FIGS. 43A and 43B also illustrate the formation of source/drain contact plugs 118. Silicide regions (not shown) may be formed between source/drain contact plugs 118 and source/drain regions 92. As shown in FIG. 43C, gate contact plug 120 is formed over and electrically connecting to replacement gate electrode 116-HV. Vias and metal lines such as the vias in via layer V0 and the metal lines in metal layer M1 are also formed to electrically connect to source/drain regions 118 and gate contact plug 120.

FIGS. 44 and 45 illustrate a layout and a cross-sectional view of a symmetric HV transistor 102-HV in accordance with some embodiments. The illustrated HV transistor 102-HV also corresponds to the HV transistor 102-HV as shown in FIGS. 43A, 43B, and 43C. Some details in FIGS. 43A, 43B, and 43C, however, are not shown in FIGS. 44 and 45. It is assumed that the illustrated transistor 102-HV is of n-type in an example, and hence the source/drain regions are N+ regions. The corresponding n-type HVW region (marked as HVNW) and p-type HVW region (marked as HVPW) are also marked accordingly. It is appreciated that the HV transistor 102-HV may also be of p-type, and the doped regions as shown may be inversed accordingly.

Referring to FIG. 44, HV transistor 102-HV is encircled by isolation ring 130, which may be p+ regions formed by heavily doping substrate 20. Contact plugs 132 are formed over isolation ring 130, and are electrically connected to isolation ring 130 through silicide regions (not shown). An HVNW region is formed on the drain side, and is encircled by an HVPW region and STI regions 40. Isolation ring 130 is also formed in the HVPW region. Source region 92S and drain region 92D are formed on the opposing sides of replacement gate electrode 116-HV, and are formed as N+ regions in accordance with some embodiments. Gate contact plugs 120 and source/drain contact plugs 118 are formed over and electrically connected to gate electrode 116-HV and source/drain regions 92S and 92D, respectively.

FIG. 45 illustrates some features in the cross-section 45-45 as shown in FIG. 44 in accordance with some embodiments. The illustrated HV transistor 102-HV is asymmetric, with the source-side structure being different from the drain-side structure. STI region 40-HV, which extends underlying gate electrode 116-HV, is formed in the HVNW region.

FIG. 46 illustrates the cross-sectional view of a symmetric HV transistor 102-HV in accordance with alternative embodiments. An HVPW region is underlying a portion of the gate electrode 116-HV, and HVNW regions extend underlying gate electrode 116-HV from both the source side and the drain side, and are joined to the HVPW region. There are also two STI regions 40-HV, with one being on the source side, and the other being on the drain side.

Figure 47:
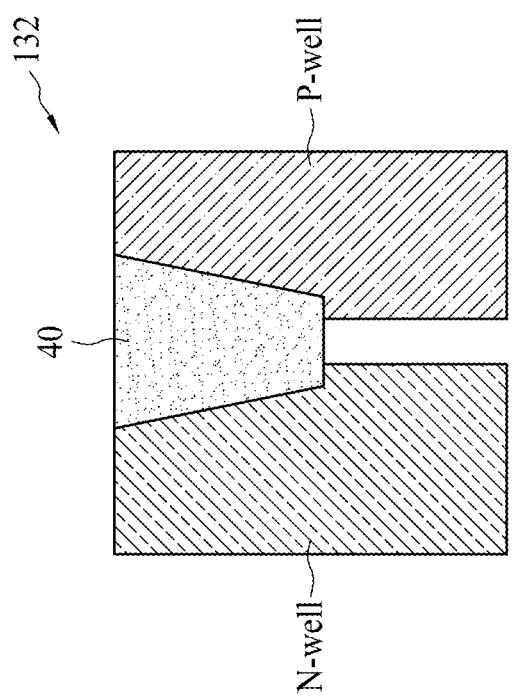
FIG. 47 illustrates an STI region and two neighboring well regions in accordance with some embodiments.

FIG. 47 illustrates two neighboring n-well region and p-well region, which extend underlying STI region 40. The n-well region and p-well region may be in the regions 133 in FIGS. 45 and 46. The n-well region and p-well region may be spaced apart from each other by an un-implanted region of substrate 20, which are not intentionally doped with p-type and n-type dopants. The illustrate n-well region and p-well region may also belong to the transistor 102-core, 102-LV, 102-MV.

Figure 48:
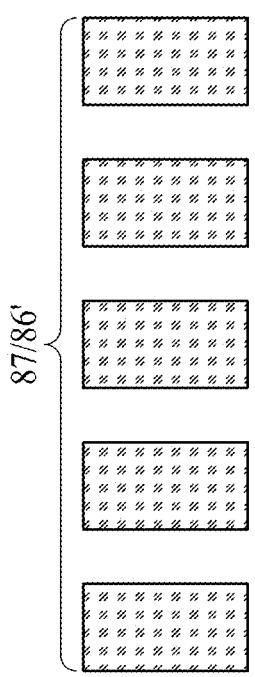
FIG. 48 illustrates top views of dummy strips in accordance with some embodiments.

FIG. 48 illustrates a top view of dummy strips 86' and 87 in the device regions 100-core, 100-LV, 100-MV, and 100-HV as discussed referring to the preceding figures. In accordance with some embodiments, dummy strips 86' and 87 are elongated strips parallel to each other. The lengths and width of dummy strips 86' or 87 may be equal to or different from each other. The pitches of dummy strips 86' or 87 may be equal to or different from each other.

The replacement gate electrode 116-MV (FIG. 41B) of transistor 102-MV and the replacement gate electrode 116-HV of transistor 102-HV (FIG. 43B) may have large areas. Accordingly, in the formation of the replacement gate electrodes of these transistors, gate plugs (including dielectric plugs or polysilicon plugs) may be formed extending into the replacement gate electrodes to reduce the pattern-loading effect. In accordance with some embodiments, the gate plugs are formed of a dielectric material(s), and FIGS. 49-55 illustrate the intermediate stages in the formation of the replacement gate electrodes and the dielectric plugs in accordance with some embodiments. The respective process is illustrated as process 248 in the process flow 200 as shown in FIG. 69.

Referring to FIG. 49, wafer 10 is provided, and a plurality of processes, as discussed referring to preceding figures, have been performed to form intermediate structures of LV transistor 102-LV, MV transistor 102-MV, and HV transistor 102-HV in device regions 100-LV, 100-MV, and 100-HV, respectively. It is appreciated that the teaching regarding the LV transistor 102-LV may also be applied to the core transistor 102-core (FIG. 35). The structure shown in FIG. 49 also corresponds to the structure shown in FIG. 31A, except that the cross-section shown in FIG. 49 is obtained from the channel-length directions of the transistors, while the cross-section shown in FIG. 31A is obtained from the channel-width directions of the transistors. Furthermore, the processes as shown in FIGS. 32 through 34 may have been performed, so that the hard masks over the dummy gate electrodes have been removed, and the dummy gate electrodes have been revealed, as shown in FIG. 49.

LV transistor 102-LV includes protruding semiconductor fin 32-LV', dummy gate dielectric 80B on the sidewalls and the top surface of protruding semiconductor fin 32-LV', and dummy gate electrode 82-LV over dummy gate dielectric 80B. Dummy gate dielectric 80B and dummy gate electrode 82-LV in combination form dummy gate stack 86-LV. Source/drain regions 92 are formed to extend into protruding semiconductor fin 32-LV'. Gate spacers 88 are formed on the sidewalls of dummy gate stack 86-LV. STI regions 40, which are shallow STI regions, are formed to define the regions of the LV transistor. It is appreciated that although the STI regions 40 in FIG. 49 are shown as having the same depths, the STI regions defining MV transistor 102-MV and HV transistor 102-HV actually have greater depths than the depths of the STI regions 40 defining the core transistor 102-core and LV transistor 102-LV, as shown in FIG. 31A.

MV transistor 102-MV includes mesa structure 34-MV, gate dielectric 74 (which is not dummy) over mesa structure 34-MV, and dummy gate electrode 82-MV over gate dielectric 74. Gate dielectric 74 and dummy gate electrode 82-MV in combination form dummy gate stack 86-MV. Source/drain regions 92 are formed to extend into mesa structure 34-MV. Gate spacers 88 are formed on the sidewalls of dummy gate stack 86-MV. STI regions 40, which are deep STI regions, are formed to define the regions of the MV transistor.

HV transistor 102-HV includes mesa structure 34-HV, gate dielectric 54 (which is not dummy) over mesa structure 34-HV, and dummy gate electrode 82-HV over gate dielectric 54. Gate dielectric 54 and dummy gate electrode 82-HV in combination form dummy gate stack 86-HV. Source/drain regions 92 are formed to extend into mesa structure 34-HV. Gate spacers 88 are formed on the sidewalls of dummy gate stack 86-HV. STI regions 40, which are deep STI regions, are formed to define the regions of MV transistor 102-HV. Furthermore, STI region 40-HV extends underlying dummy gate electrode 82-HV, and separates source region 92S from drain region 92D. It is appreciated that the structures of LV transistor 102-LV, MV transistor 102-MV, and HV transistor 102-HV as shown in FIG. 49 are schematic, and more details may be found referring to the discussion referring to FIGS. 36A/36B/36C through FIG. 46.

In accordance with some embodiments, dielectric layers 134 are formed to over source/drain regions 92. In accordance with alternative embodiments, dielectric layers 134 are not formed, and source/drain regions 92 are exposed.

Dummy gate electrodes 82-LV, 82-MV, and 82-HV have gate lengths L-LV, L-MV, and L-HV, respectively. In accordance with some embodiments, gate lengths L-MV and L-HV are greater than length L-LV. Gate length L-HV may also be equal to or greater than gate length L-MV. For example, gate-length-ratio L-MV/L-LV may be greater than about 2, and may be in the range between about 2.5 and about 5. Gate-length ratio L-HV/L-LV may be greater than about 5, and may be in the range between about 8 and about 20. Gate-length ratio L-HV/L-MV may be greater than about 2, and may be in the range between about 2 and about 5. Similarly, the widths of dummy gate electrodes 82-LV, 82-MV, and 82-HV may be increasingly greater, with the gate-width-ratios in similar ranges as the corresponding gate-length-ratios. The HV transistor may also have a channel width smaller than about 20 µm. Due to the large area of dummy gate electrodes 82-MV and 82-HV, gate plugs are formed in the subsequent processes, and are formed in the replacement gates of MV transistor 102-MV and HV transistor 102-HV to reduce the pattern-loading effect.

Referring to FIG. 50, an etching process is performed to pattern dummy gate electrodes 82-MV and 82-HV, and to form openings 138 in dummy gate electrodes 82-MV and 82-HV. The respective process is illustrated as process 250 in the process flow 200 as shown in FIG. 69. In the etching process, dummy gate electrode 82-LV and the dummy gate electrode 82-core (not shown) are protected from the etching process.

Figure 56:
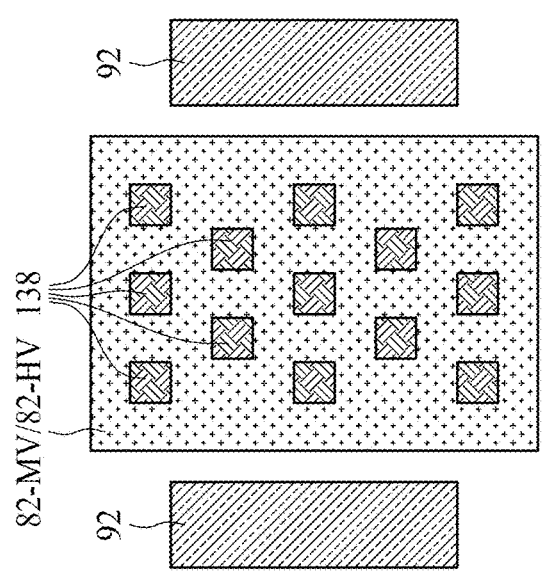
FIG. 56 illustrates the top view of openings in a dummy gate electrode in accordance with some embodiments.

FIG. 56 illustrates a layout (top view) of the openings 138 in dummy gate electrode 82-MV/82-HV, which represents either dummy gate electrode 82-MV and/or dummy gate electrode 82-HV. In accordance with some embodiments, openings 138 are formed substantially uniformly in dummy gate electrode 82-MV/82-HV. For example, the layout of openings 138 include an array, or may include two or more staggered arrays. It is appreciated that although the top-view shape of openings 138 are square shapes, other shapes may also be adopted, which may be selected from circles, ovals, hexagons, octagons, and the like.

Referring back to FIG. 50, In the etching of dummy gate electrodes 82-MV and 82-HV, an etching mask (not shown) such as a photoresist is formed and patterned. The etching may be performed through a dry etching process. The etching is performed using etching gases that attack dummy gate electrodes 82-MV and 82-HV, but does not attack gate dielectrics 54 and 74. For example, the adopted process gases may include fluorine ($F_2$), Chlorine ($Cl_2$), hydrogen chloride (HCl), hydrogen bromide (HBr), Bromine ($Br_2$), $C_2F_6$, $CF_4$, $SO_2$, the mixture of HBr, $Cl_2$, and $O_2$, the mixture of HBr, $Cl_2$, $O_2$, and $CH_2F_2$ etc., or the like. After the etching process, gate dielectrics 54 and 74 are exposed to openings 138. The etching mask is removed after the etching process.

Referring to FIG. 51, CESL 94 and ILD 96 are deposited. The respective process is illustrated as process 252 in the process flow 200 as shown in FIG. 69. CESL 94 is deposited as a conformal dielectric layer. The material and the formation process have been discussed referring to FIG. 35, and hence are not repeated herein. CESL 94 and ILD 96 fill openings 138 and the spaces between the dummy gate stacks. Furthermore, the portions of CESL 94 extending into openings 138 are also conformal. ILD 96 is also filled into openings 138, and is deposited to a level higher than the top surfaces of dummy gate electrodes 82-LV, 82-MV, and 82-HV.

Next, as shown in FIG. 52, a planarization process such as a CMP process or a mechanical grinding process is performed to remove excess portions of CESL 94 and ILD 96, until dummy gate electrodes 82-LV, 82-MV, and 82-HV are exposed. The respective process is illustrated as process 254 in the process flow 200 as shown in FIG. 69. Although not shown, dummy gate electrode 82-core of core transistor 102-core may also be exposed as a result of the same planarization process. It is appreciated that in the formation of the gate dielectrics 54 and 74, mesa structures have been recessed to proper depths, and hence the top surfaces of dummy gate electrodes 82-core, 82-LV, 82-MV, and 82-HV may be adjusted to the same level. This makes it feasible to planarize these dummy gate electrodes in a same planarization process.

Figure 53:
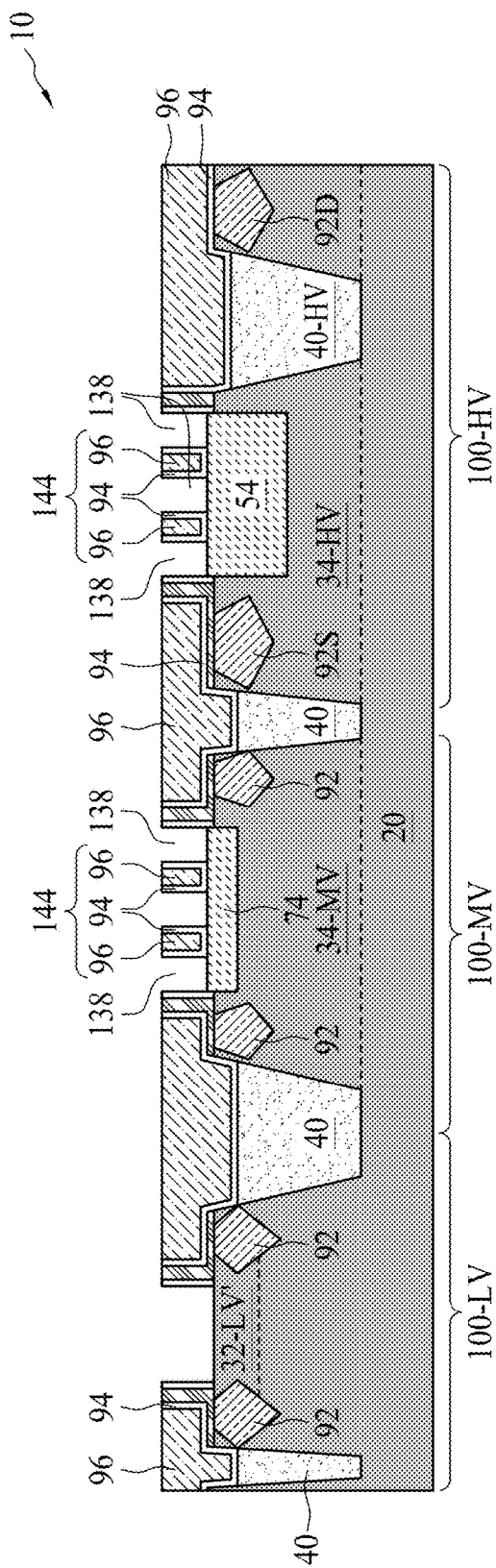

FIG. 53 illustrates the removal of the remaining portions of dummy gate electrodes 82-LV, 82-MV, and 82-HV, which may be performed through an anisotropic etching process and/or an isotropic etching process. The respective process is illustrated as process 256 in the process flow 200 as shown in FIG. 69. Dummy gate dielectric 80B (FIG. 52) and gate dielectrics 54 and 74 are thus exposed. In a subsequent process, dummy gate dielectric 80B is removed to expose protruding semiconductor fins 32-LV'. In accordance with some embodiments, during the removal of dummy gate dielectric 80B, gate dielectrics 54 and 74 are also exposed to the etching chemical, and thus are thinned, but are not removed. In accordance with alternative embodiments, during the removal of dummy gate dielectric 80B, gate dielectrics 54 and 74 are protected by an etching mask, and are not thinned.

Figure 54:
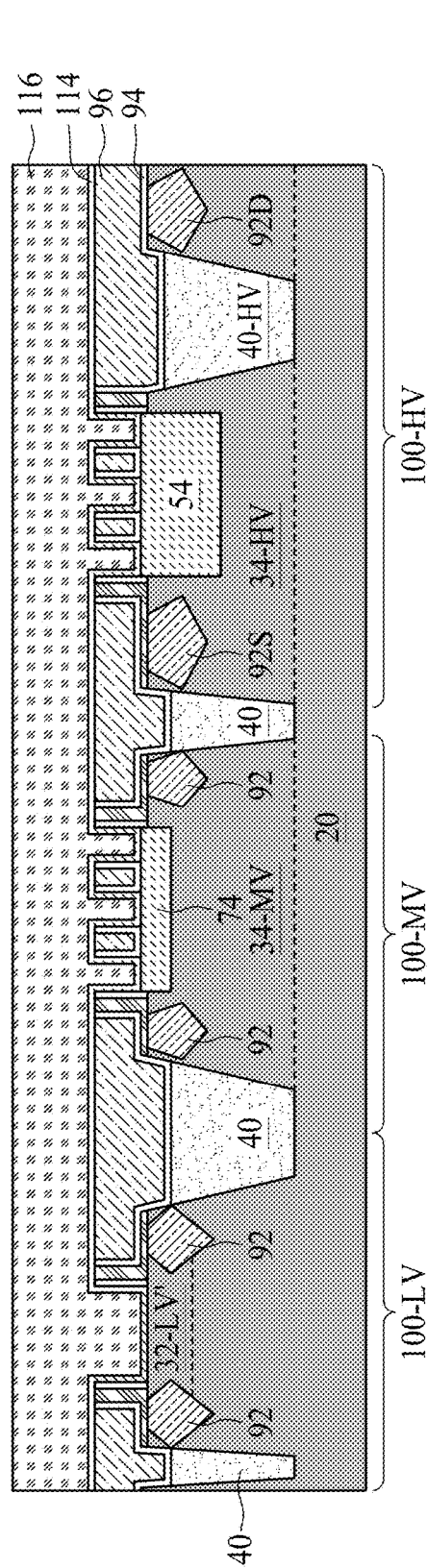

FIG. 54 illustrates the deposition of replacement layers, which include replacement gate dielectric layer 114 and conductive layers (such as metal-containing layers) 116 over the replacement gate dielectric layer. The replacement gate dielectric layer 114 may include an IL layer and a high-k dielectric layer. The conductive layers 116 may include appropriate materials of capping layers, work-function layer(s), and the filling metal, which are not shown separately.

Figure 55:
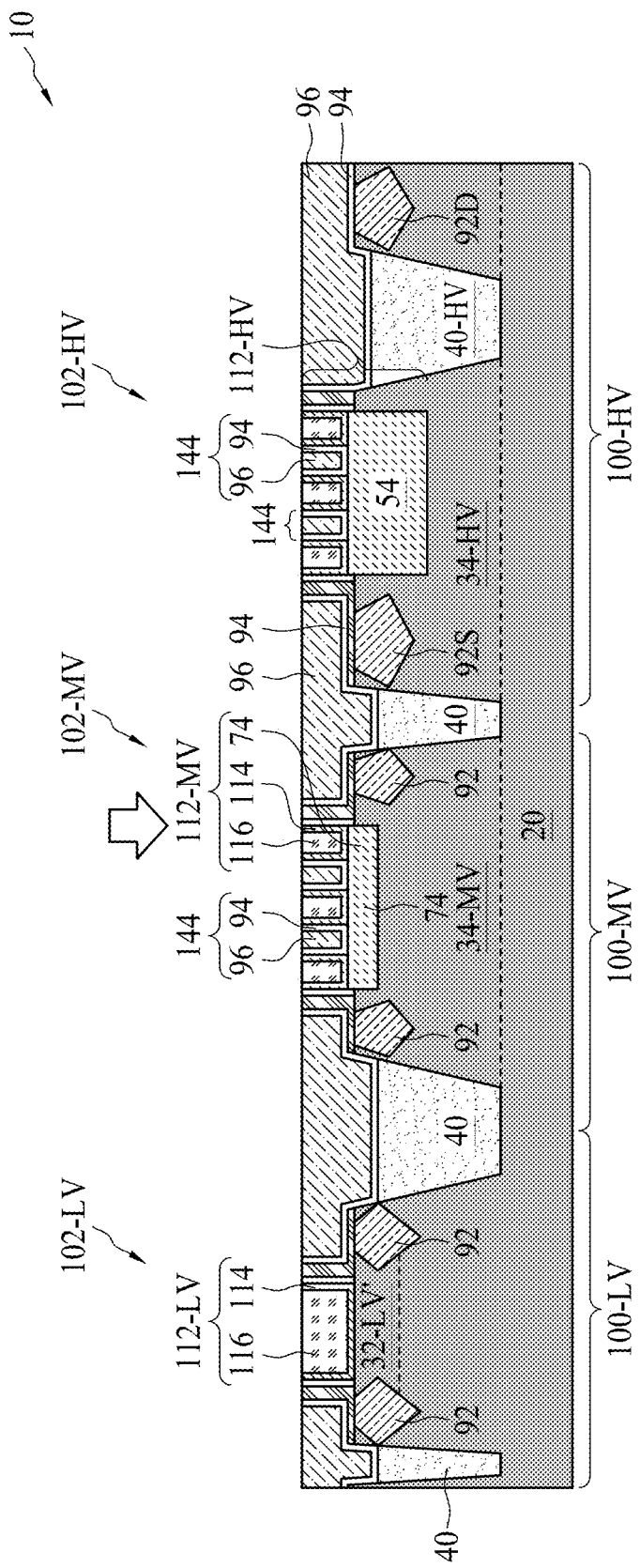

In a subsequent process, as shown in FIG. 55, replacement gate dielectric layer 114 and conductive layers 116 are planarized to remove the portions of these layers over ILD 96, with the remaining portions forming replacement gate stacks 112-LV. The remaining portions also form replacement gate stacks 112-MV and 112-HV along with gate dielectric 74 and 54, respectively. The respective process is illustrated as process 258 in the process flow 200 as shown in FIG. 69.

Figure 57:
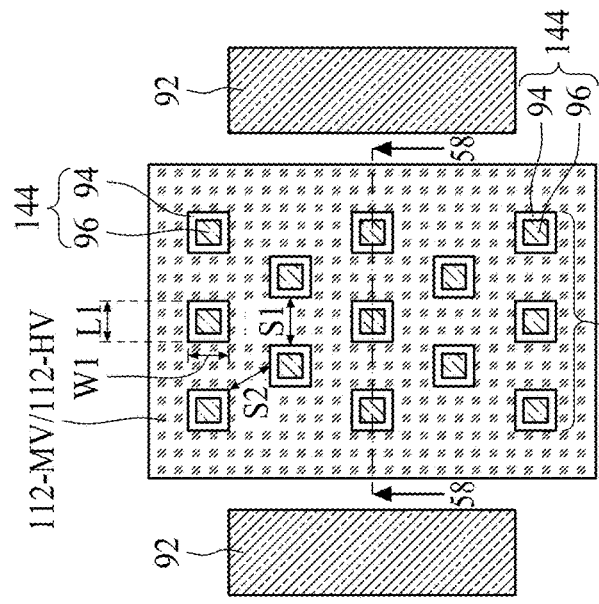
FIGS. 57 and 58 illustrate a top view and a cross-sectional view of a replacement gate electrode and dielectric plugs therein in accordance with some embodiments.

In each of replacement gate stacks 112-MV and 112-HV, the portions of the CESL 94 and ILD 96 filling openings 138 form dielectric plugs 144. FIG. 57 illustrates a top view of the replacement gate stack 112-MV/112-HV and the corresponding dielectric plugs 144. In the top view, dielectric plugs 144 are distributed in replacement gate stack 112-MV/112-HV. Each of the dielectric plugs 144 may include a portion of ILD portion and a portion of CESL 94 encircling the ILD portion 96. Replacement gate stacks 112-MV and 112-HV encircle the corresponding dielectric plugs 144.

In accordance with some embodiments, dielectric plugs 144 have length L1 and width W1. In accordance with some embodiments, length L1 and width W1 may be equal to or close to each other, for example, with ratio L1/W1 being in the range between 1.0 and about 3.0. The Spacings S1 and S2 between neighboring dielectric plugs 144 may be equal to, smaller than, or greater than length L1 and width W1, for example, with ratios S1/L1 and S2/L1 being in the range between about 1.0 and about 5.0.

Figure 58:
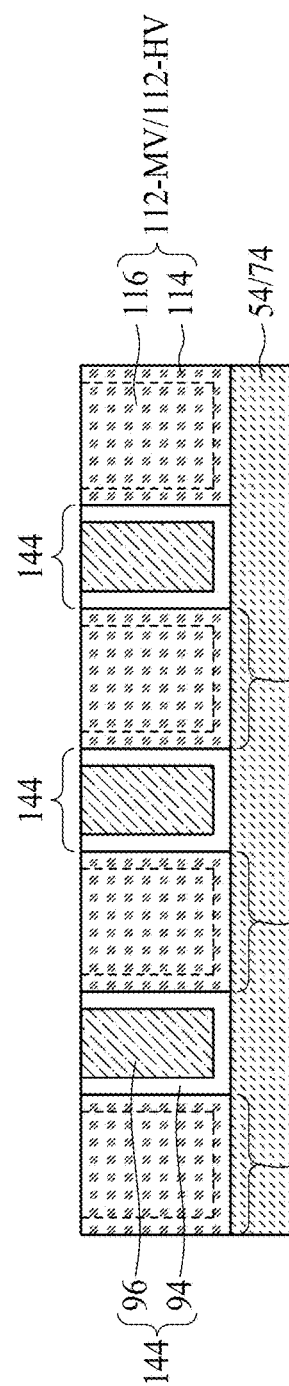

FIG. 58 illustrates a cross-section 58-58 in FIG. 57. The ILD portions 96 and CESL portions 94 in dielectric plugs 144 are illustrated. The CESL portions 94 may be in physical contact with the underlying gate dielectric 54 or 74. In accordance with some embodiments, the dielectric layer 114 (which comprises a high-k dielectric layer, and may include an IL layer) in LV transistor 102-LV is formed, the same high-k dielectric layer 114 is formed in replacement gate stacks 112-MV and 112-HV also. In accordance with alternative embodiments, the dielectric layer 114 is not formed in replacement gate stacks 112-MV and 112-HV. Accordingly, the dielectric layer 114 in replacement gate stack 112-MV/112-HV is shown as being dashed to indicate it may or may not exist. The dielectric layer 114 in replacement gate stacks 112-MV/112-HV may have a U-shape in the cross-sectional view.

Figure 59:
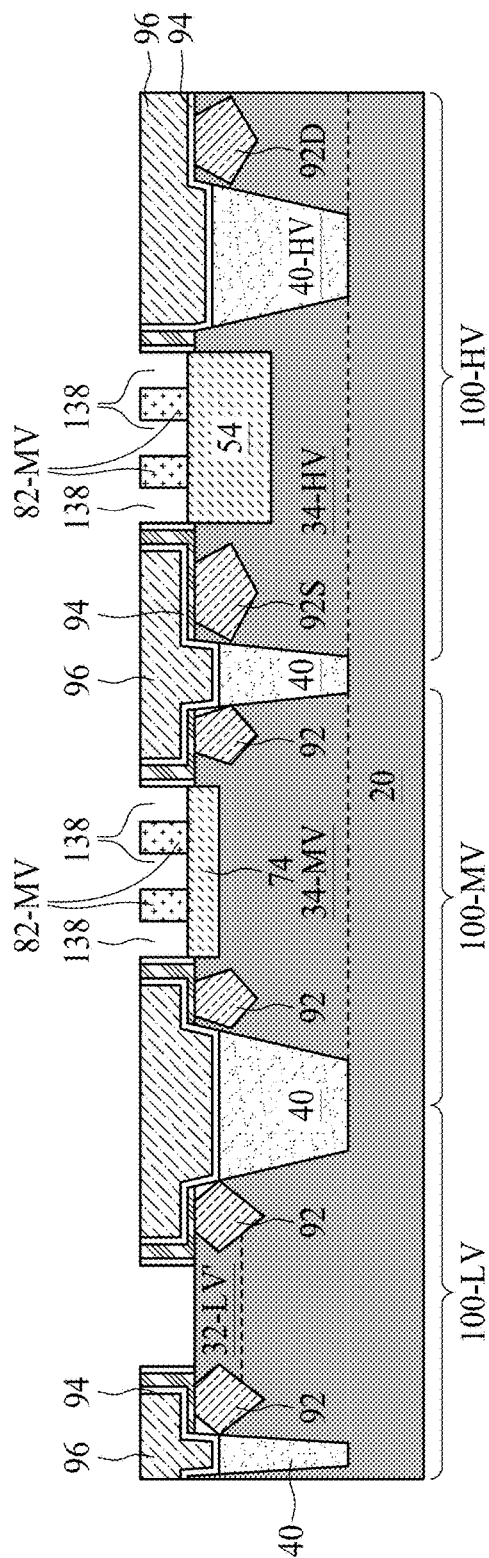
FIGS. 59 and 60 illustrate the cross-sectional views of intermediate stages in the formation of replacement gate stacks having polysilicon plugs therein in accordance with some embodiments.
Figure 60:
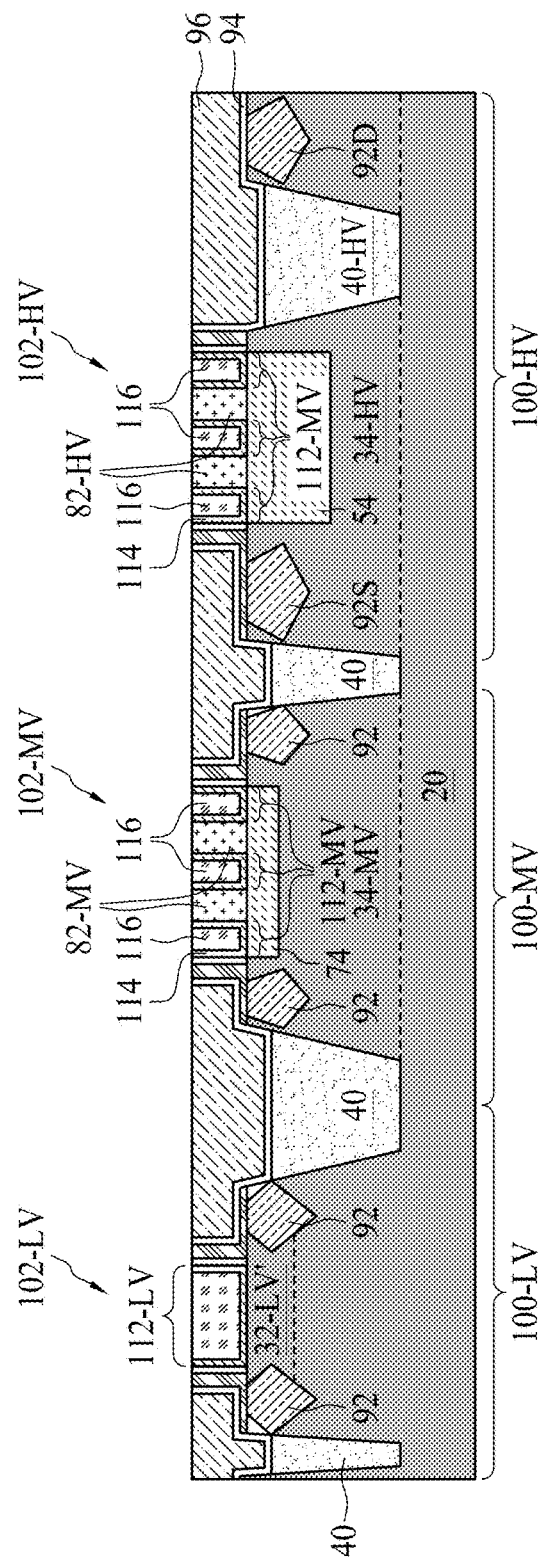

FIGS. 59 and 60 illustrate the formation of replacement gate stacks in accordance with alternative embodiments. These embodiments are similar to the embodiments shown in FIG. 55, except that the gate plugs include the materials of dummy gate electrodes (such as polysilicon), rather than the materials of dielectric plugs 144. In accordance with these embodiments, dummy gate electrodes 82-MV and 82-HV as shown in FIG. 49 are patterned, and the resulting structure is shown in FIG. 59. The unremoved portions of dummy gate electrodes 82-MV and 82-HV may have the shapes, the sizes, and the positions of openings 138 as shown in FIG. 56. The remaining portions of dummy gate electrodes 82-MV and 82-HV thus may form discrete islands, which are separated from each other.

In subsequent processes, replacement gate stacks 112-MV and 112-HV are formed by forming a gate dielectric layer 114 and conductive layers 116, and preforming a planarization process. The resulting replacement gate stacks 112-MV and 112-HV are essentially the same as shown in FIGS. 57 and 58, except gate plugs formed of remaining dummy gate electrodes 82-MV and 82-HV are inside replacement gate stacks 112-MV and 112-HV.

Figure 63:
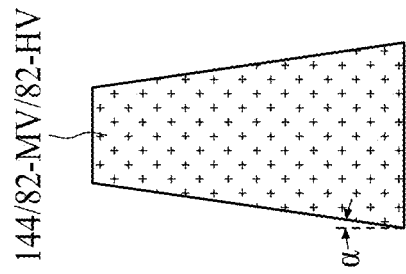
FIGS. 61-63 illustrate the cross-sectional views of dielectric plugs or polysilicon plugs in accordance with some embodiments.
Figure 62:
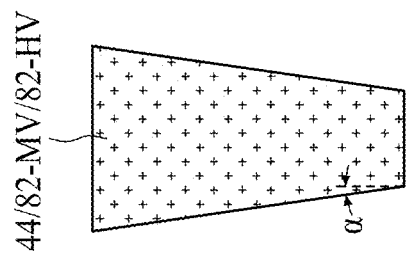
Figure 61:
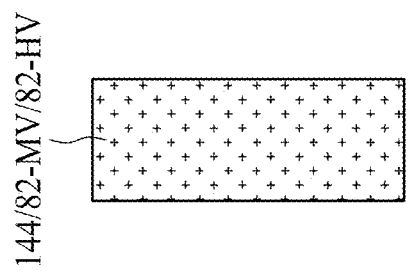

FIGS. 61-63 illustrate several possible profiles of dielectric plugs 144 or gate plugs 82-MV/82-HV (referred to as gate plugs 144/82-MV/82-HV hereinafter) in accordance with some embodiments. In FIG. 61, gate plug 144/82-MV/82-HV has vertical and straight sidewalls. In FIG. 62, gate plug 144/82-MV/82-HV has straight sidewalls, with the upper portions of gate plug 144/82-MV/82-HV being increasingly wider than the respective lower portions. In FIG. 63, gate plug 144/82-MV/82-HV has straight sidewalls, with the upper portions of gate plug 144/82-MV/82-HV being increasingly narrower than the respective lower portions. The slant angle α of the sidewalls may be smaller than about 30 degrees.

Figure 64:
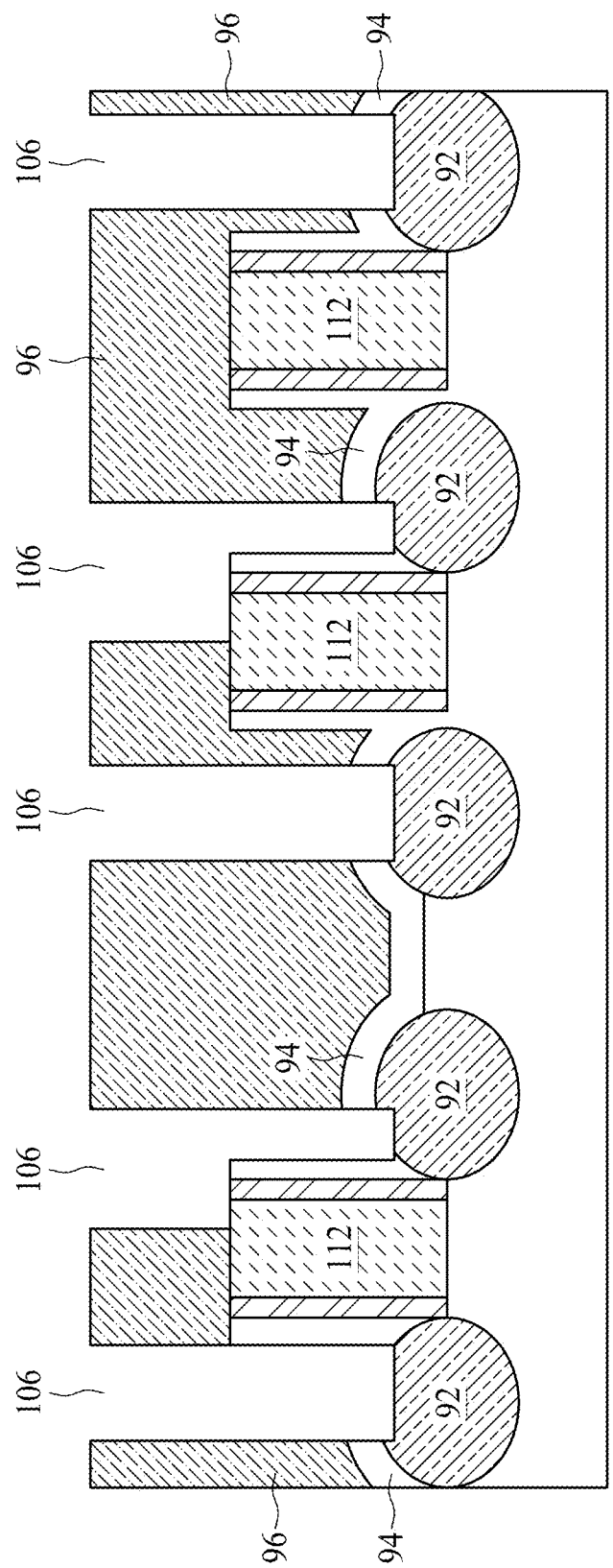
FIGS. 64 and 65 illustrate the formation of contact plugs and overlying structures in accordance with some embodiments.
Figure 65:
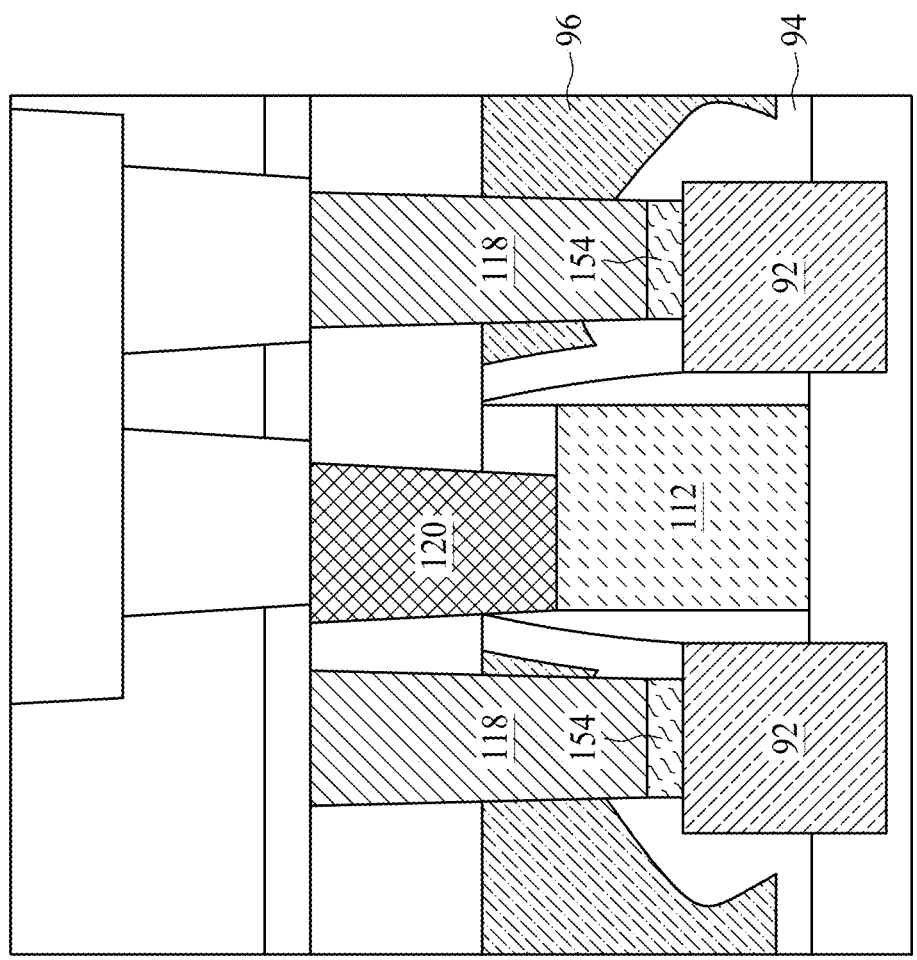

FIGS. 64 and 65 illustrate some intermediate stages in the formation of contact plugs in accordance with some embodiments. The transistors illustrated in these Figures may represent transistor 102-MV or transistor 102-HV. Referring to FIG. 64, source/drain contact openings 106 are formed by etching CESL 94 and ILD 96, exposing source/drain regions 92. Next, as shown in FIG. 65, silicide regions 154 and source/drain contact plugs 118 are formed in source/drain contact openings 106. Gate contact plug 120 is also formed. More ILDs, vias, and metal lines are then formed, and the details are not discussed herein.

Figure 66:
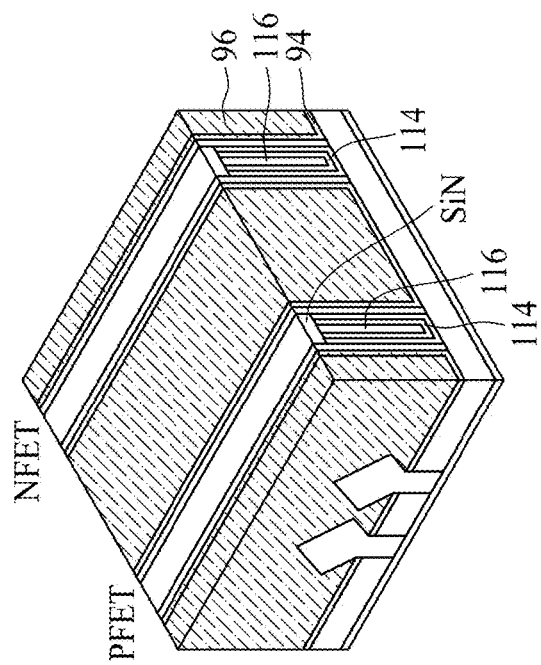
FIGS. 66 and 67 illustrate the perspective views of transistors including a polysilicon gate and a metal gate, respectively, in accordance with some embodiments.
Figure 67:
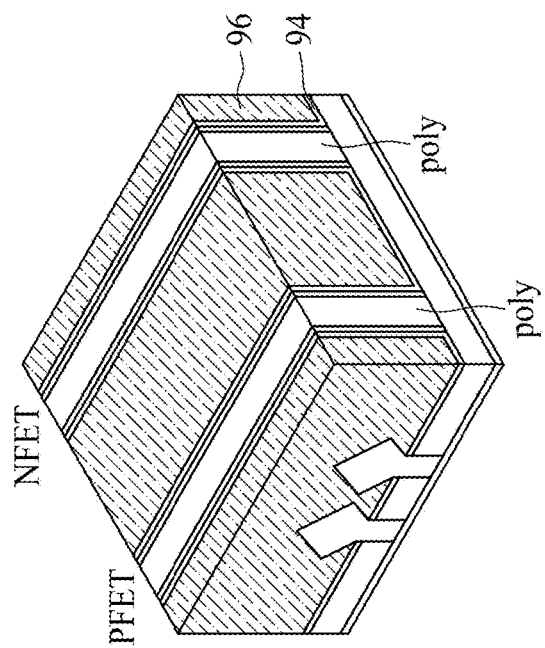

It is appreciated that the transistors 102-*core*, 102-LV, 102-MV, and 102-HV may have replacement gate electrodes as discussed above, which may comprise metal, or may have polysilicon gates. For example, FIG. 66 illustrates a p-type transistor PFET and an n-type transistor NFET having polysilicon gate electrodes, while FIG. 67 illustrates a p-type transistor PFET and an n-type transistor NFET having metal replacement gates.

Figure 68:
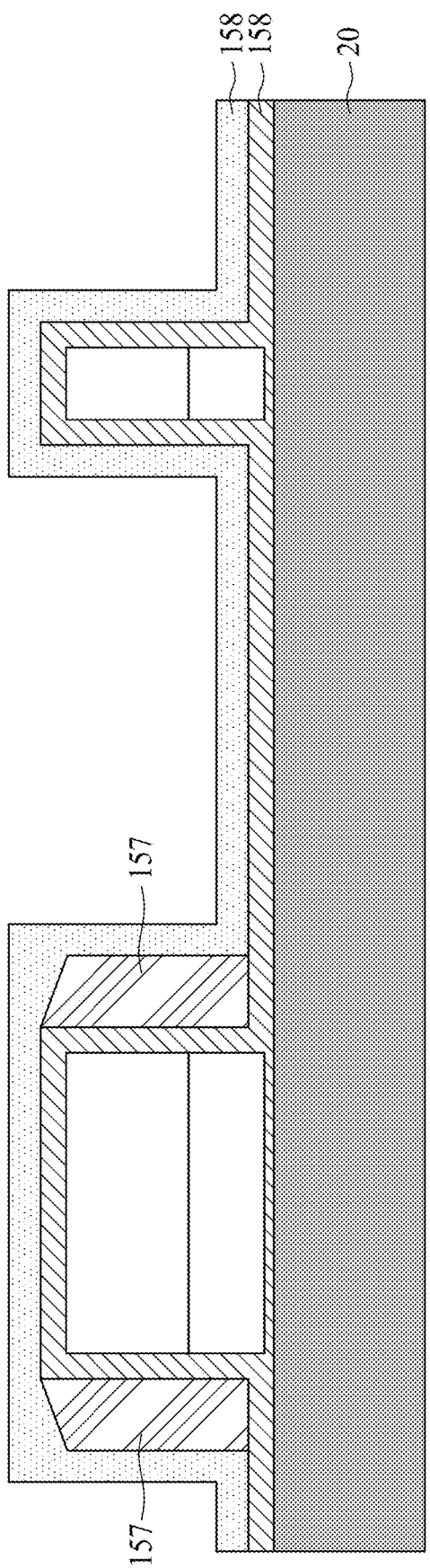
FIG. 68 illustrates two transistors with gate spacers having different thicknesses in accordance with some embodiments.

Also, the gate spacers may have different widths, depending on the voltage requirements of the transistor. For example, FIG. 68 illustrates an intermediate stage in the formation of the gate spacers of two transistors, with the transistor on the left side of the figure having additional gate spacers 157 that have already been formed. The illustrated dielectric layers 158 are etched in an anisotropic etching process(es) to form gate spacers. As a result, the gate spacers of the transistor on the left side are thicker than the gate spacers of the transistor on the right side. The transistor on the left side may thus be applied with higher voltages than the transistor on the right side. For example, the transistor on the left side may be HV transistor 102-HV or MV transistor 102-MV, while the transistor in the right side may be core transistor 102-*core* or LV transistor 102-LV.

The embodiments of the present disclosure have some advantageous features. By integrating the core transistor, the LV transistor, the MV transistor, and the HV transistor on the same substrate, the resulting circuits may include both fast FinFETs and the high-voltage transistors. The embodiments of the present disclosure also share common formation processes in the formation of these transistors, so that the manufacturing cost is reduced.

In accordance with some embodiments of the present disclosure, a method includes forming a first plurality of etching masks over a semiconductor substrate; forming a second plurality of etching masks over the semiconductor substrate; etching the semiconductor substrate using the first plurality of etching masks and the second plurality of etching masks to form a plurality of semiconductor strips and a plurality of mesa structures, respectively; forming a first plurality of dielectric isolation regions between the plurality of semiconductor strips; forming a second plurality of dielectric isolation regions encircling the plurality of mesa structures; recessing the first plurality of dielectric isolation regions, wherein top portions of a first group of semiconductor strips in the plurality of semiconductor strips protrude higher than the first plurality of dielectric isolation regions to form a first plurality of protruding semiconductor fins; forming a first gate dielectric on top surfaces and sidewalls of the first plurality of protruding semiconductor fins; forming a first gate electrode over the first gate dielectric, wherein the first gate dielectric and the first gate electrode form parts of a first transistor; forming a second gate dielectric over a first mesa structure in the plurality mesa structures; and forming a second gate electrode over the second gate dielectric, wherein the second gate dielectric and the second gate electrode form parts of a second transistor.

In an embodiment, the method further comprises forming a third gate dielectric over a second mesa structure in the plurality mesa structures; and forming a third gate electrode over the third gate dielectric, wherein the third gate dielectric and the third gate electrode form parts of a third transistor, and wherein the second transistor is configured to endure a higher operation voltage than the third transistor. In an embodiment, the method further comprises, before the second gate dielectric is formed, recessing the first mesa structure, wherein a top surface of the first mesa structure is lower than top surfaces of the second plurality of dielectric isolation regions; and before the third gate dielectric is formed, recessing the second mesa structure, wherein a top surface of the second mesa structure is lower than the top surfaces of the second plurality of dielectric isolation regions, and wherein the first mesa structure is recessed more than the second mesa structure.

In an embodiment, the second transistor is a high-voltage transistor, and the third transistor is a medium-voltage transistor. In an embodiment, the method further comprises forming dielectric plugs in the second gate electrode. In an embodiment, the forming the second plurality of dielectric isolation regions comprises performing a first etching process to etch the semiconductor substrate, wherein first recesses and upper portions of second recesses are formed, and wherein the first plurality of dielectric isolation regions and upper portions of the second plurality of dielectric isolation regions are in the first recesses and the upper portions of the second recesses, respectively; and performing a second etching process to etch the semiconductor substrate, wherein the second recesses are extended down, and wherein lower portions of the second plurality of dielectric isolation regions are formed in extended portions of the second recesses.

In an embodiment, in the recessing the first plurality of dielectric isolation regions, top portions of a second group of semiconductor strips in the plurality of semiconductor strips protrude higher than the first plurality of dielectric isolation regions to form a second plurality of protruding semiconductor fins; forming a third gate dielectric on top surfaces and sidewalls of the second plurality of protruding semiconductor fins; and forming a third gate electrode over the third gate dielectric, wherein the third gate dielectric and the third gate electrode form parts of a third transistor, and wherein the third transistor is configured to endure a higher operation voltage than the first transistor.

In an embodiment, the first transistor is a core transistor, and the third transistor is a low-voltage transistor. In an embodiment, the method further comprises forming a high-voltage isolation region in the semiconductor substrate, wherein the second gate electrode overlaps the high-voltage isolation region. In an embodiment, the method further comprises forming a first dummy strip partially overlapping the high-voltage isolation region, wherein the first dummy strip is between a source region and a drain region of the second transistor. In an embodiment, the first dummy strip is electrically floating. In an embodiment, the method further comprises forming a second dummy strip fully overlapping the high-voltage isolation region in a cross-sectional view of the high-voltage isolation region.

In accordance with some embodiments of the present disclosure, a structure includes a bulk semiconductor substrate; a first plurality of dielectric isolation regions over the bulk semiconductor substrate; a plurality of semiconductor fins protruding higher than the first plurality of dielectric isolation regions; a first gate stack on top surfaces and sidewalls of the plurality of semiconductor fins; a second plurality of dielectric isolation regions over the bulk semiconductor substrate; a first mesa structure in the second plurality of dielectric isolation regions; and a second gate stack over the first mesa structure, wherein top surfaces of the first gate stack and the second gate stack are coplanar with each other. In an embodiment, the second gate stack comprises a planar gate dielectric.

In an embodiment, a top surface of the first mesa structure is lower than top surfaces of the second plurality of dielectric isolation regions. In an embodiment, the structure further comprises a second mesa structure in the second plurality of dielectric isolation regions; and a third gate stack over the second mesa structure, wherein top surfaces of the second gate stack and the third gate stack are coplanar with each other, and wherein a first gate dielectric in the second gate stack is thicker than a second gate dielectric in the third gate stack. In an embodiment, the structure further comprises a plurality of dielectric plugs in the second gate stack.

In accordance with some embodiments of the present disclosure, a structure includes a bulk semiconductor substrate; a FinFET comprising a plurality of semiconductor fins over the bulk semiconductor substrate; and a first gate dielectric on top surfaces and sidewalls of the plurality of semiconductor fins, wherein the first gate dielectric has a first thickness; a medium-voltage transistor comprising a first mesa structure over the bulk semiconductor substrate; and a second gate dielectric on a first top surface of the first mesa structure, wherein the second gate dielectric has a second thickness greater than the first thickness; and a high-voltage transistor comprising a second mesa structure over the bulk semiconductor substrate; and a third gate dielectric on a second top surface of the second mesa structure, wherein the third gate dielectric has a third thickness greater than the second thickness.

In an embodiment, the FinFET, the medium-voltage transistor, and the high-voltage transistor comprise a first gate electrode, a second gate electrode, and a third gate electrode, respectively, wherein top surfaces of the first gate electrode, the second gate electrode, and the third gate electrode are coplanar with each other. In an embodiment, the structure further comprises a plurality of dummy strips parallel to each other, wherein the plurality of dummy strips are distributed on opposing sides of each of the FinFET, the medium-voltage transistor, and the high-voltage transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a first plurality of etching masks over a semiconductor substrate;
   forming a second plurality of etching masks over the semiconductor substrate;

etching the semiconductor substrate using the first plurality of etching masks and the second plurality of etching masks to form a plurality of semiconductor strips and a plurality of mesa structures, respectively;

forming a first plurality of dielectric isolation regions between the plurality of semiconductor strips;

forming a second plurality of dielectric isolation regions encircling the plurality of mesa structures, wherein the forming the second plurality of dielectric isolation regions comprises:

performing a first etching process to etch the semiconductor substrate, wherein first recesses and upper portions of second recesses are formed, and wherein the first plurality of dielectric isolation regions and upper portions of the second plurality of dielectric isolation regions are in the first recesses and the upper portions of the second recesses, respectively; and performing a second etching process to etch the semiconductor substrate, wherein the second recesses are extended down, and wherein lower portions of the second plurality of dielectric isolation regions are formed in extended portions of the second recesses;

recessing the first plurality of dielectric isolation regions, wherein top portions of a first group of semiconductor strips in the plurality of semiconductor strips protrude higher than the first plurality of dielectric isolation regions to form a first plurality of protruding semiconductor fins;

forming a first gate dielectric on top surfaces and sidewalls of the first plurality of protruding semiconductor fins;

forming a first gate electrode over the first gate dielectric, wherein the first gate dielectric and the first gate electrode form parts of a first transistor;

forming a second gate dielectric over a first mesa structure in the plurality of mesa structures; and forming a second gate electrode over the second gate dielectric, wherein the second gate dielectric and the second gate electrode form parts of a second transistor.

2. The method of claim 1 further comprising:
forming a third gate dielectric over a second mesa structure in the plurality of mesa structures; and
forming a third gate electrode over the third gate dielectric, wherein the third gate dielectric and the third gate electrode form parts of a third transistor, and wherein the second transistor is configured to endure a higher operation voltage than the third transistor.

3. The method of claim 2 further comprising:
before the second gate dielectric is formed, recessing the first mesa structure, wherein a top surface of the first mesa structure is lower than top surfaces of the second plurality of dielectric isolation regions; and
before the third gate dielectric is formed, recessing the second mesa structure, wherein a top surface of the second mesa structure is lower than the top surfaces of the second plurality of dielectric isolation regions, and wherein the first mesa structure is recessed more than the second mesa structure.

4. The method of claim 2, wherein the second transistor is a high-voltage transistor, and the third transistor is a medium-voltage transistor.

5. The method of claim 1 further comprising forming dielectric plugs in the second gate electrode, wherein the second gate electrode encircles the dielectric plugs in a top view of the second gate electrode.

6. The method of claim 1, wherein in the recessing the first plurality of dielectric isolation regions, top portions of a second group of semiconductor strips in the plurality of semiconductor strips protrude higher than the first plurality of dielectric isolation regions to form a second plurality of protruding semiconductor fins;

forming a third gate dielectric on top surfaces and sidewalls of the second plurality of protruding semiconductor fins; and forming a third gate electrode over the third gate dielectric, wherein the third gate dielectric and the third gate electrode form parts of a third transistor, and wherein the third transistor is configured to endure a higher operation voltage than the first transistor.

7. The method of claim 6, wherein the first transistor is a core transistor, and the third transistor is a low-voltage transistor.

8. The method of claim 1 further comprising:
forming a high-voltage isolation region in the semiconductor substrate, wherein the second gate electrode overlaps the high-voltage isolation region.

9. The method of claim 8 further comprising forming a first dummy strip partially overlapping the high-voltage isolation region, wherein the first dummy strip is between a source region and a drain region of the second transistor.

10. The method of claim 9, wherein the first dummy strip is electrically floating.

11. The method of claim 9 further comprising forming a second dummy strip fully overlapping the high-voltage isolation region in a cross-sectional view of the high-voltage isolation region.

12. A structure comprising:
a bulk semiconductor substrate;
a first plurality of dielectric isolation regions over the bulk semiconductor substrate, wherein the first plurality of dielectric isolation regions comprise first bottom surfaces;
a plurality of semiconductor fins protruding higher than the first plurality of dielectric isolation regions and between neighboring portions of the first plurality of dielectric isolation regions;
a first gate stack on top surfaces and sidewalls of the plurality of semiconductor fins;
a second plurality of dielectric isolation regions over the bulk semiconductor substrate, wherein the second plurality of dielectric isolation regions comprise second bottom surfaces lower than the first bottom surfaces;
a first mesa structure in the second plurality of dielectric isolation regions; and
a second gate stack over the first mesa structure, wherein top surfaces of the first gate stack and the second gate stack are coplanar with each other.

13. The structure of claim 12, wherein the second gate stack comprises a planar gate dielectric.

14. The structure of claim 12, wherein a top surface of the first mesa structure is lower than top surfaces of the second plurality of dielectric isolation regions.

15. The structure of claim 12 further comprising:
a second mesa structure in the second plurality of dielectric isolation regions; and
a third gate stack over the second mesa structure, wherein top surfaces of the second gate stack and the third gate stack are coplanar with each other, and wherein a first gate dielectric in the second gate stack is thicker than a second gate dielectric in the third gate stack.

16. The structure of claim 12 further comprising a plurality of dielectric plugs in the second gate stack, wherein portions of second gate stack on opposing sides of each of the plurality of dielectric plugs are electrically interconnected.

17. A structure comprising:
a bulk semiconductor substrate;
a Fin Field Effect Transistor (FinFET) comprising:
   a plurality of semiconductor fins over the bulk semiconductor substrate;
   a first gate dielectric on top surfaces and sidewalls of the plurality of semiconductor fins, wherein the first gate dielectric has a first thickness; and
   a first gate electrode over the first gate dielectric;
a medium-voltage transistor comprising:
   a first mesa structure over the bulk semiconductor substrate;
   a second gate dielectric on a first top surface of the first mesa structure, wherein the second gate dielectric has a second thickness greater than the first thickness; and
   a second gate electrode over the second gate dielectric;
a high-voltage transistor comprising:
   a second mesa structure over the bulk semiconductor substrate;
   a third gate dielectric on a second top surface of the second mesa structure, wherein the third gate dielectric has a third thickness greater than the second thickness; and
   a third gate electrode over the third gate dielectric, wherein a first bottommost end of the third gate electrode is higher than a first topmost surface of the second mesa structure.

18. The structure of claim 17, wherein top surfaces of the first gate electrode, the second gate electrode, and the third gate electrode are coplanar with each other.

19. The structure of claim 17 further comprising a plurality of dummy strips parallel to each other, wherein the plurality of dummy strips are distributed on opposing sides of each of the FinFET, the medium-voltage transistor, and the high-voltage transistor.

20. The structure of claim 17, wherein the first bottommost end of the third gate electrode is higher than the first topmost surface of the second mesa structure by a first height difference, and wherein a second height difference between a second bottommost end of the second gate electrode and a second topmost surface of the first mesa structure is smaller than the first height difference.

* * * * *